US008495450B2

(12) United States Patent
Abu-Surra et al.

(10) Patent No.: US 8,495,450 B2
(45) Date of Patent: Jul. 23, 2013

(54) SYSTEM AND METHOD FOR STRUCTURED LDPC CODE FAMILY WITH FIXED CODE LENGTH AND NO PUNCTURING

(75) Inventors: Shadi Abu-Surra, Richardson, TX (US); Eran Pisek, Plano, TX (US); Zhouyue Pi, Allen, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 353 days.

(21) Appl. No.: 12/855,442

(22) Filed: Aug. 12, 2010

(65) Prior Publication Data

US 2011/0047433 A1 Feb. 24, 2011

Related U.S. Application Data

(60) Provisional application No. 61/274,970, filed on Aug. 24, 2009, provisional application No. 61/276,595, filed on Sep. 14, 2009.

(51) Int. Cl.
*H03M 13/00* (2006.01)

(52) U.S. Cl.
USPC .......................................................... 714/752

(58) Field of Classification Search
USPC .......................................................... 714/752
See application file for complete search history.

(56) References Cited

U.S. PATENT DOCUMENTS 7,334,181 B2 * 2/2008 Eroz et al. ..................... 714/801
7,343,539 B2 3/2008 Divsalar et al.
7,480,845 B2 1/2009 Kim et al.
7,499,490 B2 3/2009 Divsalar et al.
7,734,988 B2 6/2010 Kim et al.
7,890,844 B2 2/2011 Jeong et al.
7,966,548 B2 * 6/2011 Jacobsen et al. .............. 714/774
7,984,368 B2 7/2011 Pisek et al.
8,006,162 B2 8/2011 Choi et al.
8,117,523 B2 2/2012 Divsalar et al.
8,132,072 B2 3/2012 El-Khamy et al.
8,161,363 B2 4/2012 Jeong et al.

(Continued)

FOREIGN PATENT DOCUMENTS

KR 1020070035283 A 3/2007
KR 1020090093763 A 9/2009
KR 1020100032346 A 3/2010
KR 1020100047155 A 5/2010

OTHER PUBLICATIONS

N. Jacobsen and R. Soni; "Design of rate-compatible irregular LDPC codes based on edge growth and parity splitting;" in Proc. IEEE Vehicular Technology Conference (VTC); 30 2007; Oct. 3, 2007; pp. 1052-1056.*

(Continued)

*Primary Examiner* — Scott Baderman
*Assistant Examiner* — Joseph Kudirka

(57) ABSTRACT

A family of low density parity check (LDPC) codes is generated based on a mother code having a highest code rate. The low density parity check (LDPC) codes include a codeword size of at least 1344. The LDPC codes also include a plurality of parity bits in a lower triangular form. The mother code is constructed by: selecting m number of rows and n number of columns; setting maximum column weights and row weights; designing a protograph matrix based on the set column weights and row weights and selected m and n; and selecting circulant blocks based on the protograph matrix.

21 Claims, 57 Drawing Sheets

U.S. PATENT DOCUMENTS

| | | | | |
|---|---|---|---|---|
| 8,209,592 | B2 | 6/2012 | Pisek et al. | |
| 8,239,746 | B2 | 8/2012 | Divsalar et al. | |
| 2006/0203765 | A1 * | 9/2006 | Laroia et al. | 370/328 |
| 2006/0294445 | A1 | 12/2006 | Divsalar et al. | |
| 2007/0043998 | A1 | 2/2007 | Lakkis | |
| 2007/0094568 | A1 | 4/2007 | Choi et al. | |
| 2007/0162815 | A1 * | 7/2007 | El-Khamy et al. | 714/752 |
| 2008/0126916 | A1 * | 5/2008 | Chung et al. | 714/801 |
| 2008/0178065 | A1 * | 7/2008 | Khandekar et al. | 714/801 |
| 2009/0013239 | A1 | 1/2009 | Blanksby | |
| 2009/0070659 | A1 | 3/2009 | Zhong et al. | |
| 2011/0066916 | A1 | 3/2011 | Abu-Surra et al. | |
| 2011/0299484 | A1 | 12/2011 | Nam et al. | |
| 2011/0307760 | A1 | 12/2011 | Pisek et al. | |

OTHER PUBLICATIONS

H-G Joo, D-J Shin, and S-N Hong; "New Construction of Rate-Compatible Block-Type Low-Density Parity-Check Codes Using Splitting;" Proc. IEEE (PIMRC 2006); Sep. 2006.*

International Search Report dated May 31, 2011 in connection with International Patent Application No. PCT/KR2010/006362.

Written Opinion of the International Searching Authority dated May 31, 2011 in connection with International Patent Application No. PCT/KR2010/006362.

Sunghwan Kim, et al., "Quasi-Cyclic Low-Density Parity-Check Codes With Girth Larger Than 12", IEEE Transactions on Information Theory, vol. 53, No. 8, Aug. 2007, p. 2885-2891.

Eran Sharon, et al., "Generating Good Finite Length LDPC Codes Based on Lifted Graphs", Forty-Fourth Annual Allerton Conference, Sep. 27-29, 2006, p. 41-50.

Gianluigi Liva, et al., "Design of LDPC Codes: A Survey and New Results", J. Comm. Software and Systems, Sep. 2006, 22 pages.

Andrew Blanksby, et al., "LDPC Code Set for mmWave Communication", mmCom '10, Sep. 24, 2010, p. 39-43.

Shadi Abu-Surra, et al., "Gigabit Rate Achieving Low-Power LDPC Codes: Design and Architecture", 6 pages.

Notification of Transmittal of the International Search Report and the Written Opinion of the International Searching Authority dated Feb. 10, 2012 in connection with International Patent Application No. PCT/KR2011/004351.

Written Opinion of the International Searching Authority dated Feb. 23, 2012 in connection with International Patent Application No. PCT/KR2011/004051.

International Search Report dated Feb. 23, 2012 in connection with International Patent Application No. PCT/KR2011/004051.

"3rd Generation Partnership Project; Technical Specification Group Radio Access Network; Evolved Universal Terrestrial Radio Access (E-UTRA); Ohysical Channels and Modulation (Release 9)", 3GPP TS 36.211 v9.1.0, Mar. 2010, 85 pages.

Thomas Henige, et al., "High-Throughput Low-Power LDPC Decoder and Code Design", 2011, 6 pages.

* cited by examiner

FIG. 5B

| | | | | | | | | | | | | | | | | | | | | | | | | | |
|---|---|---|---|---|---|---|---|---|---|---|---|---|---|---|---|---|---|---|---|---|---|---|---|---|---|
| -1 | -1 | -1 | -1 | -1 | -1 | -1 | -1 | -1 | 8 | -1 | 23 | -1 | 21 | 14 | 6 | 0 | -1 | -1 | -1 | -1 | -1 | -1 | -1 | 1 | 20 |
| -1 | -1 | 18 | 0 | -1 | -1 | -1 | -1 | 26 | -1 | 14 | 3 | -1 | -1 | -1 | -1 | 1 | 24 | -1 | -1 | -1 | -1 | -1 | -1 | 2 | 18 |
| 8 | 6 | -1 | -1 | -1 | 24 | -1 | -1 | 14 | 22 | -1 | -1 | 4 | -1 | -1 | -1 | -1 | 21 | 0 | -1 | -1 | -1 | -1 | -1 | 3 | 18 |
| 14 | -1 | -1 | -1 | 2 | -1 | -1 | -1 | 3 | -1 | 2 | -1 | 23 | -1 | 12 | -1 | -1 | -1 | 20 | 9 | -1 | -1 | -1 | -1 | 4 | 18 |
| 3 | 20 | 7 | 6 | 22 | 1 | 26 | 9 | -1 | -1 | -1 | -1 | -1 | -1 | -1 | -1 | -1 | -1 | -1 | 11 | 14 | -1 | -1 | -1 | 5 | 18 |
| -1 | -1 | -1 | -1 | 7 | -1 | 20 | 13 | -1 | -1 | -1 | -1 | 6 | 9 | 10 | -1 | -1 | -1 | -1 | -1 | 12 | 15 | -1 | -1 | 6 | 20 |
| -1 | -1 | 16 | -1 | -1 | -1 | 16 | -1 | -1 | -1 | 22 | 22 | -1 | -1 | -1 | 21 | 3 | -1 | -1 | -1 | -1 | 21 | 13 | -1 | 7 | 17 |
| -1 | 7 | -1 | 17 | -1 | -1 | -1 | 3 | -1 | 15 | -1 | -1 | -1 | 10 | -1 | 8 | -1 | 9 | -1 | -1 | -1 | -1 | 10 | 9 | 8 | 20 |

500 510 515 530 535

FROM FIG. 5A

RATE-1/2 SPLITTING RULES

| | | | | | | | | | | | | | | | | | | | | | | | |
|---|---|---|---|---|---|---|---|---|---|---|---|---|---|---|---|---|---|---|---|---|---|---|---|
| 1 | 2 | 1 | 1 | 1 | 2 | 0 | 1 | 0 | 0 | 2 | 0 | 2 | 0 | 0 | 1 | 0 | 2 | 0 | 0 | 1 | 0 | 2 | 2 |
| 2 | 2 | 1 | 1 | 1 | 2 | 2 | 0 | 0 | 2 | 2 | 1 | 0 | 2 | 2 | 2 | 1 | 1 | 2 | 2 | 2 | 1 | 2 | 1 |
| 0 | 2 | 2 | 1 | 2 | 1 | 2 | 0 | 0 | 1 | 0 | 2 | 2 | 0 | 0 | 2 | 1 | 2 | 0 | 2 | 2 | 1 | 0 | 0 |
| 2 | 0 | 2 | 1 | 1 | 2 | 2 | 0 | 1 | 1 | 1 | 0 | 1 | 2 | 1 | 2 | 2 | 0 | 1 | 2 | 1 | 1 | 1 | 2 |
| 0 | 1 | 2 | 2 | 2 | 2 | 1 | 2 | 1 | 1 | 2 | 0 | 1 | 0 | 2 | 2 | 1 | 2 | 1 | 1 | 1 | 0 | 2 | 0 |
| 0 | 0 | 2 | 2 | 0 | 0 | 1 | 0 | 1 | 1 | 0 | 1 | 2 | 1 | 2 | 2 | 0 | 2 | 1 | 1 | 1 | 0 | 0 | 2 |
| 1 | 2 | 1 | 2 | 1 | 0 | 1 | 0 | 0 | 0 | 0 | 2 | 0 | 1 | 1 | 0 | 0 | 1 | 0 | 2 | 2 | 1 | 1 | 0 |
| 2 | 2 | 1 | 0 | 1 | 2 | 2 | 1 | 2 | 2 | 1 | 1 | 2 | 1 | 2 | 1 | 0 | 2 | 1 | 1 | 1 | 0 | 2 | 2 |

| RATE-1/2 SPLITTING RULES | | | | | | | | | | | | | | | | | | | | | | | | |
|---|---|---|---|---|---|---|---|---|---|---|---|---|---|---|---|---|---|---|---|---|---|---|---|---|
| 1 | 0 | 1 | 0 | 1 | 1 | 2 | 2 | 2 | 0 | 2 | 2 | 1 | 2 | 2 | 1 | 0 | 0 | 0 | 0 | 0 | 0 | 0 | 0 | 1 |
| 0 | 2 | 2 | 1 | 0 | 0 | 0 | 0 | 0 | 0 | 0 | 0 | 0 | 0 | 0 | 0 | 0 | 0 | 0 | 0 | 0 | 0 | 0 | 0 | 2 |
| 1 | 0 | 2 | 0 | 0 | 0 | 0 | 1 | 2 | 1 | 0 | 0 | 0 | 0 | 0 | 0 | 0 | 0 | 0 | 0 | 0 | 0 | 0 | 0 | 3 |
| 2 | 1 | 1 | 1 | 1 | 0 | 0 | 0 | 0 | 0 | 0 | 0 | 0 | 0 | 0 | 0 | 0 | 0 | 0 | 0 | 0 | 0 | 0 | 0 | 4 |
| 1 | 0 | 1 | 2 | 2 | 2 | 1 | 0 | 0 | 0 | 0 | 0 | 0 | 0 | 0 | 0 | 0 | 0 | 0 | 0 | 0 | 0 | 0 | 0 | 5 |
| 0 | 2 | 2 | 2 | 2 | 1 | 2 | 1 | 1 | 1 | 2 | 1 | 2 | 1 | 0 | 0 | 0 | 0 | 0 | 0 | 0 | 0 | 0 | 0 | 6 |
| 0 | 2 | 2 | 1 | 1 | 0 | 1 | 1 | 2 | 1 | 2 | 1 | 0 | 0 | 0 | 0 | 0 | 0 | 0 | 0 | 0 | 0 | 0 | 0 | 7 |
| 0 | 2 | 0 | 1 | 0 | 1 | 0 | 1 | 0 | 0 | 0 | 0 | 0 | 0 | 0 | 0 | 0 | 0 | 0 | 0 | 0 | 0 | 0 | 0 | 8 |

FROM FIG. 7A

RATE-2/3 SPLITTING RULES

| | | | | | | | | | | | | | | | | | | | | | | | |
|---|---|---|---|---|---|---|---|---|---|---|---|---|---|---|---|---|---|---|---|---|---|---|---|
| 1 | 1 | 0 | 0 | 1 | 1 | 1 | 1 | 0 | 1 | 1 | 0 | 0 | 1 | 0 | 0 | 0 | 1 | 0 | 0 | 1 | 0 | 1 | 0 |
| 1 | 0 | 0 | 0 | 0 | 0 | 1 | 1 | 1 | 1 | 0 | 1 | 1 | 0 | 1 | 1 | 0 | 0 | 1 | 0 | 1 | 0 | 0 | 1 |
| 0 | 0 | 1 | 1 | 1 | 0 | 0 | 0 | 1 | 1 | 0 | 0 | 1 | 1 | 1 | 1 | 0 | 0 | 1 | 0 | 1 | 1 | 0 | 1 |
| 0 | 0 | 1 | 1 | 0 | 0 | 1 | 0 | 0 | 0 | 1 | 0 | 1 | 0 | 1 | 0 | 0 | 0 | 1 | 0 | 1 | 0 | 1 | 1 |
| 0 | 1 | 0 | 1 | 1 | 1 | 1 | 1 | 0 | 0 | 0 | 0 | 1 | 1 | 1 | 1 | 1 | 1 | 1 | 1 | 0 | 0 | 1 | 1 |
| 1 | 0 | 0 | 1 | 0 | 1 | 1 | 0 | 0 | 1 | 0 | 0 | 1 | 0 | 1 | 1 | 0 | 1 | 0 | 1 | 1 | 0 | 1 | 0 |
| 0 | 0 | 0 | 1 | 1 | 1 | 0 | 0 | 1 | 0 | 1 | 1 | 1 | 1 | 1 | 1 | 0 | 0 | 1 | 1 | 1 | 1 | 0 | 1 |
| 0 | 0 | 0 | 1 | 0 | 0 | 1 | 1 | 1 | 0 | 1 | 0 | 0 | 1 | 0 | 0 | 0 | 1 | 1 | 1 | 0 | 1 | 0 | 0 |

RATE-2/3 SPLITTING RULES

| | | | | | | | | | | | | | | | | | | | | | | | | |
|---|---|---|---|---|---|---|---|---|---|---|---|---|---|---|---|---|---|---|---|---|---|---|---|---|
| 0 | 0 | 1 | 1 | 0 | 1 | 1 | 1 | 1 | 0 | 1 | 0 | 0 | 1 | 1 | 0 | 0 | 0 | 0 | 0 | 0 | 0 | 0 | 0 | 1 |
| 1 | 1 | 1 | 1 | 1 | 0 | 1 | 0 | 1 | 1 | 1 | 0 | 0 | 0 | 0 | 0 | 0 | 0 | 0 | 0 | 0 | 0 | 0 | 0 | 2 |
| 0 | 1 | 0 | 1 | 1 | 1 | 0 | 0 | 1 | 1 | 0 | 0 | 0 | 0 | 0 | 0 | 0 | 0 | 0 | 0 | 0 | 0 | 0 | 0 | 3 |
| 1 | 0 | 1 | 0 | 1 | 0 | 0 | 0 | 0 | 1 | 0 | 1 | 1 | 0 | 0 | 0 | 0 | 0 | 0 | 0 | 0 | 0 | 0 | 0 | 4 |
| 0 | 0 | 1 | 0 | 1 | 1 | 1 | 1 | 0 | 0 | 0 | 0 | 0 | 0 | 0 | 0 | 0 | 0 | 0 | 0 | 0 | 0 | 0 | 0 | 5 |
| 0 | 0 | 1 | 1 | 0 | 0 | 1 | 1 | 1 | 0 | 0 | 1 | 0 | 1 | 0 | 0 | 0 | 0 | 0 | 0 | 0 | 0 | 0 | 0 | 6 |
| 1 | 1 | 0 | 1 | 1 | 1 | 1 | 1 | 1 | 1 | 1 | 1 | 0 | 0 | 0 | 0 | 0 | 0 | 0 | 0 | 0 | 0 | 0 | 0 | 7 |
| 1 | 1 | 0 | 0 | 1 | 0 | 0 | 0 | 1 | 1 | 0 | 1 | 1 | 1 | 0 | 1 | 0 | 0 | 0 | 0 | 0 | 0 | 0 | 0 | 8 |

FROM FIG. 8A

| RATE-3/4 SPLITTING RULES | | | | | | | | | | | | | | | | | | | | | | | |
|---|---|---|---|---|---|---|---|---|---|---|---|---|---|---|---|---|---|---|---|---|---|---|---|
| 0 | 1 | 0 | 0 | 1 | 1 | 0 | 0 | 1 | 0 | 0 | 0 | 1 | 1 | 1 | 0 | 1 | 0 | 0 | 0 | 1 | 0 | 0 | 1 |
| 0 | 0 | 1 | 1 | 0 | 0 | 0 | 1 | 0 | 1 | 0 | 0 | 0 | 0 | 0 | 1 | 0 | 1 | 0 | 1 | 0 | 1 | 0 | 0 |
| 0 | 0 | 0 | 1 | 1 | 0 | 0 | 0 | 0 | 1 | 0 | 1 | 1 | 0 | 0 | 0 | 1 | 0 | 1 | 1 | 0 | 0 | 1 | 0 |
| 1 | 0 | 0 | 1 | 0 | 1 | 1 | 0 | 0 | 0 | 1 | 0 | 0 | 1 | 0 | 0 | 0 | 1 | 1 | 0 | 1 | 1 | 0 | 1 |
| 0 | 1 | 1 | 0 | 1 | 0 | 0 | 0 | 1 | 0 | 0 | 0 | 0 | 0 | 0 | 1 | 0 | 0 | 0 | 0 | 0 | 0 | 1 | 0 |
| 1 | 1 | 1 | 0 | 0 | 0 | 0 | 0 | 0 | 0 | 1 | 0 | 0 | 1 | 1 | 0 | 0 | 1 | 0 | 0 | 1 | 0 | 0 | 1 |
| 0 | 0 | 0 | 1 | 0 | 0 | 0 | 0 | 0 | 0 | 0 | 1 | 0 | 0 | 0 | 0 | 0 | 0 | 1 | 0 | 0 | 1 | 0 | 1 |
| 1 | 1 | 1 | 0 | 0 | 1 | 0 | 1 | 0 | 0 | 1 | 0 | 1 | 0 | 1 | 0 | 1 | 1 | 0 | 1 | 1 | 0 | 1 | 0 |

FROM FIG. 9A

| RATE-3/4 SPLITTING RULES | | | | | | | | | | | | | | | | | | | | | | | | |
|---|---|---|---|---|---|---|---|---|---|---|---|---|---|---|---|---|---|---|---|---|---|---|---|---|
| 0 | 0 | 0 | 1 | 1 | 0 | 0 | 1 | 1 | 1 | 0 | 0 | 0 | 1 | 1 | 0 | 0 | 0 | 0 | 0 | 0 | 0 | 0 | 0 | 1 |
| 1 | 0 | 0 | 0 | 0 | 1 | 0 | 0 | 0 | 0 | 1 | 0 | 0 | 0 | 0 | 0 | 0 | 0 | 0 | 0 | 0 | 0 | 0 | 0 | 2 |
| 0 | 0 | 0 | 0 | 0 | 0 | 0 | 0 | 1 | 0 | 0 | 0 | 0 | 0 | 0 | 0 | 0 | 0 | 0 | 0 | 0 | 0 | 0 | 0 | 3 |
| 1 | 0 | 1 | 1 | 0 | 1 | 0 | 1 | 0 | 1 | 0 | 1 | 1 | 0 | 0 | 0 | 0 | 0 | 0 | 0 | 0 | 0 | 0 | 0 | 4 |
| 0 | 1 | 0 | 0 | 1 | 0 | 1 | 0 | 1 | 0 | 0 | 0 | 0 | 0 | 0 | 0 | 0 | 0 | 0 | 0 | 0 | 0 | 0 | 0 | 5 |
| 1 | 0 | 0 | 0 | 0 | 1 | 1 | 1 | 0 | 0 | 1 | 1 | 1 | 1 | 0 | 0 | 0 | 0 | 0 | 0 | 0 | 0 | 0 | 0 | 6 |
| 0 | 0 | 1 | 1 | 1 | 0 | 0 | 0 | 0 | 0 | 0 | 1 | 1 | 0 | 0 | 0 | 0 | 0 | 0 | 0 | 0 | 0 | 0 | 0 | 7 |
| 1 | 0 | 0 | 0 | 0 | 1 | 0 | 1 | 1 | 1 | 1 | 0 | 0 | 1 | 1 | 1 | 0 | 0 | 0 | 0 | 0 | 0 | 0 | 0 | 8 |

| | | | | | | | | | | | | | | | | | | | | | | | | |
|---|---|---|---|---|---|---|---|---|---|---|---|---|---|---|---|---|---|---|---|---|---|---|---|---|
| 1010 | 12 | -1 | 9 | -1 | -1 | -1 | 18 | -1 | -1 | -1 | -1 | -1 | -1 | -1 | -1 | -1 | 7 | -1 | -1 | -1 | -1 | -1 | -1 | -1 |
| 1015 | -1 | 20 | -1 | -1 | -1 | 12 | -1 | -1 | -1 | 18 | -1 | -1 | -1 | -1 | -1 | -1 | -1 | 18 | -1 | -1 | -1 | -1 | -1 | 10 |
| | 26 | 17 | -1 | -1 | -1 | -1 | -1 | -1 | -1 | 22 | 15 | -1 | -1 | -1 | -1 | -1 | -1 | -1 | 6 | -1 | -1 | -1 | -1 | -1 |
| | -1 | -1 | 14 | 9 | -1 | -1 | -1 | -1 | -1 | -1 | -1 | 1 | -1 | -1 | -1 | -1 | 0 | 8 | -1 | -1 | -1 | -1 | -1 | -1 |
| 1020 | -1 | -1 | -1 | -1 | 16 | -1 | -1 | -1 | 25 | -1 | 18 | -1 | -1 | -1 | 5 | -1 | -1 | -1 | 27 | -1 | 5 | -1 | -1 | -1 |
| | -1 | -1 | -1 | -1 | -1 | -1 | -1 | -1 | -1 | -1 | 25 | -1 | -1 | -1 | 26 | 10 | -1 | -1 | -1 | -1 | -1 | -1 | -1 | -1 |
| | -1 | -1 | -1 | -1 | -1 | -1 | -1 | -1 | 15 | 21 | -1 | -1 | 24 | -1 | -1 | -1 | -1 | -1 | -1 | -1 | -1 | -1 | -1 | -1 |
| | -1 | -1 | -1 | -1 | -1 | -1 | -1 | 13 | -1 | -1 | -1 | 8 | -1 | 22 | -1 | -1 | -1 | -1 | -1 | 24 | -1 | -1 | -1 | -1 |
| | -1 | 18 | -1 | -1 | 12 | -1 | -1 | -1 | -1 | -1 | -1 | -1 | 7 | -1 | -1 | -1 | -1 | -1 | -1 | -1 | 0 | -1 | -1 | -1 |
| | -1 | -1 | -1 | -1 | -1 | 8 | -1 | -1 | -1 | 1 | -1 | -1 | -1 | -1 | -1 | -1 | 27 | -1 | -1 | -1 | -1 | 7 | -1 | -1 |
| | -1 | -1 | -1 | -1 | -1 | -1 | -1 | -1 | -1 | -1 | -1 | 12 | -1 | -1 | -1 | -1 | -1 | -1 | -1 | 6 | -1 | -1 | -1 | -1 |
| | -1 | -1 | 8 | -1 | -1 | -1 | 20 | -1 | -1 | -1 | -1 | -1 | -1 | -1 | -1 | -1 | -1 | -1 | -1 | -1 | -1 | -1 | 5 | -1 |

FROM FIG. 10A

| | | | | | | | | | | | | | | | | | | | | | | | | | |
|---|---|---|---|---|---|---|---|---|---|---|---|---|---|---|---|---|---|---|---|---|---|---|---|---|---|
| 14 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | 4-2 | 5 |
| -1 | 7 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | 8-2 | 6 |
| -1 | -1 | 18 | -1 | -1 | -1 | -1 | -1 | -1 | -1 | -1 | -1 | -1 | -1 | -1 | -1 | -1 | -1 | -1 | -1 | -1 | -1 | -1 | -1 | 2-2 | 6 |
| -1 | -1 | -1 | 0 | -1 | -1 | -1 | -1 | -1 | -1 | -1 | -1 | -1 | -1 | -1 | -1 | -1 | -1 | -1 | -1 | -1 | -1 | -1 | -1 | 2-2 | 6 |
| -1 | -1 | -1 | -1 | 2 | -1 | -1 | -1 | -1 | -1 | -1 | -1 | -1 | -1 | -1 | -1 | -1 | -1 | -1 | -1 | -1 | -1 | -1 | -1 | 4-1 | 7 |
| -1 | -1 | -1 | 6 | 22 | 1 | -1 | -1 | -1 | -1 | -1 | -1 | -1 | -1 | -1 | -1 | -1 | -1 | -1 | -1 | -1 | -1 | -1 | -1 | 5-2 | 6 |
| 3 | -1 | 7 | -1 | -1 | -1 | 26 | -1 | -1 | -1 | -1 | -1 | -1 | -1 | -1 | -1 | -1 | -1 | -1 | -1 | -1 | -1 | -1 | -1 | 5-1 | 6 |
| -1 | -1 | -1 | 17 | -1 | -1 | -1 | 3 | -1 | -1 | -1 | -1 | -1 | -1 | -1 | -1 | -1 | -1 | -1 | -1 | -1 | -1 | -1 | -1 | 8-1 | 6 |
| -1 | -1 | -1 | -1 | -1 | -1 | -1 | -1 | 14 | -1 | -1 | -1 | -1 | -1 | -1 | -1 | -1 | -1 | -1 | -1 | -1 | -1 | -1 | -1 | 3-2 | 5 |
| 8 | -1 | -1 | -1 | -1 | -1 | -1 | -1 | -1 | 22 | -1 | -1 | -1 | -1 | -1 | -1 | -1 | -1 | -1 | -1 | -1 | -1 | -1 | -1 | 3-1 | 6 |
| -1 | -1 | 16 | -1 | -1 | -1 | -1 | -1 | -1 | -1 | 22 | -1 | -1 | -1 | -1 | -1 | -1 | -1 | -1 | -1 | -1 | -1 | -1 | -1 | 7-2 | 5 |
| -1 | -1 | -1 | -1 | -1 | -1 | 18 | -1 | -1 | -1 | -1 | 22 | -1 | -1 | -1 | -1 | -1 | -1 | -1 | -1 | -1 | -1 | -1 | -1 | 7-1 | 5 |

TO FIG.10D

FROM FIG. 10A

| | | | | | | | | | | | | | | | | | | | | | | | |
|---|---|---|---|---|---|---|---|---|---|---|---|---|---|---|---|---|---|---|---|---|---|---|---|
| -1 | -1 | -1 | -1 | -1 | -1 | -1 | -1 | -1 | -1 | -1 | -1 | 8 | -1 | 27 | 5 | -1 | -1 | -1 | -1 | -1 | -1 | -1 | 13 |
| -1 | -1 | -1 | -1 | -1 | -1 | -1 | -1 | -1 | -1 | -1 | -1 | -1 | 13 | -1 | -1 | -1 | -1 | -1 | -1 | 13 | -1 | -1 | -1 |
| -1 | 11 | -1 | -1 | -1 | 17 | -1 | -1 | -1 | -1 | -1 | -1 | -1 | -1 | -1 | -1 | -1 | 24 | -1 | -1 | -1 | -1 | 7 | 27 |
| 23 | -1 | 16 | 23 | 15 | -1 | -1 | 5 | -1 | -1 | -1 | -1 | -1 | -1 | -1 | -1 | -1 | -1 | -1 | -1 | -1 | -1 | -1 | -1 |
| -1 | -1 | -1 | -1 | -1 | -1 | 27 | -1 | -1 | -1 | -1 | -1 | -1 | -1 | -1 | -1 | -1 | -1 | 23 | 5 | -1 | 15 | -1 | -1 |
| -1 | -1 | -1 | -1 | -1 | -1 | -1 | -1 | 14 | -1 | -1 | -1 | -1 | -1 | -1 | -1 | -1 | -1 | -1 | -1 | -1 | -1 | -1 | -1 |
| 17 | -1 | -1 | -1 | -1 | -1 | -1 | -1 | 12 | -1 | -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | -1 | -1 | 19 | -1 | 24 | -1 | -1 | -1 | -1 | -1 | -1 | -1 | -1 | -1 | -1 |
| -1 | -1 | -1 | -1 | 20 | 2 | -1 | 17 | -1 | -1 | -1 | -1 | -1 | -1 | -1 | -1 | -1 | -1 | -1 | -1 | -1 | 5 | 8 | -1 |
| -1 | -1 | -1 | -1 | -1 | -1 | -1 | 0 | -1 | -1 | 11 | -1 | -1 | -1 | -1 | 4 | -1 | -1 | -1 | -1 | -1 | -1 | -1 | -1 |
| -1 | -1 | -1 | 11 | -1 | -1 | -1 | -1 | -1 | -1 | -1 | -1 | -1 | -1 | -1 | -1 | -1 | -1 | -1 | -1 | -1 | 16 | -1 | -1 |

FROM FIG.10B

FROM FIG. 10C

| | | | | | | | | | | | | | | | | | | | | | | | | | |
|---|---|---|---|---|---|---|---|---|---|---|---|---|---|---|---|---|---|---|---|---|---|---|---|---|---|
| -1 | -1 | -1 | -1 | 7 | -1 | 20 | -1 | -1 | -1 | -1 | -1 | 6 | -1 | -1 | -1 | -1 | -1 | -1 | -1 | -1 | -1 | -1 | -1 | 6-2 | 7 |
| -1 | -1 | -1 | -1 | -1 | -1 | -1 | -1 | -1 | -1 | -1 | -1 | -1 | 9 | -1 | -1 | -1 | -1 | -1 | -1 | -1 | -1 | -1 | -1 | 6-1 | 5 |
| -1 | -1 | -1 | -1 | -1 | -1 | -1 | -1 | -1 | -1 | -1 | 23 | -1 | 21 | 14 | -1 | -1 | -1 | -1 | -1 | -1 | -1 | -1 | -1 | 1-2 | 8 |
| -1 | -1 | -1 | -1 | -1 | -1 | -1 | -1 | -1 | -1 | -1 | -1 | -1 | -1 | -1 | 6 | -1 | -1 | -1 | -1 | -1 | -1 | -1 | -1 | 1-1 | 6 |
| -1 | -1 | -1 | -1 | -1 | -1 | -1 | -1 | -1 | 8 | -1 | -1 | -1 | -1 | -1 | -1 | 0 | -1 | -1 | -1 | -1 | -1 | -1 | -1 | 1-0 | 6 |
| -1 | -1 | -1 | -1 | -1 | -1 | -1 | -1 | 26 | -1 | 14 | 3 | -1 | -1 | -1 | -1 | 1 | 24 | -1 | -1 | -1 | -1 | -1 | -1 | 2-0 | 6 |
| -1 | 6 | -1 | -1 | -1 | 24 | -1 | -1 | -1 | -1 | -1 | -1 | 4 | -1 | -1 | -1 | -1 | 21 | 1 | -1 | -1 | -1 | -1 | -1 | 3-0 | 7 |
| -1 | -1 | -1 | -1 | -1 | -1 | -1 | -1 | 3 | 2 | -1 | -1 | 23 | -1 | 12 | -1 | -1 | -1 | 20 | 9 | -1 | -1 | -1 | -1 | 4-0 | 6 |
| -1 | 20 | -1 | -1 | -1 | -1 | -1 | 9 | -1 | -1 | -1 | -1 | -1 | -1 | -1 | -1 | -1 | -1 | -1 | 11 | 14 | -1 | -1 | -1 | 5-0 | 6 |
| -1 | -1 | -1 | -1 | -1 | -1 | -1 | -1 | -1 | -1 | -1 | -1 | -1 | -1 | 10 | -1 | -1 | -1 | -1 | -1 | 12 | 15 | -1 | -1 | 6-0 | 8 |
| -1 | -1 | -1 | -1 | -1 | -1 | -1 | -1 | -1 | -1 | -1 | -1 | -1 | -1 | -1 | 21 | 3 | -1 | -1 | -1 | -1 | 21 | 13 | -1 | 7-0 | 7 |
| -1 | -1 | -1 | -1 | -1 | -1 | -1 | -1 | -1 | 15 | -1 | -1 | -1 | 10 | -1 | 8 | -1 | 9 | -1 | -1 | -1 | -1 | 10 | 9 | 8-0 | 8 |

| | | | | | | | | | | | | | | | | | | | | | | | |
|---|---|---|---|---|---|---|---|---|---|---|---|---|---|---|---|---|---|---|---|---|---|---|---|
| -1 | -1 | -1 | -1 | -1 | -1 | -1 | -1 | -1 | -1 | -1 | -1 | 24 | 24 | 26 | 10 | -1 | -1 | -1 | -1 | -1 | -1 | -1 | -1 |
| -1 | -1 | -1 | -1 | 12 | -1 | -1 | -1 | 12 | 1 | -1 | -1 | 7 | -1 | -1 | -1 | -1 | -1 | -1 | -1 | 0 | 7 | -1 | -1 |
| 26 | -1 | -1 | -1 | -1 | -1 | -1 | -1 | 14 | 22 | -1 | 1 | -1 | -1 | -1 | -1 | -1 | -1 | 6 | -1 | -1 | -1 | -1 | -1 |
| -1 | -1 | -1 | 1 | -1 | -1 | -1 | -1 | -1 | -1 | 11 | 12 | -1 | -1 | -1 | 4 | -1 | -1 | -1 | 6 | -1 | -1 | -1 | -1 |
| -1 | -1 | 9 | -1 | -1 | -1 | 18 | -1 | -1 | -1 | 18 | -1 | -1 | -1 | 5 | -1 | -1 | -1 | 27 | -1 | 5 | -1 | -1 | -1 |
| -1 | -1 | -1 | -1 | -1 | 2 | 2 | -1 | -1 | -1 | -1 | -1 | 8 | -1 | 27 | 5 | -1 | -1 | -1 | -1 | 13 | -1 | 8 | -1 |
| 23 | 11 | -1 | -1 | 15 | 17 | 27 | 5 | -1 | -1 | -1 | -1 | -1 | -1 | -1 | -1 | -1 | 24 | -1 | -1 | -1 | -1 | 7 | -1 |
| -1 | -1 | -1 | 11 | -1 | -1 | -1 | 13 | -1 | -1 | -1 | -1 | -1 | 22 | -1 | -1 | -1 | 18 | -1 | 24 | -1 | 16 | -1 | -1 |
| -1 | -1 | 16 | 23 | -1 | -1 | -1 | -1 | -1 | -1 | -1 | -1 | -1 | -1 | -1 | -1 | -1 | -1 | 23 | 5 | -1 | 15 | -1 | 27 |
| -1 | 17 | 14 | 9 | -1 | -1 | -1 | -1 | -1 | -1 | 15 | -1 | -1 | -1 | -1 | -1 | 0 | 8 | -1 | -1 | -1 | -1 | -1 | -1 |
| 17 | 18 | -1 | -1 | -1 | 8 | -1 | -1 | -1 | -1 | -1 | -1 | -1 | -1 | -1 | -1 | 27 | -1 | -1 | -1 | -1 | -1 | -1 | -1 |
| 12 | -1 | -1 | -1 | 16 | -1 | -1 | -1 | 25 | -1 | -1 | -1 | -1 | -1 | -1 | -1 | 7 | -1 | -1 | -1 | -1 | -1 | -1 | -1 |
| -1 | -1 | -1 | -1 | -1 | -1 | -1 | -1 | 15 | 21 | 25 | 19 | -1 | -1 | -1 | -1 | -1 | -1 | -1 | -1 | -1 | -1 | -1 | -1 |
| -1 | -1 | -1 | -1 | 20 | -1 | -1 | 17 | -1 | -1 | -1 | -1 | -1 | 13 | -1 | -1 | -1 | -1 | -1 | -1 | -1 | 5 | -1 | 13 |
| -1 | -1 | 8 | -1 | -1 | -1 | 20 | 0 | -1 | -1 | -1 | -1 | -1 | -1 | -1 | -1 | -1 | -1 | -1 | -1 | -1 | -1 | 5 | -1 |
| -1 | 20 | -1 | -1 | -1 | 12 | -1 | -1 | -1 | 18 | -1 | 8 | -1 | -1 | -1 | -1 | -1 | -1 | -1 | -1 | -1 | -1 | -1 | 10 |

| | | | | | | | | | | | | | | | | | | | | | | | | | |
|---|---|---|---|---|---|---|---|---|---|---|---|---|---|---|---|---|---|---|---|---|---|---|---|---|---|
| -1 | -1 | 7 | -1 | 22 | 1 | 26 | 9 | -1 | -1 | -1 | -1 | -1 | -1 | -1 | -1 | -1 | -1 | -1 | -1 | -1 | -1 | -1 | -1 | 5-1 | 9 |
| -1 | 6 | -1 | -1 | -1 | 24 | -1 | -1 | 14 | 22 | -1 | -1 | -1 | -1 | -1 | -1 | -1 | -1 | -1 | -1 | -1 | -1 | -1 | -1 | 3-1 | 10 |
| -1 | -1 | 18 | 0 | -1 | -1 | -1 | -1 | 26 | -1 | 14 | -1 | -1 | -1 | -1 | -1 | -1 | -1 | -1 | -1 | -1 | -1 | -1 | -1 | 2-1 | 9 |
| -1 | -1 | -1 | -1 | -1 | -1 | 18 | -1 | -1 | -1 | 22 | 22 | -1 | -1 | -1 | -1 | -1 | -1 | -1 | -1 | -1 | -1 | -1 | -1 | 7-1 | 8 |
| 14 | -1 | -1 | -1 | 2 | -1 | -1 | -1 | -1 | -1 | -1 | -1 | 23 | -1 | -1 | -1 | -1 | -1 | -1 | -1 | -1 | -1 | -1 | -1 | 4-1 | 9 |
| -1 | -1 | -1 | -1 | -1 | -1 | 20 | 13 | -1 | -1 | -1 | -1 | -1 | 9 | -1 | -1 | -1 | -1 | -1 | -1 | -1 | -1 | -1 | -1 | 6-1 | 10 |
| -1 | -1 | -1 | -1 | -1 | -1 | -1 | -1 | -1 | -1 | -1 | -1 | -1 | 21 | 14 | -1 | -1 | -1 | -1 | -1 | -1 | -1 | -1 | -1 | 1-1 | 10 |
| -1 | 7 | -1 | -1 | -1 | -1 | -1 | -1 | -1 | 15 | -1 | -1 | -1 | 10 | -1 | 8 | -1 | -1 | -1 | -1 | -1 | -1 | -1 | -1 | 8-1 | 10 |
| -1 | -1 | -1 | -1 | -1 | -1 | -1 | -1 | -1 | 8 | -1 | 23 | -1 | -1 | -1 | 6 | 0 | -1 | -1 | -1 | -1 | -1 | -1 | -1 | 1-0 | 10 |
| -1 | -1 | -1 | -1 | -1 | -1 | -1 | -1 | -1 | -1 | -1 | 3 | -1 | -1 | -1 | -1 | 1 | 24 | -1 | -1 | -1 | -1 | -1 | -1 | 2-0 | 9 |
| 8 | -1 | -1 | -1 | -1 | -1 | -1 | -1 | -1 | -1 | -1 | -1 | 4 | -1 | -1 | -1 | -1 | 21 | 0 | -1 | -1 | -1 | -1 | -1 | 3-0 | 8 |
| -1 | -1 | -1 | -1 | -1 | -1 | -1 | -1 | 3 | -1 | 2 | -1 | -1 | -1 | 12 | -1 | -1 | -1 | 20 | 9 | -1 | -1 | -1 | -1 | 4-0 | 9 |
| 3 | 20 | -1 | 6 | -1 | -1 | -1 | -1 | -1 | -1 | -1 | -1 | -1 | -1 | -1 | -1 | -1 | -1 | -1 | 11 | 14 | -1 | -1 | -1 | 5-0 | 9 |
| -1 | -1 | -1 | -1 | 7 | -1 | -1 | -1 | -1 | -1 | -1 | -1 | 6 | -1 | 10 | -1 | -1 | -1 | -1 | -1 | 12 | 15 | -1 | -1 | 6-0 | 10 |
| -1 | -1 | 16 | -1 | -1 | -1 | -1 | -1 | -1 | -1 | -1 | -1 | -1 | -1 | -1 | 21 | 3 | -1 | -1 | -1 | -1 | 21 | 13 | -1 | 7-0 | 9 |
| -1 | -1 | -1 | 17 | -1 | -1 | -1 | 3 | -1 | -1 | -1 | -1 | -1 | -1 | -1 | -1 | -1 | 9 | -1 | -1 | -1 | -1 | 10 | 9 | 8-0 | 10 |

FROM FIG. 11A

| | | | | | | | | | | | | | | | | | | | | | | | |
|---|---|---|---|---|---|---|---|---|---|---|---|---|---|---|---|---|---|---|---|---|---|---|---|
| 12 | -1 | -1 | -1 | -1 | -1 | 18 | -1 | 15 | -1 | 18 | -1 | -1 | -1 | -1 | 10 | -1 | -1 | 27 | -1 | 5 | -1 | -1 | -1 |
| -1 | -1 | -1 | -1 | 12 | -1 | -1 | -1 | -1 | 1 | -1 | -1 | 7 | 13 | 27 | -1 | 27 | -1 | -1 | -1 | 13 | -1 | -1 | 13 |
| -1 | 11 | 14 | 9 | 15 | 17 | -1 | -1 | -1 | 22 | -1 | -1 | -1 | -1 | -1 | -1 | -1 | 8 | -1 | -1 | -1 | -1 | -1 | 27 |
| -1 | 20 | -1 | 1 | -1 | 12 | -1 | 13 | -1 | -1 | -1 | 12 | -1 | -1 | -1 | -1 | -1 | 18 | -1 | 24 | -1 | -1 | -1 | -1 |
| 23 | -1 | 16 | 23 | -1 | -1 | 27 | 5 | -1 | -1 | -1 | -1 | -1 | -1 | -1 | -1 | -1 | 24 | 23 | 5 | -1 | 15 | 7 | -1 |
| 26 | 17 | -1 | -1 | -1 | -1 | -1 | -1 | 14 | -1 | 15 | 11 | -1 | -1 | -1 | -1 | 0 | -1 | 6 | -1 | -1 | -1 | -1 | -1 |
| 17 | 18 | -1 | -1 | -1 | 8 | -1 | -1 | 12 | -1 | -1 | -1 | -1 | -1 | -1 | -1 | -1 | -1 | -1 | -1 | 0 | 7 | -1 | -1 |
| -1 | -1 | 9 | -1 | 16 | -1 | -1 | -1 | 25 | -1 | -1 | -1 | -1 | -1 | 5 | -1 | 7 | -1 | -1 | -1 | -1 | -1 | -1 | -1 |
| -1 | -1 | -1 | -1 | -1 | -1 | -1 | -1 | -1 | 21 | 25 | 19 | 24 | 24 | 26 | -1 | -1 | -1 | -1 | -1 | -1 | -1 | -1 | -1 |
| -1 | -1 | -1 | -1 | 20 | 2 | 2 | 17 | -1 | -1 | -1 | -1 | 8 | -1 | -1 | 5 | -1 | -1 | -1 | -1 | -1 | 5 | 8 | -1 |
| -1 | -1 | 8 | -1 | -1 | -1 | 20 | 0 | -1 | -1 | 11 | -1 | -1 | -1 | -1 | 4 | -1 | -1 | -1 | 6 | -1 | -1 | 5 | -1 |
| -1 | -1 | -1 | 11 | -1 | -1 | -1 | -1 | -1 | 18 | -1 | 8 | -1 | 22 | -1 | -1 | -1 | -1 | -1 | -1 | -1 | 16 | -1 | 10 |

| | | | | | | | | | | | | | | | | | | | | | | | | | |
|---|---|---|---|---|---|---|---|---|---|---|---|---|---|---|---|---|---|---|---|---|---|---|---|---|---|
| 14 | 20 | -1 | -1 | 22 | -1 | 26 | -1 | -1 | -1 | -1 | -1 | 23 | -1 | -1 | -1 | -1 | -1 | -1 | -1 | -1 | -1 | -1 | -1 | 4-1+5-1 | 12 |
| -1 | -1 | -1 | -1 | -1 | -1 | 20 | 13 | 14 | -1 | -1 | -1 | 6 | 9 | -1 | -1 | -1 | -1 | -1 | -1 | -1 | -1 | -1 | -1 | 6-1+3-1 | 13 |
| -1 | -1 | -1 | -1 | -1 | -1 | -1 | -1 | -1 | 8 | 14 | -1 | -1 | 21 | 14 | -1 | -1 | -1 | -1 | -1 | -1 | -1 | -1 | -1 | 1-1+2-1 | 12 |
| -1 | -1 | 16 | -1 | -1 | -1 | -1 | 3 | -1 | 15 | -1 | 22 | -1 | 10 | -1 | 8 | -1 | -1 | -1 | -1 | -1 | -1 | -1 | -1 | 8-1+7-1 | 13 |
| -1 | -1 | -1 | -1 | -1 | -1 | -1 | -1 | -1 | -1 | -1 | 23 | -1 | -1 | -1 | 6 | 0 | -1 | -1 | -1 | -1 | -1 | -1 | -1 | 1-0 | 13 |
| -1 | -1 | 18 | 0 | -1 | -1 | -1 | -1 | 26 | -1 | -1 | 3 | -1 | -1 | -1 | -1 | 1 | 24 | -1 | -1 | -1 | -1 | -1 | -1 | 2-0 | 13 |
| 8 | 6 | -1 | -1 | -1 | 24 | -1 | -1 | -1 | 22 | -1 | -1 | 4 | -1 | -1 | -1 | -1 | 21 | 0 | -1 | -1 | -1 | -1 | -1 | 3-0 | 13 |
| -1 | -1 | -1 | -1 | 2 | -1 | -1 | -1 | 3 | -1 | 2 | -1 | -1 | -1 | 12 | -1 | -1 | -1 | 20 | 9 | -1 | -1 | -1 | -1 | 4-0 | 11 |
| 3 | -1 | 7 | 6 | -1 | 1 | -1 | 9 | -1 | -1 | -1 | -1 | -1 | -1 | -1 | -1 | -1 | -1 | -1 | 11 | 14 | -1 | -1 | -1 | 5-0 | 13 |
| -1 | -1 | -1 | -1 | 7 | -1 | -1 | -1 | -1 | -1 | -1 | -1 | -1 | -1 | 10 | -1 | -1 | -1 | -1 | -1 | 12 | 15 | -1 | -1 | 6-0 | 12 |
| -1 | -1 | -1 | -1 | -1 | -1 | 18 | -1 | -1 | -1 | 22 | -1 | -1 | -1 | -1 | 21 | 3 | -1 | -1 | -1 | -1 | 21 | 13 | -1 | 7-0 | 13 |
| -1 | 7 | -1 | 17 | -1 | -1 | -1 | -1 | -1 | -1 | -1 | -1 | -1 | -1 | -1 | -1 | -1 | 9 | -1 | -1 | -1 | -1 | 10 | 9 | 8-0 | 11 |

FROM FIG. 12A

| RATE-3/4 SPLITTING RULES (NEW) | | | | | | | | | | | | | | | | | | | | | | | |
|---|---|---|---|---|---|---|---|---|---|---|---|---|---|---|---|---|---|---|---|---|---|---|---|
| 0 | 0 | 1 | 0 | 0 | 0 | 0 | 1 | 0 | 1 | 1 | 0 | 1 | 0 | 0 | 1 | 0 | 0 | 0 | 1 | 1 | 0 | 0 | 0 |
| 0 | 0 | 1 | 1 | 0 | 0 | 0 | 0 | 0 | 0 | 0 | 0 | 1 | 0 | 0 | 1 | 1 | 0 | 0 | 0 | 1 | 0 | 0 | 0 |
| 1 | 1 | 1 | 0 | 0 | 1 | 1 | 0 | 0 | 0 | 1 | 0 | 0 | 0 | 0 | 1 | 1 | 0 | 1 | 1 | 0 | 0 | 0 | 0 |
| 0 | 0 | 0 | 0 | 0 | 0 | 0 | 0 | 0 | 1 | 0 | 0 | 0 | 0 | 1 | 0 | 1 | 0 | 0 | 0 | 0 | 0 | 0 | 0 |
| 1 | 1 | 0 | 1 | 1 | 1 | 0 | 0 | 1 | 0 | 0 | 0 | 0 | 0 | 1 | 0 | 0 | 0 | 0 | 0 | 0 | 0 | 0 | 1 |
| 1 | 1 | 0 | 0 | 1 | 1 | 0 | 0 | 1 | 1 | 1 | 1 | 0 | 1 | 1 | 0 | 0 | 1 | 0 | 1 | 0 | 1 | 1 | 0 |
| 0 | 0 | 0 | 1 | 0 | 0 | 0 | 0 | 1 | 1 | 0 | 1 | 1 | 0 | 1 | 0 | 0 | 1 | 0 | 0 | 1 | 0 | 0 | 0 |
| 0 | 1 | 1 | 1 | 1 | 1 | 0 | 0 | 0 | 0 | 0 | 0 | 1 | 0 | 0 | 0 | 0 | 0 | 1 | 0 | 0 | 1 | 0 | 0 |

RATE-3/4 SPLITTING RULES (NEW)

| | | | | | | | | | | | | | | | | | | | | | | | | |
|---|---|---|---|---|---|---|---|---|---|---|---|---|---|---|---|---|---|---|---|---|---|---|---|---|
| 0 | 1 | 0 | 0 | 0 | 0 | 0 | 1 | 1 | 1 | 1 | 0 | 0 | 1 | 1 | 0 | 0 | 0 | 0 | 0 | 0 | 0 | 0 | 0 | 1 |
| 1 | 1 | 0 | 0 | 1 | 0 | 0 | 0 | 0 | 0 | 1 | 1 | 0 | 0 | 0 | 0 | 0 | 0 | 0 | 0 | 0 | 0 | 0 | 0 | 2 |
| 0 | 1 | 1 | 1 | 0 | 1 | 0 | 1 | 0 | 0 | 0 | 0 | 1 | 0 | 0 | 0 | 0 | 0 | 0 | 0 | 0 | 0 | 0 | 0 | 3 |
| 1 | 0 | 0 | 0 | 0 | 0 | 1 | 0 | 1 | 1 | 0 | 0 | 0 | 0 | 1 | 0 | 0 | 0 | 0 | 0 | 0 | 0 | 0 | 0 | 4 |
| 1 | 0 | 1 | 1 | 0 | 1 | 0 | 0 | 0 | 0 | 0 | 1 | 1 | 0 | 0 | 0 | 0 | 0 | 0 | 0 | 0 | 0 | 0 | 0 | 5 |
| 0 | 0 | 1 | 1 | 0 | 0 | 1 | 0 | 1 | 0 | 0 | 0 | 0 | 1 | 0 | 0 | 0 | 0 | 0 | 0 | 0 | 0 | 0 | 0 | 6 |
| 0 | 0 | 0 | 0 | 0 | 0 | 1 | 0 | 1 | 0 | 0 | 1 | 0 | 0 | 0 | 0 | 0 | 0 | 0 | 0 | 0 | 0 | 0 | 0 | 7 |
| 0 | 1 | 0 | 0 | 0 | 0 | 0 | 1 | 0 | 0 | 0 | 1 | 1 | 0 | 0 | 1 | 0 | 0 | 0 | 0 | 0 | 0 | 0 | 0 | 8 |

FROM FIG. 13A

RATE-3/4 (NEW)

| | | | | | | | | | | | | | | | | | | | | | | | | |
|---|---|---|---|---|---|---|---|---|---|---|---|---|---|---|---|---|---|---|---|---|---|---|---|---|
| 1434 | 17 | 18 | -1 | 1 | -1 | 8 | -1 | -1 | -1 | -1 | -1 | 12 | -1 | -1 | -1 | -1 | 27 | -1 | -1 | -1 | -1 | -1 | -1 | -1 |
| 1424 | -1 | -1 | 14 | 9 | 20 | 2 | -1 | -1 | -1 | -1 | -1 | -1 | -1 | 13 | 27 | -1 | 0 | -1 | -1 | -1 | -1 | 5 | 8 | -1 |
| 1410 | -1 | -1 | 16 | -1 | -1 | -1 | -1 | 5 | 15 | -1 | -1 | -1 | -1 | -1 | 26 | -1 | -1 | -1 | -1 | 5 | -1 | -1 | -1 | -1 |
| 1444 | -1 | 20 | -1 | 11 | -1 | 12 | -1 | -1 | -1 | -1 | -1 | -1 | -1 | -1 | 5 | -1 | 7 | -1 | -1 | -1 | -1 | 16 | -1 | -1 |
| 1412 | 23 | 11 | -1 | 23 | 15 | 17 | 27 | -1 | -1 | -1 | -1 | -1 | -1 | -1 | -1 | -1 | -1 | 24 | 23 | -1 | -1 | 15 | 7 | 27 |
| 1420 | 26 | 17 | -1 | -1 | -1 | -1 | -1 | -1 | 14 | 22 | 15 | 1 | -1 | -1 | -1 | -1 | -1 | 8 | 6 | -1 | -1 | -1 | -1 | -1 |
| 1430 | -1 | -1 | -1 | -1 | 12 | -1 | -1 | -1 | 12 | 1 | -1 | -1 | 7 | -1 | -1 | -1 | -1 | -1 | -1 | -1 | 0 | 7 | -1 | -1 |
| 1440 | 12 | -1 | 9 | -1 | 16 | -1 | 18 | -1 | 25 | -1 | 18 | -1 | -1 | -1 | -1 | -1 | -1 | -1 | 27 | -1 | 5 | -1 | -1 | -1 |
| 1414 | -1 | -1 | -1 | -1 | -1 | -1 | -1 | -1 | -1 | 21 | 25 | 19 | 24 | 24 | -1 | 10 | -1 | -1 | -1 | -1 | -1 | -1 | -1 | -1 |
| 1422 | -1 | -1 | -1 | -1 | -1 | -1 | 2 | 17 | -1 | -1 | -1 | -1 | 8 | -1 | -1 | 5 | -1 | -1 | -1 | -1 | 13 | -1 | -1 | 13 |
| 1432 | -1 | -1 | 8 | -1 | -1 | -1 | 20 | 0 | -1 | -1 | 11 | -1 | -1 | -1 | -1 | 4 | -1 | -1 | -1 | 6 | -1 | -1 | 5 | -1 |
| 1442 | -1 | -1 | -1 | 1 | -1 | -1 | -1 | 13 | -1 | 18 | -1 | 8 | -1 | 22 | -1 | -1 | -1 | 18 | -1 | 24 | -1 | -1 | -1 | 10 |

| RATE-3/4 (NEW) | | | | | | | | | | | | | | | | | | | | | | | | | Wr |
|---|---|---|---|---|---|---|---|---|---|---|---|---|---|---|---|---|---|---|---|---|---|---|---|---|---|
| -1 | 6 | -1 | -1 | -1 | 24 | 18 | -1 | -1 | -1 | -1 | 22 | 4 | -1 | -1 | -1 | -1 | -1 | -1 | -1 | -1 | -1 | -1 | -1 | 3-1+7-1 | 11 |
| -1 | -1 | -1 | -1 | -1 | -1 | 20 | -1 | -1 | -1 | 14 | 3 | -1 | 9 | -1 | -1 | -1 | -1 | -1 | -1 | -1 | -1 | -1 | -1 | 6-1+2-1 | 13 |
| 3 | -1 | 7 | 6 | -1 | -1 | -1 | -1 | -1 | 8 | -1 | -1 | -1 | 21 | 14 | -1 | -1 | -1 | -1 | -1 | -1 | -1 | -1 | -1 | 1-1+5-1 | 12 |
| 14 | 7 | -1 | -1 | -1 | -1 | -1 | 3 | 3 | -1 | -1 | -1 | -1 | -1 | 12 | 8 | -1 | -1 | -1 | -1 | -1 | -1 | -1 | -1 | 8-1+4-1 | 12 |
| -1 | -1 | -1 | -1 | -1 | -1 | -1 | -1 | -1 | -1 | -1 | 23 | -1 | -1 | -1 | 6 | 0 | -1 | -1 | -1 | -1 | -1 | -1 | -1 | 1-0 | 14 |
| -1 | -1 | 18 | 0 | -1 | -1 | -1 | -1 | 26 | -1 | -1 | -1 | -1 | -1 | -1 | -1 | 1 | 24 | -1 | -1 | -1 | -1 | -1 | -1 | 2-0 | 13 |
| 8 | -1 | -1 | -1 | -1 | -1 | -1 | -1 | 14 | 22 | -1 | -1 | -1 | -1 | -1 | -1 | -1 | 21 | 0 | -1 | -1 | -1 | -1 | -1 | 3-0 | 11 |
| -1 | -1 | -1 | -1 | 2 | -1 | -1 | -1 | -1 | -1 | 2 | -1 | 23 | -1 | -1 | -1 | -1 | -1 | 20 | 9 | -1 | -1 | -1 | -1 | 4-0 | 13 |
| -1 | 20 | -1 | -1 | 22 | -1 | 26 | 9 | -1 | -1 | -1 | -1 | -1 | -1 | -1 | -1 | -1 | -1 | -1 | 11 | 14 | -1 | -1 | -1 | 5-0 | 12 |
| -1 | -1 | -1 | -1 | 7 | -1 | -1 | 13 | -1 | -1 | -1 | -1 | 6 | -1 | 10 | -1 | -1 | -1 | -1 | -1 | 12 | 15 | -1 | -1 | 6-0 | 12 |
| -1 | -1 | 16 | -1 | -1 | -1 | -1 | -1 | -1 | -1 | 22 | -1 | -1 | -1 | -1 | 21 | 3 | -1 | -1 | -1 | -1 | 21 | 13 | -1 | 7-0 | 13 |
| -1 | -1 | -1 | 17 | -1 | -1 | -1 | -1 | -1 | 15 | -1 | -1 | -1 | 10 | -1 | -1 | -1 | 9 | -1 | -1 | -1 | -1 | 10 | 9 | 8-0 | 13 |

FROM FIG. 14A

| 1 | | 2 | | 3 | | 4 | | 5 | | 6 | | 7 | | 8 | | 9 | | 10 | | 11 | | 12 | |
|---|---|---|---|---|---|---|---|---|---|---|---|---|---|---|---|---|---|---|---|---|---|---|---|
| a | b | a | b | a | b | a | b | a | b | a | b | a | b | a | b | a | b | a | b | a | b | a | b |
| -1 | 27 | -1 | 0 | 24 | -1 | -1 | 24 | -1 | 20 | -1 | 19 | -1 | 14 | -1 | 15 | -1 | -1 | -1 | -1 | -1 | -1 | -1 | -1 |
| 17 | -1 | 17 | -1 | -1 | 21 | 7 | -1 | 12 | -1 | 4 | -1 | 18 | -1 | 2 | -1 | -1 | -1 | -1 | -1 | -1 | -1 | -1 | -1 |
| 24 | -1 | -1 | 14 | 7 | -1 | -1 | 20 | -1 | -1 | -1 | -1 | -1 | -1 | -1 | -1 | 2 | -1 | 4 | -1 | -1 | 24 | -1 | 10 |
| -1 | 9 | 25 | -1 | -1 | 19 | 20 | -1 | -1 | -1 | -1 | -1 | -1 | -1 | -1 | -1 | -1 | 4 | -1 | 0 | 25 | -1 | 2 | -1 |
| -1 | 18 | 14 | -1 | -1 | -1 | -1 | -1 | 0 | -1 | 10 | -1 | -1 | -1 | -1 | -1 | 6 | -1 | -1 | 19 | -1 | -1 | -1 | -1 |
| 14 | -1 | -1 | 11 | -1 | -1 | -1 | -1 | -1 | 21 | -1 | 11 | -1 | -1 | -1 | -1 | -1 | 23 | 17 | -1 | -1 | -1 | -1 | -1 |
| 8 | -1 | -1 | -1 | -1 | 23 | -1 | -1 | 21 | -1 | -1 | -1 | 19 | -1 | -1 | -1 | -1 | 18 | -1 | -1 | 4 | -1 | -1 | -1 |
| -1 | 20 | -1 | -1 | 19 | -1 | -1 | -1 | -1 | 16 | -1 | -1 | -1 | 20 | -1 | -1 | 4 | -1 | -1 | -1 | -1 | 4 | -1 | -1 |
| -1 | -1 | -1 | -1 | -1 | -1 | -1 | -1 | -1 | -1 | -1 | -1 | -1 | -1 | -1 | -1 | -1 | 25 | -1 | 16 | -1 | 22 | -1 | 13 |
| -1 | -1 | -1 | -1 | -1 | -1 | -1 | -1 | -1 | -1 | -1 | -1 | -1 | -1 | -1 | -1 | 22 | -1 | 23 | 1 | 6 | -1 | 15 | -1 |
| -1 | -1 | -1 | -1 | -1 | -1 | -1 | -1 | 23 | -1 | 21 | -1 | 17 | -1 | -1 | 0 | -1 | -1 | -1 | -1 | -1 | -1 | -1 | -1 |
| -1 | -1 | -1 | -1 | -1 | -1 | -1 | -1 | -1 | 26 | -1 | 18 | -1 | 4 | 4 | -1 | -1 | -1 | -1 | -1 | -1 | -1 | -1 | -1 |
| -1 | -1 | -1 | -1 | 16 | -1 | -1 | 10 | -1 | -1 | -1 | -1 | 16 | -1 | 23 | -1 | -1 | -1 | -1 | -1 | -1 | 12 | 22 | -1 |
| -1 | -1 | -1 | -1 | -1 | 5 | 22 | -1 | -1 | -1 | -1 | -1 | -1 | 19 | -1 | 22 | -1 | -1 | -1 | -1 | 9 | -1 | -1 | 21 |
| -1 | -1 | 5 | -1 | -1 | -1 | -1 | 1 | -1 | -1 | 22 | -1 | -1 | -1 | -1 | 5 | -1 | -1 | 12 | -1 | -1 | -1 | 23 | -1 |
| -1 | -1 | -1 | 23 | -1 | -1 | 17 | -1 | -1 | -1 | -1 | 13 | -1 | -1 | 0 | -1 | -1 | -1 | -1 | 1 | -1 | -1 | -1 | 9 |

| 13 | | 14 | | 15 | | 16 | | 17 | | 18 | | 19 | | 20 | | 21 | | 22 | | 23 | | 24 | |
|---|---|---|---|---|---|---|---|---|---|---|---|---|---|---|---|---|---|---|---|---|---|---|---|
| a | b | a | b | a | b | a | b | a | b | a | b | a | b | a | b | a | b | a | b | a | b | a | b |
| -1 | -1 | -1 | -1 | -1 | -1 | -1 | -1 | -1 | -1 | 22 | -1 | -1 | 4 | -1 | 17 | -1 | -1 | -1 | 13 | -1 | 15 | -1 | 21 |
| -1 | -1 | -1 | -1 | -1 | -1 | -1 | -1 | -1 | -1 | -1 | 12 | 19 | -1 | 24 | -1 | -1 | -1 | 22 | -1 | 6 | -1 | 0 | -1 |
| -1 | -1 | -1 | -1 | -1 | -1 | -1 | -1 | 10 | -1 | 25 | -1 | 25 | -1 | -1 | -1 | -1 | -1 | -1 | -1 | -1 | -1 | -1 | -1 |
| -1 | -1 | -1 | -1 | -1 | -1 | -1 | -1 | -1 | 26 | -1 | 26 | -1 | 8 | -1 | -1 | -1 | -1 | -1 | -1 | -1 | -1 | -1 | -1 |
| -1 | 21 | -1 | -1 | -1 | -1 | -1 | -1 | -1 | 20 | -1 | -1 | -1 | -1 | -1 | -1 | 9 | -1 | -1 | 19 | -1 | -1 | -1 | -1 |
| 26 | -1 | -1 | -1 | -1 | -1 | -1 | -1 | 14 | -1 | -1 | -1 | -1 | -1 | -1 | -1 | -1 | 11 | 14 | -1 | -1 | -1 | -1 | -1 |
| -1 | -1 | -1 | -1 | -1 | 10 | -1 | -1 | -1 | 16 | -1 | -1 | -1 | 6 | -1 | -1 | -1 | 3 | -1 | -1 | -1 | -1 | -1 | -1 |
| -1 | -1 | -1 | -1 | 8 | -1 | -1 | -1 | 21 | -1 | -1 | -1 | 3 | -1 | -1 | -1 | 16 | -1 | -1 | -1 | -1 | -1 | -1 | -1 |
| 24 | -1 | 24 | -1 | 22 | -1 | 17 | -1 | -1 | -1 | -1 | -1 | -1 | -1 | -1 | -1 | -1 | -1 | -1 | -1 | -1 | -1 | -1 | -1 |
| -1 | 10 | -1 | 9 | -1 | 25 | -1 | 27 | -1 | -1 | -1 | -1 | -1 | -1 | -1 | -1 | -1 | -1 | -1 | -1 | -1 | -1 | -1 | -1 |
| 21 | -1 | -1 | 27 | -1 | 6 | -1 | 18 | -1 | -1 | -1 | -1 | -1 | -1 | -1 | -1 | -1 | 23 | -1 | 20 | 20 | -1 | -1 | 11 |
| -1 | 11 | 25 | -1 | 14 | -1 | 14 | -1 | -1 | -1 | -1 | -1 | -1 | -1 | -1 | -1 | 18 | -1 | 5 | -1 | -1 | 6 | 4 | -1 |
| -1 | -1 | -1 | -1 | -1 | -1 | 15 | -1 | -1 | -1 | -1 | -1 | -1 | -1 | 0 | -1 | -1 | -1 | -1 | -1 | -1 | 4 | -1 | -1 |
| -1 | -1 | -1 | -1 | -1 | -1 | -1 | 11 | -1 | -1 | -1 | -1 | -1 | -1 | -1 | 25 | -1 | -1 | -1 | -1 | 19 | -1 | -1 | -1 |
| -1 | -1 | 13 | -1 | -1 | -1 | -1 | -1 | -1 | -1 | 17 | -1 | -1 | -1 | 26 | -1 | -1 | -1 | 0 | -1 | -1 | -1 | 25 | -1 |
| -1 | -1 | -1 | 13 | -1 | -1 | -1 | -1 | -1 | -1 | -1 | 1 | -1 | -1 | -1 | 15 | -1 | -1 | -1 | 5 | -1 | -1 | -1 | 8 |

FROM FIG. 15A

| 25 | | 26 | | 27 | | 28 | | 29 | | 30 | | 31 | | 32 | | 33 | | 34 | | 35 | | 36 | |
|---|---|---|---|---|---|---|---|---|---|---|---|---|---|---|---|---|---|---|---|---|---|---|---|
| a | b | a | b | a | b | a | b | a | b | a | b | a | b | a | b | a | b | a | b | a | b | a | b |
| -1 | -1 | -1 | -1 | -1 | -1 | -1 | -1 | -1 | -1 | -1 | -1 | -1 | -1 | -1 | -1 | -1 | -1 | 1 | -1 | -1 | -1 | -1 | 2 |
| -1 | -1 | -1 | -1 | -1 | -1 | -1 | -1 | -1 | -1 | -1 | -1 | -1 | -1 | -1 | -1 | -1 | -1 | -1 | 13 | -1 | -1 | 9 | -1 |
| -1 | -1 | -1 | -1 | 2 | -1 | 18 | -1 | -1 | -1 | -1 | -1 | -1 | -1 | -1 | -1 | 19 | -1 | -1 | -1 | 27 | -1 | -1 | 3 |
| -1 | -1 | -1 | -1 | -1 | 5 | -1 | 25 | -1 | -1 | -1 | -1 | -1 | -1 | -1 | -1 | -1 | 4 | -1 | -1 | -1 | 7 | 11 | -1 |
| 17 | -1 | 25 | -1 | -1 | -1 | -1 | -1 | -1 | -1 | 23 | -1 | -1 | -1 | -1 | -1 | 6 | -1 | 10 | -1 | -1 | -1 | -1 | -1 |
| -1 | 16 | -1 | 17 | -1 | -1 | -1 | -1 | -1 | -1 | -1 | 18 | -1 | -1 | -1 | -1 | -1 | 16 | -1 | 26 | -1 | -1 | -1 | -1 |
| 6 | -1 | -1 | -1 | -1 | -1 | -1 | -1 | 16 | -1 | -1 | -1 | -1 | -1 | -1 | -1 | -1 | 17 | -1 | -1 | 13 | -1 | -1 | -1 |
| -1 | 26 | -1 | -1 | -1 | -1 | -1 | -1 | -1 | 19 | -1 | -1 | -1 | -1 | -1 | -1 | 7 | -1 | -1 | -1 | -1 | 13 | -1 | -1 |
| -1 | 15 | 17 | -1 | -1 | 13 | 1 | -1 | 1 | -1 | -1 | 9 | 23 | -1 | -1 | 8 | -1 | -1 | -1 | -1 | -1 | -1 | -1 | -1 |
| 16 | -1 | -1 | 16 | 27 | -1 | -1 | 9 | -1 | 15 | 7 | -1 | -1 | 3 | 12 | -1 | -1 | -1 | -1 | -1 | -1 | -1 | -1 | -1 |
| -1 | -1 | -1 | -1 | -1 | -1 | -1 | -1 | -1 | 17 | -1 | -1 | 24 | -1 | -1 | 3 | -1 | -1 | -1 | -1 | -1 | -1 | -1 | -1 |
| -1 | -1 | -1 | -1 | -1 | -1 | -1 | -1 | 7 | -1 | -1 | -1 | -1 | 2 | 17 | -1 | -1 | -1 | -1 | -1 | -1 | -1 | -1 | -1 |
| -1 | -1 | -1 | -1 | 3 | -1 | -1 | -1 | -1 | -1 | -1 | -1 | 0 | -1 | -1 | -1 | -1 | -1 | -1 | -1 | 1 | -1 | 10 | -1 |
| -1 | -1 | -1 | -1 | -1 | 0 | -1 | -1 | -1 | -1 | -1 | -1 | -1 | 24 | -1 | -1 | -1 | -1 | -1 | -1 | -1 | 1 | -1 | 23 |
| -1 | -1 | -1 | 26 | -1 | -1 | -1 | 21 | -1 | -1 | -1 | -1 | -1 | -1 | -1 | 27 | -1 | -1 | -1 | 27 | -1 | -1 | -1 | -1 |
| -1 | -1 | 16 | -1 | -1 | -1 | 8 | -1 | -1 | -1 | -1 | -1 | -1 | -1 | 6 | -1 | -1 | -1 | 18 | -1 | -1 | -1 | -1 | -1 |

| 1500a |  | Wr | 37 a | 37 b | 38 a | 38 b | 39 a | 39 b | 40 a | 40 b | 41 a | 41 b | 42 a | 42 b | 43 a | 43 b | 44 a | 44 b | 45 a | 45 b | 46 a | 46 b | 47 a | 47 b | 48 a | 48 b |
|---|---|---|---|---|---|---|---|---|---|---|---|---|---|---|---|---|---|---|---|---|---|---|---|---|---|---|
| 1 | a | 20 | -1 | -1 | -1 | 27 | 6 | -1 | 12 | -1 | 0 | -1 | -1 | -1 | -1 | -1 | -1 | -1 | -1 | -1 | -1 | -1 | -1 | -1 | -1 | -1 |
|  | b | 20 | -1 | -1 | 26 | -1 | -1 | 12 | -1 | 13 | -1 | 0 | -1 | -1 | -1 | -1 | -1 | -1 | -1 | -1 | -1 | -1 | -1 | -1 | -1 | -1 |
| 2 | a | 18 | -1 | -1 | -1 | -1 | -1 | -1 | -1 | -1 | 0 | -1 | 0 | -1 | -1 | -1 | -1 | -1 | -1 | -1 | -1 | -1 | -1 | -1 | -1 | -1 |
|  | b | 18 | -1 | -1 | -1 | -1 | -1 | -1 | -1 | -1 | -1 | 0 | -1 | 0 | -1 | -1 | -1 | -1 | -1 | -1 | -1 | -1 | -1 | -1 | -1 | -1 |
| 3 | a | 18 | 1 | -1 | -1 | -1 | -1 | -1 | -1 | -1 | -1 | -1 | 0 | -1 | 0 | -1 | -1 | -1 | -1 | -1 | -1 | -1 | -1 | -1 | -1 | -1 |
|  | b | 18 | -1 | 27 | -1 | -1 | -1 | -1 | -1 | -1 | -1 | -1 | -1 | 0 | -1 | 0 | -1 | -1 | -1 | -1 | -1 | -1 | -1 | -1 | -1 | -1 |
| 4 | a | 18 | -1 | 6 | -1 | -1 | 10 | -1 | -1 | -1 | -1 | -1 | -1 | -1 | 0 | -1 | 0 | -1 | -1 | -1 | -1 | -1 | -1 | -1 | -1 | -1 |
|  | b | 18 | 9 | -1 | -1 | -1 | -1 | 15 | -1 | -1 | -1 | -1 | -1 | -1 | -1 | 0 | -1 | 0 | -1 | -1 | -1 | -1 | -1 | -1 | -1 | -1 |
| 5 | a | 18 | -1 | -1 | -1 | -1 | -1 | -1 | -1 | -1 | -1 | -1 | -1 | -1 | -1 | -1 | 0 | -1 | 0 | -1 | -1 | -1 | -1 | -1 | -1 | -1 |
|  | b | 18 | -1 | -1 | -1 | -1 | -1 | -1 | -1 | -1 | -1 | -1 | -1 | -1 | -1 | -1 | -1 | 0 | -1 | 0 | -1 | -1 | -1 | -1 | -1 | -1 |
| 6 | a | 20 | 13 | -1 | -1 | 24 | 25 | -1 | -1 | -1 | -1 | -1 | -1 | -1 | -1 | -1 | -1 | -1 | 0 | -1 | 0 | -1 | -1 | -1 | -1 | -1 |
|  | b | 20 | -1 | 14 | 15 | -1 | -1 | 0 | -1 | -1 | -1 | -1 | -1 | -1 | -1 | -1 | -1 | -1 | -1 | 0 | -1 | 0 | -1 | -1 | -1 | -1 |
| 7 | a | 17 | -1 | -1 | -1 | -1 | -1 | -1 | -1 | 4 | -1 | 22 | -1 | -1 | -1 | -1 | -1 | -1 | -1 | -1 | 0 | -1 | 0 | -1 | -1 | -1 |
|  | b | 17 | -1 | -1 | -1 | -1 | -1 | -1 | 21 | -1 | 2 | -1 | -1 | -1 | -1 | -1 | -1 | -1 | -1 | -1 | -1 | 0 | -1 | 0 | -1 | -1 |
| 8 | a | 20 | -1 | -1 | 21 | -1 | -1 | -1 | 13 | -1 | -1 | -1 | -1 | 26 | -1 | -1 | -1 | -1 | -1 | -1 | -1 | -1 | 0 | -1 | 12 | -1 |
|  | b | 20 | -1 | -1 | -1 | 5 | -1 | -1 | -1 | 3 | -1 | -1 | 4 | -1 | -1 | -1 | -1 | -1 | -1 | -1 | -1 | -1 | -1 | 0 | -1 | 3 |

FROM FIG. 15C

| 1 | | 2 | | 3 | | 4 | | 5 | | 6 | | 7 | | 8 | | 9 | | 10 | | 11 | | 12 | |
|---|---|---|---|---|---|---|---|---|---|---|---|---|---|---|---|---|---|---|---|---|---|---|---|
| a | b | a | b | a | b | a | b | a | b | a | b | a | b | a | b | a | b | a | b | a | b | a | b |
| 8 | -1 | -1 | -1 | -1 | 23 | -1 | -1 | -1 | -1 | -1 | -1 | 19 | -1 | -1 | -1 | -1 | -1 | -1 | -1 | -1 | -1 | -1 | -1 |
| -1 | 20 | -1 | -1 | 19 | -1 | -1 | -1 | -1 | -1 | -1 | -1 | -1 | 20 | -1 | -1 | -1 | -1 | -1 | -1 | -1 | -1 | -1 | -1 |
| -1 | -1 | 5 | -1 | -1 | -1 | -1 | -1 | -1 | -1 | 22 | -1 | -1 | -1 | -1 | -1 | -1 | -1 | 12 | -1 | -1 | -1 | -1 | -1 |
| -1 | -1 | -1 | 23 | -1 | -1 | -1 | -1 | -1 | -1 | -1 | 13 | -1 | -1 | -1 | -1 | -1 | -1 | -1 | 1 | -1 | -1 | -1 | -1 |
| 24 | -1 | -1 | 14 | -1 | -1 | -1 | -1 | -1 | -1 | -1 | -1 | -1 | -1 | -1 | -1 | -1 | -1 | 4 | -1 | -1 | 24 | -1 | -1 |
| -1 | 9 | 25 | -1 | -1 | -1 | -1 | -1 | -1 | -1 | -1 | -1 | -1 | -1 | -1 | -1 | -1 | -1 | -1 | 0 | 25 | -1 | -1 | -1 |
| -1 | -1 | -1 | -1 | 7 | -1 | -1 | 20 | -1 | -1 | -1 | -1 | -1 | -1 | -1 | -1 | -1 | -1 | -1 | -1 | -1 | -1 | -1 | 10 |
| -1 | -1 | -1 | -1 | -1 | 19 | 20 | -1 | -1 | -1 | -1 | -1 | -1 | -1 | -1 | -1 | -1 | -1 | -1 | -1 | -1 | -1 | 2 | -1 |
| -1 | -1 | -1 | -1 | -1 | -1 | -1 | -1 | 21 | -1 | -1 | -1 | -1 | -1 | -1 | -1 | -1 | 18 | -1 | -1 | 4 | -1 | -1 | -1 |
| -1 | -1 | -1 | -1 | -1 | -1 | -1 | -1 | -1 | 16 | -1 | -1 | -1 | -1 | -1 | -1 | 4 | -1 | -1 | -1 | -1 | 4 | -1 | -1 |
| -1 | -1 | -1 | -1 | -1 | -1 | -1 | -1 | -1 | -1 | -1 | -1 | -1 | -1 | -1 | -1 | -1 | -1 | -1 | -1 | -1 | 22 | -1 | -1 |
| -1 | -1 | -1 | -1 | -1 | -1 | -1 | -1 | -1 | -1 | -1 | -1 | -1 | -1 | -1 | -1 | -1 | -1 | -1 | -1 | 6 | -1 | -1 | -1 |
| -1 | -1 | -1 | -1 | -1 | -1 | -1 | -1 | -1 | -1 | -1 | -1 | -1 | -1 | -1 | -1 | -1 | 25 | -1 | 16 | -1 | -1 | -1 | -1 |
| -1 | -1 | -1 | -1 | -1 | -1 | -1 | -1 | -1 | -1 | -1 | -1 | -1 | -1 | -1 | -1 | 22 | -1 | 23 | -1 | -1 | -1 | -1 | -1 |
| -1 | -1 | -1 | -1 | -1 | -1 | -1 | -1 | -1 | -1 | -1 | -1 | -1 | -1 | -1 | 5 | -1 | -1 | -1 | -1 | -1 | -1 | 23 | -1 |

FROM FIG. 17A-1

| 13 | | 14 | | 15 | | 16 | | 17 | | 18 | | 19 | | 20 | | 21 | | 22 | | 23 | | 24 | |
|---|---|---|---|---|---|---|---|---|---|---|---|---|---|---|---|---|---|---|---|---|---|---|---|
| a | b | a | b | a | b | a | b | a | b | a | b | a | b | a | b | a | b | a | b | a | b | a | b |
| -1 | -1 | -1 | -1 | -1 | -1 | -1 | -1 | -1 | 16 | -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | 21 | -1 | -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | -1 | 17 | -1 | -1 | -1 | -1 | -1 | -1 | -1 | -1 | -1 | -1 | -1 | 25 | -1 |
| -1 | -1 | -1 | -1 | -1 | -1 | -1 | -1 | -1 | -1 | -1 | 1 | -1 | -1 | -1 | -1 | -1 | -1 | -1 | -1 | -1 | -1 | -1 | 8 |
| -1 | -1 | -1 | -1 | -1 | -1 | -1 | -1 | -1 | -1 | -1 | -1 | 25 | -1 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | 8 | -1 | -1 | -1 | -1 | -1 | -1 | -1 | -1 | -1 | -1 |
| -1 | -1 | -1 | -1 | -1 | -1 | -1 | -1 | 10 | -1 | 25 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | 26 | -1 | 26 | -1 | -1 | -1 | -1 | -1 | -1 | -1 | -1 | -1 | -1 | -1 | -1 |
| -1 | -1 | -1 | -1 | -1 | 10 | -1 | -1 | -1 | -1 | -1 | -1 | -1 | 6 | -1 | -1 | -1 | 3 | -1 | -1 | -1 | -1 | -1 | -1 |
| -1 | -1 | -1 | -1 | 8 | -1 | -1 | -1 | -1 | -1 | -1 | -1 | 3 | -1 | -1 | -1 | 16 | -1 | -1 | -1 | -1 | -1 | -1 | -1 |
| -1 | -1 | -1 | -1 | 22 | -1 | 17 | -1 | -1 | -1 | -1 | -1 | -1 | -1 | -1 | -1 | -1 | -1 | -1 | -1 | -1 | -1 | -1 | -1 |
| -1 | -1 | -1 | -1 | -1 | 25 | -1 | 27 | -1 | -1 | -1 | -1 | -1 | -1 | -1 | -1 | -1 | -1 | -1 | -1 | -1 | -1 | -1 | -1 |
| 24 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 |
| -1 | 10 | -1 | -1 | -1 | -1 | -1 | -1 | -1 | -1 | -1 | -1 | -1 | -1 | -1 | -1 | -1 | -1 | -1 | -1 | -1 | -1 | -1 | -1 |
| -1 | -1 | 13 | -1 | -1 | -1 | -1 | -1 | -1 | -1 | -1 | -1 | -1 | -1 | 26 | -1 | -1 | -1 | -1 | -1 | -1 | -1 | -1 | -1 |

FROM FIG. 17A-1

| | | | | | | | | | | | | | | | | | | | | | | | |
|---|---|---|---|---|---|---|---|---|---|---|---|---|---|---|---|---|---|---|---|---|---|---|---|
| -1 | -1 | -1 | -1 | -1 | -1 | -1 | -1 | -1 | -1 | -1 | -1 | -1 | -1 | 0 | -1 | -1 | -1 | -1 | -1 | -1 | -1 | -1 | 9 |
| -1 | -1 | 14 | -1 | -1 | -1 | -1 | -1 | 0 | -1 | -1 | -1 | -1 | -1 | -1 | -1 | -1 | -1 | -1 | -1 | -1 | -1 | -1 | -1 |
| -1 | -1 | -1 | 11 | -1 | -1 | -1 | -1 | -1 | 21 | -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | -1 | 10 | -1 | -1 | -1 | -1 | -1 | -1 | -1 | -1 | 19 | -1 | -1 | -1 | -1 |
| -1 | -1 | -1 | -1 | -1 | -1 | -1 | -1 | -1 | -1 | -1 | 11 | -1 | -1 | -1 | -1 | -1 | -1 | 17 | -1 | -1 | -1 | -1 | -1 |
| -1 | -1 | -1 | -1 | -1 | -1 | -1 | 10 | -1 | -1 | -1 | -1 | -1 | -1 | -1 | -1 | -1 | -1 | -1 | -1 | -1 | -1 | 22 | -1 |
| -1 | -1 | -1 | -1 | -1 | -1 | 22 | -1 | -1 | -1 | -1 | -1 | -1 | -1 | -1 | -1 | -1 | -1 | -1 | -1 | -1 | -1 | -1 | 21 |
| -1 | -1 | -1 | -1 | 16 | -1 | -1 | -1 | -1 | -1 | -1 | -1 | 16 | -1 | -1 | -1 | -1 | -1 | -1 | -1 | -1 | -1 | -1 | -1 |
| -1 | -1 | -1 | -1 | -1 | 5 | -1 | -1 | -1 | -1 | -1 | -1 | -1 | 19 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | 17 | -1 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | 4 | -1 | -1 | -1 | -1 | -1 | -1 | -1 | -1 | -1 | -1 |
| -1 | -1 | -1 | 0 | -1 | -1 | -1 | -1 | -1 | -1 | -1 | 19 | -1 | -1 | -1 | -1 | -1 | -1 | -1 | -1 | -1 | -1 | -1 | -1 |
| -1 | -1 | 17 | -1 | -1 | -1 | -1 | -1 | -1 | -1 | 4 | -1 | -1 | -1 | -1 | -1 | -1 | -1 | -1 | -1 | -1 | -1 | -1 | -1 |
| -1 | 27 | -1 | -1 | 24 | -1 | -1 | 24 | -1 | 20 | -1 | -1 | -1 | -1 | -1 | 15 | -1 | -1 | -1 | -1 | -1 | -1 | -1 | -1 |

FROM FIG. 17A-2

FROM FIG. 17A-3

| | | | | | | | | | | | | | | | | | | | | | | | |
|---|---|---|---|---|---|---|---|---|---|---|---|---|---|---|---|---|---|---|---|---|---|---|---|
| -1 | -1 | -1 | 13 | -1 | -1 | -1 | -1 | -1 | -1 | -1 | -1 | -1 | -1 | -1 | 15 | -1 | -1 | -1 | -1 | -1 | -1 | -1 | -1 |
| -1 | 21 | -1 | -1 | -1 | -1 | -1 | -1 | -1 | -1 | -1 | -1 | -1 | -1 | -1 | -1 | 9 | -1 | -1 | -1 | -1 | -1 | -1 | -1 |
| 26 | -1 | -1 | -1 | -1 | -1 | -1 | -1 | -1 | -1 | -1 | -1 | -1 | -1 | -1 | -1 | -1 | 11 | -1 | -1 | -1 | -1 | -1 | -1 |
| -1 | -1 | -1 | -1 | -1 | -1 | -1 | -1 | -1 | 20 | -1 | -1 | -1 | -1 | -1 | -1 | -1 | -1 | -1 | 19 | -1 | -1 | -1 | -1 |
| -1 | -1 | -1 | -1 | -1 | -1 | -1 | -1 | 14 | -1 | -1 | -1 | -1 | -1 | -1 | -1 | -1 | -1 | 14 | -1 | -1 | -1 | -1 | -1 |
| -1 | -1 | -1 | -1 | -1 | -1 | -1 | -1 | -1 | -1 | -1 | -1 | -1 | -1 | 0 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 | -1 | 25 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 | -1 | -1 | -1 | -1 | -1 | -1 | -1 | 4 | -1 | -1 |
| -1 | -1 | -1 | -1 | -1 | -1 | -1 | -1 | -1 | -1 | -1 | -1 | -1 | -1 | -1 | -1 | -1 | -1 | -1 | -1 | 19 | -1 | -1 | -1 |
| 21 | -1 | -1 | -1 | -1 | 6 | -1 | 18 | -1 | -1 | -1 | -1 | -1 | -1 | -1 | -1 | -1 | -1 | -1 | -1 | -1 | -1 | -1 | 11 |
| -1 | 11 | -1 | -1 | 14 | -1 | 14 | -1 | -1 | -1 | -1 | -1 | -1 | -1 | -1 | -1 | -1 | -1 | -1 | -1 | -1 | -1 | 4 | -1 |
| -1 | -1 | -1 | 27 | -1 | -1 | -1 | -1 | -1 | -1 | -1 | -1 | -1 | -1 | -1 | -1 | -1 | 23 | -1 | -1 | -1 | -1 | -1 | -1 |
| -1 | -1 | 25 | -1 | -1 | -1 | -1 | -1 | -1 | -1 | -1 | -1 | -1 | -1 | -1 | -1 | 18 | -1 | -1 | -1 | -1 | -1 | -1 | -1 |
| -1 | -1 | -1 | -1 | -1 | -1 | -1 | -1 | -1 | -1 | 22 | -1 | -1 | -1 | -1 | -1 | -1 | -1 | -1 | -1 | -1 | 15 | -1 | 21 |
| -1 | -1 | -1 | -1 | -1 | -1 | -1 | -1 | -1 | -1 | -1 | 12 | -1 | -1 | -1 | -1 | -1 | -1 | -1 | -1 | 6 | -1 | 0 | -1 |
| -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 |

| | | | | | | | | | | | | | | | | | | | | | | | |
|---|---|---|---|---|---|---|---|---|---|---|---|---|---|---|---|---|---|---|---|---|---|---|---|
| 17 | -1 | -1 | -1 | -1 | 21 | 7 | -1 | 12 | -1 | -1 | -1 | -1 | -1 | 2 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | 14 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | 18 | -1 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 | -1 | -1 | 2 | -1 | -1 | -1 | -1 | -1 | -1 | -1 |
| -1 | -1 | -1 | -1 | -1 | -1 | -1 | -1 | -1 | -1 | -1 | -1 | -1 | -1 | -1 | -1 | -1 | 4 | -1 | -1 | -1 | -1 | -1 | -1 |
| -1 | 18 | -1 | -1 | -1 | -1 | -1 | -1 | -1 | -1 | -1 | -1 | -1 | -1 | -1 | -1 | 6 | -1 | -1 | -1 | -1 | -1 | -1 | -1 |
| 14 | -1 | -1 | -1 | -1 | -1 | -1 | -1 | -1 | -1 | -1 | -1 | -1 | -1 | -1 | -1 | -1 | 23 | -1 | -1 | -1 | -1 | -1 | -1 |
| -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | 13 |
| -1 | -1 | -1 | -1 | -1 | -1 | -1 | -1 | -1 | -1 | -1 | -1 | -1 | -1 | -1 | -1 | -1 | -1 | -1 | -1 | -1 | -1 | 15 | -1 |
| -1 | -1 | -1 | -1 | -1 | -1 | -1 | -1 | 23 | -1 | 21 | -1 | -1 | -1 | -1 | 0 | -1 | -1 | -1 | -1 | -1 | -1 | -1 | -1 |
| -1 | -1 | -1 | -1 | -1 | -1 | -1 | -1 | -1 | 26 | -1 | 18 | -1 | -1 | 4 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 | 23 | -1 | -1 | -1 | -1 | -1 | -1 | 12 | -1 | -1 |
| -1 | -1 | -1 | -1 | -1 | -1 | -1 | -1 | -1 | -1 | -1 | -1 | -1 | -1 | -1 | 22 | -1 | -1 | -1 | -1 | 9 | -1 | -1 | -1 |
| -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 |
| -1 | -1 | -1 | -1 | -1 | -1 | 17 | -1 | -1 | -1 | -1 | -1 | -1 | -1 | -1 | -1 | -1 | -1 | -1 | -1 | -1 | -1 | -1 | -1 |

FIG. 17A-5

FROM FIG. 17A-4

| | | | | | | | | | | | | | | | | | | | | | | | |
|---|---|---|---|---|---|---|---|---|---|---|---|---|---|---|---|---|---|---|---|---|---|---|---|
| -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | 4 | -1 | 17 | -1 | -1 | -1 | 13 | -1 | -1 | -1 | -1 |
| -1 | -1 | -1 | -1 | -1 | -1 | -1 | -1 | -1 | -1 | -1 | -1 | 19 | -1 | 24 | -1 | -1 | -1 | 22 | -1 | -1 | -1 | -1 | -1 |
| -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 |
| -1 | -1 | 24 | -1 | -1 | -1 | -1 | -1 | -1 | -1 | -1 | -1 | -1 | -1 | -1 | -1 | -1 | -1 | -1 | -1 | -1 | -1 | -1 | -1 |
| -1 | -1 | -1 | 9 | -1 | -1 | -1 | -1 | -1 | -1 | -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 | -1 | -1 | -1 | -1 | -1 | 20 | 20 | -1 | -1 | -1 |
| -1 | -1 | -1 | -1 | -1 | -1 | -1 | -1 | -1 | -1 | -1 | -1 | -1 | -1 | -1 | -1 | -1 | -1 | 5 | -1 | -1 | 6 | -1 | -1 |
| -1 | -1 | -1 | -1 | -1 | -1 | 15 | -1 | -1 | -1 | -1 | -1 | -1 | -1 | -1 | -1 | -1 | -1 | -1 | -1 | -1 | -1 | -1 | -1 |
| -1 | -1 | -1 | -1 | -1 | -1 | -1 | 11 | -1 | -1 | -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 | -1 | -1 | -1 | -1 | 0 | -1 | -1 | -1 | -1 | -1 |
| -1 | -1 | -1 | -1 | -1 | -1 | -1 | -1 | -1 | -1 | -1 | -1 | -1 | -1 | -1 | -1 | -1 | -1 | -1 | 5 | -1 | -1 | -1 | -1 |

FROM FIG. 17A-5

| 25 | | 26 | | 27 | | 28 | | 29 | | 30 | | 31 | | 32 | | 33 | | 34 | | 35 | | 36 | |
|---|---|---|---|---|---|---|---|---|---|---|---|---|---|---|---|---|---|---|---|---|---|---|---|
| a | b | b | a | a | b | a | b | a | b | b | a | a | b | b | a | a | b | a | b | a | b | a | b |
| 6 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 |
| -1 | 26 | -1 | -1 | -1 | -1 | -1 | -1 | -1 | -1 | -1 | -1 | -1 | -1 | -1 | -1 | -1 | -1 | -1 | -1 | -1 | -1 | -1 | -1 |
| -1 | -1 | 26 | -1 | -1 | -1 | -1 | -1 | -1 | -1 | -1 | -1 | -1 | -1 | -1 | -1 | -1 | -1 | -1 | -1 | -1 | -1 | -1 | -1 |
| -1 | -1 | -1 | 16 | -1 | -1 | -1 | -1 | -1 | -1 | -1 | -1 | -1 | -1 | -1 | -1 | -1 | -1 | -1 | -1 | -1 | -1 | -1 | -1 |
| -1 | -1 | -1 | -1 | 2 | -1 | -1 | -1 | -1 | -1 | -1 | -1 | -1 | -1 | -1 | -1 | -1 | -1 | -1 | -1 | -1 | -1 | -1 | -1 |
| -1 | -1 | -1 | -1 | -1 | 5 | -1 | -1 | -1 | -1 | -1 | -1 | -1 | -1 | -1 | -1 | -1 | -1 | -1 | -1 | -1 | -1 | -1 | -1 |
| -1 | -1 | -1 | -1 | -1 | -1 | 18 | -1 | -1 | -1 | -1 | -1 | -1 | -1 | -1 | -1 | -1 | -1 | -1 | -1 | -1 | -1 | -1 | -1 |
| -1 | -1 | -1 | -1 | -1 | -1 | -1 | 25 | -1 | -1 | -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | 16 | -1 | -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | 19 | -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | -1 | 9 | -1 | -1 | -1 | -1 | -1 | -1 | -1 | -1 | -1 | -1 | -1 | -1 | -1 |
| -1 | -1 | -1 | -1 | -1 | -1 | -1 | 9 | -1 | 15 | -1 | 7 | -1 | -1 | -1 | -1 | -1 | -1 | -1 | -1 | -1 | -1 | -1 | -1 |
| -1 | 15 | -1 | -1 | -1 | 13 | -1 | -1 | -1 | -1 | -1 | -1 | 23 | -1 | -1 | -1 | -1 | -1 | -1 | -1 | -1 | -1 | -1 | -1 |
| 16 | -1 | -1 | -1 | 27 | -1 | -1 | -1 | -1 | -1 | -1 | -1 | -1 | 3 | -1 | -1 | -1 | -1 | -1 | -1 | -1 | -1 | -1 | -1 |
| -1 | -1 | -1 | -1 | -1 | -1 | -1 | 21 | -1 | -1 | -1 | -1 | -1 | -1 | 27 | -1 | -1 | -1 | -1 | -1 | -1 | -1 | -1 | -1 |

| | | 37 | | 38 | | 39 | | 40 | | 41 | | 42 | | 43 | | 44 | | 45 | | 46 | | 47 | | 48 | | Wr |
|---|---|---|---|---|---|---|---|---|---|---|---|---|---|---|---|---|---|---|---|---|---|---|---|---|---|---|
| | | a | b | b | a | a | b | a | b | a | b | a | b | a | b | a | b | a | b | a | b | a | b | a | b | |
| 4-2 | a | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | 5 |
| | b | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | 5 |
| 8-2 | a | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | 6 |
| | b | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | 6 |
| 2-2 | a | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | 6 |
| | b | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | 6 |
| 2-2 | a | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | 6 |
| | b | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | 6 |
| 4-1 | a | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | 7 |
| | b | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | 7 |
| 5-2 | a | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | 6 |
| | b | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | 6 |
| 5-1 | a | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | 6 |
| | b | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | 6 |
| 8-1 | a | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | 6 |

TO FIG. 17B-4

FROM FIG. 17B-1

FIG. 17B-3

FROM FIG. 17B-1

| | | | | | | | | | | | | | | | | | | | | | | | |
|---|---|---|---|---|---|---|---|---|---|---|---|---|---|---|---|---|---|---|---|---|---|---|---|
| -1 | -1 | -1 | -1 | -1 | -1 | 8 | -1 | -1 | -1 | -1 | -1 | -1 | -1 | -1 | 6 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 | -1 | -1 | 6 | -1 | -1 | -1 | -1 | -1 | -1 | -1 |
| -1 | -1 | -1 | -1 | -1 | -1 | -1 | -1 | -1 | -1 | -1 | -1 | -1 | -1 | -1 | -1 | -1 | 16 | -1 | -1 | -1 | -1 | -1 | -1 |
| 17 | -1 | -1 | -1 | -1 | -1 | -1 | -1 | -1 | -1 | -1 | -1 | -1 | -1 | -1 | -1 | -1 | -1 | 10 | -1 | -1 | -1 | -1 | -1 |
| -1 | 16 | -1 | -1 | -1 | -1 | -1 | -1 | -1 | -1 | -1 | -1 | -1 | -1 | -1 | -1 | -1 | -1 | -1 | 26 | -1 | -1 | -1 | -1 |
| -1 | -1 | -1 | -1 | 3 | -1 | -1 | -1 | -1 | -1 | -1 | -1 | -1 | -1 | -1 | -1 | -1 | -1 | -1 | -1 | 1 | -1 | -1 | -1 |
| -1 | -1 | -1 | -1 | -1 | 0 | -1 | -1 | -1 | -1 | -1 | -1 | -1 | -1 | -1 | -1 | -1 | -1 | -1 | -1 | -1 | 1 | -1 | -1 |
| -1 | -1 | -1 | -1 | -1 | -1 | -1 | -1 | -1 | -1 | -1 | -1 | 0 | -1 | -1 | -1 | -1 | -1 | -1 | -1 | -1 | -1 | 10 | -1 |
| -1 | -1 | -1 | -1 | -1 | -1 | -1 | -1 | -1 | -1 | -1 | -1 | -1 | 24 | -1 | -1 | -1 | -1 | -1 | -1 | -1 | -1 | -1 | 23 |
| -1 | -1 | -1 | -1 | -1 | -1 | -1 | -1 | -1 | 17 | -1 | -1 | 24 | -1 | -1 | -1 | -1 | -1 | -1 | -1 | -1 | -1 | -1 | -1 |
| -1 | -1 | -1 | -1 | -1 | -1 | -1 | -1 | 7 | -1 | -1 | -1 | -1 | 2 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 | 3 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 | -1 | 17 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | 2 |
| -1 | -1 | -1 | -1 | -1 | -1 | -1 | -1 | -1 | -1 | -1 | -1 | -1 | -1 | -1 | -1 | -1 | -1 | -1 | -1 | -1 | -1 | 9 | -1 |
| -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 |

FROM FIG. 17B-2

| | | | | | | | | | | | | | | | | | | | | | | | | | | |
|---|---|---|---|---|---|---|---|---|---|---|---|---|---|---|---|---|---|---|---|---|---|---|---|---|---|---|
| -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | b | 8-1 | 6 |
| -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | a | 3-2 | 5 |
| -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | b | | 5 |
| -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | a | 3-1 | 6 |
| -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | b | | 6 |
| -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | a | 7-2 | 5 |
| -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | b | | 5 |
| -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | a | 7-1 | 5 |
| -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | b | | 5 |
| 13 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | a | 6-2 | 7 |
| -1 | 14 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | b | | 7 |
| -1 | -1 | 24 | -1 | -1 | -1 | -1 | -1 | -1 | -1 | -1 | -1 | -1 | -1 | -1 | -1 | -1 | -1 | -1 | -1 | -1 | -1 | -1 | -1 | a | 6-1 | 5 |
| -1 | -1 | -1 | 15 | -1 | -1 | -1 | -1 | -1 | -1 | -1 | -1 | -1 | -1 | -1 | -1 | -1 | -1 | -1 | -1 | -1 | -1 | -1 | -1 | b | | 5 |
| -1 | -1 | 27 | -1 | 6 | -1 | -1 | -1 | -1 | -1 | -1 | -1 | -1 | -1 | -1 | -1 | -1 | -1 | -1 | -1 | -1 | -1 | -1 | -1 | a | 1-2 | 8 |
| -1 | -1 | -1 | 26 | -1 | 12 | -1 | -1 | -1 | -1 | -1 | -1 | -1 | -1 | -1 | -1 | -1 | -1 | -1 | -1 | -1 | -1 | -1 | -1 | b | | 8 |
| -1 | -1 | -1 | -1 | -1 | -1 | 12 | -1 | -1 | -1 | -1 | -1 | -1 | -1 | -1 | -1 | -1 | -1 | -1 | -1 | -1 | -1 | -1 | -1 | a | 1-1 | 6 |

TO FIG. 17B-6

FROM FIG. 17B-3

FROM FIG. 17B-3

| | | | | | | | | | | | | | | | | | | | | | | | |
|---|---|---|---|---|---|---|---|---|---|---|---|---|---|---|---|---|---|---|---|---|---|---|---|
| -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 | -1 | -1 | -1 | -1 | -1 | 13 | -1 | -1 | -1 | -1 |
| -1 | -1 | -1 | -1 | -1 | -1 | -1 | -1 | -1 | -1 | -1 | -1 | -1 | -1 | -1 | -1 | 19 | -1 | -1 | -1 | 27 | -1 | -1 | 3 |
| -1 | -1 | -1 | -1 | -1 | -1 | -1 | -1 | -1 | -1 | -1 | -1 | -1 | -1 | -1 | -1 | -1 | 4 | -1 | -1 | -1 | 7 | 11 | -1 |
| -1 | -1 | -1 | 25 | -1 | -1 | -1 | -1 | -1 | -1 | -1 | 23 | -1 | -1 | -1 | -1 | -1 | -1 | -1 | -1 | -1 | -1 | -1 | -1 |
| -1 | -1 | 17 | -1 | -1 | -1 | -1 | -1 | -1 | -1 | 18 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 | -1 | -1 | -1 | 17 | -1 | -1 | 13 | -1 | -1 | -1 |
| -1 | -1 | -1 | -1 | -1 | -1 | -1 | -1 | -1 | -1 | -1 | -1 | -1 | -1 | -1 | -1 | 7 | -1 | -1 | -1 | -1 | 13 | -1 | -1 |
| -1 | -1 | -1 | 17 | -1 | -1 | -1 | -1 | -1 | -1 | -1 | -1 | -1 | -1 | 8 | -1 | -1 | -1 | -1 | -1 | -1 | -1 | -1 | -1 |
| -1 | -1 | 16 | -1 | -1 | -1 | -1 | -1 | -1 | -1 | -1 | -1 | -1 | -1 | -1 | 12 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 | -1 | -1 | -1 | -1 | -1 | 27 | -1 | -1 | -1 | -1 |
| -1 | -1 | -1 | -1 | -1 | -1 | -1 | -1 | -1 | -1 | -1 | -1 | -1 | -1 | -1 | -1 | -1 | -1 | 18 | -1 | -1 | -1 | -1 | -1 |

FROM FIG. 17B-4

FROM FIG. 17B-5

| | | | | | | | | | | | | | | | | | | | | | | | | | | |
|---|---|---|---|---|---|---|---|---|---|---|---|---|---|---|---|---|---|---|---|---|---|---|---|---|---|---|
| -1 | -1 | -1 | -1 | -1 | -1 | -1 | 13 | -1 | -1 | -1 | -1 | -1 | -1 | -1 | -1 | -1 | -1 | -1 | -1 | -1 | -1 | -1 | -1 | b | 1-1 | 6 |
| -1 | -1 | -1 | -1 | -1 | -1 | -1 | -1 | 0 | -1 | -1 | -1 | -1 | -1 | -1 | -1 | -1 | -1 | -1 | -1 | -1 | -1 | -1 | -1 | a | 1-0 | 6 |
| -1 | -1 | -1 | -1 | -1 | -1 | -1 | -1 | -1 | 0 | -1 | -1 | -1 | -1 | -1 | -1 | -1 | -1 | -1 | -1 | -1 | -1 | -1 | -1 | b | | 6 |
| -1 | -1 | -1 | -1 | -1 | -1 | -1 | -1 | 0 | -1 | 0 | -1 | -1 | -1 | -1 | -1 | -1 | -1 | -1 | -1 | -1 | -1 | -1 | -1 | a | 2-0 | 6 |
| -1 | -1 | -1 | -1 | -1 | -1 | -1 | -1 | -1 | 0 | -1 | 0 | -1 | -1 | -1 | -1 | -1 | -1 | -1 | -1 | -1 | -1 | -1 | -1 | b | | 6 |
| -1 | -1 | -1 | -1 | -1 | -1 | -1 | -1 | -1 | -1 | 0 | -1 | 0 | -1 | -1 | -1 | -1 | -1 | -1 | -1 | -1 | -1 | -1 | -1 | a | 3-0 | 7 |
| -1 | 27 | -1 | -1 | -1 | -1 | -1 | -1 | -1 | -1 | -1 | 0 | -1 | 0 | -1 | -1 | -1 | -1 | -1 | -1 | -1 | -1 | -1 | -1 | b | | 7 |
| -1 | 6 | -1 | -1 | 10 | -1 | -1 | -1 | -1 | -1 | -1 | -1 | 0 | -1 | 0 | -1 | -1 | -1 | -1 | -1 | -1 | -1 | -1 | -1 | a | 4-0 | 6 |
| 9 | -1 | -1 | -1 | -1 | 15 | -1 | -1 | -1 | -1 | -1 | -1 | -1 | 0 | -1 | 0 | -1 | -1 | -1 | -1 | -1 | -1 | -1 | -1 | b | | 6 |
| -1 | -1 | -1 | -1 | -1 | -1 | -1 | -1 | -1 | -1 | -1 | -1 | -1 | -1 | 0 | -1 | 0 | -1 | -1 | -1 | -1 | -1 | -1 | -1 | a | 5-0 | 6 |
| -1 | -1 | -1 | -1 | -1 | -1 | -1 | -1 | -1 | -1 | -1 | -1 | -1 | -1 | -1 | 0 | -1 | 0 | -1 | -1 | -1 | -1 | -1 | -1 | b | | 6 |
| -1 | -1 | -1 | -1 | 25 | -1 | -1 | -1 | -1 | -1 | -1 | -1 | -1 | -1 | -1 | -1 | 0 | -1 | 0 | -1 | -1 | -1 | -1 | -1 | a | 6-0 | 8 |
| -1 | -1 | -1 | -1 | -1 | 0 | -1 | -1 | -1 | -1 | -1 | -1 | -1 | -1 | -1 | -1 | -1 | 0 | -1 | 0 | -1 | -1 | -1 | -1 | b | | 8 |
| -1 | -1 | -1 | -1 | -1 | -1 | -1 | 4 | -1 | 22 | -1 | -1 | -1 | -1 | -1 | -1 | -1 | -1 | 0 | -1 | 0 | -1 | -1 | -1 | a | 7-0 | 7 |
| -1 | -1 | -1 | -1 | -1 | -1 | 21 | -1 | 2 | -1 | -1 | -1 | -1 | -1 | -1 | -1 | -1 | -1 | -1 | 0 | -1 | 0 | -1 | -1 | b | | 7 |
| -1 | -1 | -1 | 21 | -1 | -1 | 13 | -1 | -1 | -1 | -1 | 26 | -1 | -1 | -1 | -1 | -1 | -1 | -1 | -1 | 0 | -1 | 12 | -1 | a | 8-0 | 8 |
| -1 | -1 | 5 | -1 | -1 | -1 | -1 | 3 | -1 | -1 | 4 | -1 | -1 | -1 | -1 | -1 | -1 | -1 | -1 | -1 | -1 | 0 | -1 | 3 | b | | 8 |

| RATE-2/3 | | | | | | | | | | | | | | | | | | | | | | | | |
|---|---|---|---|---|---|---|---|---|---|---|---|---|---|---|---|---|---|---|---|---|---|---|---|---|
| 1 | | 2 | | 3 | | 4 | | 5 | | 6 | | 7 | | 8 | | 9 | | 10 | | 11 | | 12 | | 13 |
| a | b | a | b | a | b | a | b | a | b | a | b | a | b | a | b | a | b | a | b | a | b | a | b | a |
| -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | 24 |
| -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | 0 | -1 | -1 | -1 | -1 | -1 | -1 | -1 | 6 | -1 | -1 | 19 | -1 | -1 | -1 | -1 | -1 |
| -1 | -1 | -1 | -1 | -1 | -1 | -1 | -1 | -1 | 21 | -1 | -1 | -1 | -1 | -1 | -1 | -1 | 23 | 17 | -1 | -1 | -1 | -1 | -1 | 26 |
| 24 | -1 | -1 | -1 | -1 | -1 | -1 | -1 | -1 | -1 | -1 | -1 | -1 | -1 | -1 | -1 | 2 | -1 | 4 | -1 | -1 | -1 | -1 | 10 | -1 |
| -1 | 9 | -1 | -1 | -1 | -1 | -1 | -1 | -1 | -1 | -1 | -1 | -1 | -1 | -1 | -1 | -1 | 4 | -1 | 0 | -1 | -1 | 2 | -1 | -1 |
| -1 | -1 | -1 | -1 | -1 | -1 | -1 | 10 | -1 | -1 | -1 | -1 | -1 | -1 | -1 | -1 | -1 | -1 | -1 | -1 | -1 | 12 | 22 | -1 | -1 |
| -1 | -1 | -1 | -1 | -1 | -1 | 22 | -1 | -1 | -1 | -1 | -1 | -1 | -1 | -1 | -1 | -1 | -1 | -1 | -1 | 9 | -1 | -1 | 21 | -1 |
| -1 | -1 | -1 | -1 | -1 | 23 | -1 | -1 | -1 | -1 | -1 | -1 | 19 | -1 | -1 | -1 | -1 | -1 | -1 | -1 | 4 | -1 | -1 | -1 | -1 |
| -1 | -1 | -1 | -1 | 19 | -1 | -1 | -1 | -1 | -1 | -1 | -1 | -1 | 20 | -1 | -1 | -1 | -1 | -1 | -1 | -1 | 4 | -1 | -1 | -1 |
| -1 | -1 | -1 | -1 | -1 | -1 | -1 | -1 | -1 | -1 | 21 | -1 | 17 | -1 | -1 | -1 | -1 | -1 | -1 | -1 | -1 | -1 | -1 | -1 | 21 |
| -1 | -1 | -1 | -1 | -1 | -1 | -1 | -1 | -1 | -1 | -1 | 18 | -1 | 4 | -1 | -1 | -1 | -1 | -1 | -1 | -1 | -1 | -1 | -1 | -1 |
| -1 | 27 | -1 | 0 | -1 | -1 | -1 | -1 | -1 | 20 | -1 | 19 | -1 | 14 | -1 | 15 | -1 | -1 | -1 | -1 | -1 | -1 | -1 | -1 | -1 |
| 17 | -1 | 17 | -1 | -1 | -1 | -1 | -1 | 12 | -1 | 4 | -1 | 18 | -1 | 2 | -1 | -1 | -1 | -1 | -1 | -1 | -1 | -1 | -1 | -1 |

FROM FIG. 18A

TO FIG. 18C

RATE-2/3

| 13 | 14 | | 15 | | 16 | | 17 | | 18 | | 19 | | 20 | | 21 | | 22 | | 23 | | 24 | | 25 | |
|---|---|---|---|---|---|---|---|---|---|---|---|---|---|---|---|---|---|---|---|---|---|---|---|---|
| b | a | b | a | b | a | b | a | b | a | b | a | b | a | b | a | b | a | b | a | b | a | b | a | b |
| -1 | 24 | -1 | 22 | -1 | 17 | -1 | -1 | -1 | -1 | -1 | -1 | -1 | -1 | -1 | -1 | -1 | -1 | -1 | -1 | -1 | -1 | -1 | -1 | -1 |
| 10 | -1 | 9 | -1 | 25 | -1 | 27 | -1 | -1 | -1 | -1 | -1 | -1 | -1 | -1 | -1 | -1 | -1 | -1 | -1 | -1 | -1 | -1 | -1 | -1 |
| 21 | -1 | -1 | -1 | -1 | -1 | -1 | -1 | -1 | -1 | -1 | -1 | -1 | -1 | -1 | 9 | -1 | -1 | 19 | -1 | -1 | -1 | -1 | -1 | -1 |
| -1 | -1 | -1 | -1 | -1 | -1 | -1 | -1 | -1 | -1 | -1 | -1 | -1 | -1 | -1 | -1 | 11 | 14 | -1 | -1 | -1 | -1 | -1 | -1 | -1 |
| -1 | -1 | -1 | -1 | -1 | -1 | -1 | -1 | -1 | -1 | -1 | 25 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | 8 | -1 | -1 | -1 | -1 | -1 | -1 | -1 | -1 | -1 | -1 | -1 | -1 |
| -1 | -1 | -1 | -1 | -1 | 15 | -1 | -1 | -1 | -1 | -1 | -1 | -1 | 0 | -1 | -1 | -1 | -1 | -1 | -1 | -1 | -1 | -1 | -1 | -1 |
| -1 | -1 | -1 | -1 | -1 | -1 | 11 | -1 | -1 | -1 | -1 | -1 | -1 | -1 | 25 | -1 | -1 | -1 | -1 | -1 | -1 | -1 | -1 | -1 | -1 |
| -1 | -1 | -1 | -1 | 10 | -1 | -1 | -1 | -1 | -1 | -1 | -1 | 6 | -1 | -1 | -1 | 3 | -1 | -1 | -1 | -1 | -1 | -1 | 6 | -1 |
| -1 | -1 | -1 | 8 | -1 | -1 | -1 | -1 | -1 | -1 | -1 | 3 | -1 | -1 | -1 | 16 | -1 | -1 | -1 | -1 | -1 | -1 | -1 | -1 | 26 |
| -1 | -1 | -1 | -1 | 6 | -1 | 18 | -1 | -1 | -1 | -1 | -1 | -1 | -1 | -1 | -1 | 23 | -1 | -1 | 20 | -1 | -1 | -1 | -1 | -1 |
| 11 | -1 | -1 | 14 | -1 | 14 | -1 | -1 | -1 | -1 | -1 | -1 | -1 | -1 | -1 | 18 | -1 | -1 | -1 | -1 | 6 | -1 | -1 | -1 | -1 |
| -1 | -1 | -1 | -1 | -1 | -1 | -1 | -1 | -1 | 22 | -1 | -1 | -1 | -1 | -1 | -1 | -1 | -1 | -1 | -1 | 15 | -1 | -1 | -1 | -1 |
| -1 | -1 | -1 | -1 | -1 | -1 | -1 | -1 | -1 | -1 | 12 | -1 | -1 | -1 | -1 | -1 | -1 | -1 | -1 | 6 | -1 | -1 | -1 | -1 | -1 |

FROM FIG. 18B

TO FIG. 18D

RATE-2/3

| 26 | | 27 | | 28 | | 29 | | 30 | | 31 | | 32 | | 33 | | 34 | | 35 | | 36 | | 37 | | 38 |
|---|---|---|---|---|---|---|---|---|---|---|---|---|---|---|---|---|---|---|---|---|---|---|---|---|
| a | b | a | b | a | b | a | b | a | b | a | b | b | a | a | b | a | b | a | b | a | b | b | a | b |
| -1 | -1 | -1 | 13 | -1 | -1 | -1 | -1 | -1 | 9 | 23 | -1 | 8 | -1 | -1 | -1 | -1 | -1 | -1 | -1 | -1 | -1 | -1 | -1 | -1 |
| -1 | -1 | 27 | -1 | -1 | -1 | -1 | 15 | 7 | -1 | -1 | 3 | -1 | 17 | -1 | -1 | -1 | -1 | -1 | -1 | -1 | -1 | -1 | -1 | -1 |
| 25 | -1 | -1 | -1 | -1 | -1 | -1 | -1 | 23 | -1 | -1 | -1 | -1 | -1 | 6 | -1 | 10 | -1 | -1 | -1 | -1 | -1 | -1 | -1 | -1 |
| -1 | 17 | -1 | -1 | -1 | -1 | -1 | -1 | -1 | 18 | -1 | -1 | -1 | -1 | -1 | 16 | -1 | 26 | -1 | -1 | -1 | -1 | -1 | -1 | -1 |
| -1 | -1 | 2 | -1 | 18 | -1 | -1 | -1 | -1 | -1 | -1 | -1 | -1 | -1 | 19 | -1 | -1 | -1 | 27 | -1 | -1 | -1 | -1 | -1 | -1 |
| -1 | -1 | -1 | 5 | -1 | 25 | -1 | -1 | -1 | -1 | -1 | -1 | -1 | -1 | -1 | 4 | -1 | -1 | -1 | 7 | -1 | -1 | -1 | -1 | -1 |
| -1 | -1 | -1 | -1 | -1 | -1 | -1 | -1 | -1 | -1 | 0 | -1 | -1 | -1 | -1 | -1 | -1 | -1 | -1 | -1 | 10 | -1 | -1 | -1 | -1 |
| -1 | -1 | -1 | -1 | -1 | -1 | -1 | -1 | -1 | -1 | -1 | 24 | -1 | -1 | -1 | -1 | -1 | -1 | -1 | -1 | -1 | 23 | -1 | -1 | -1 |
| -1 | -1 | -1 | -1 | -1 | -1 | 16 | -1 | -1 | -1 | -1 | -1 | -1 | -1 | -1 | -1 | -1 | -1 | -1 | -1 | -1 | -1 | 6 | -1 | -1 |
| -1 | -1 | -1 | -1 | -1 | -1 | -1 | 19 | -1 | -1 | -1 | -1 | -1 | -1 | -1 | -1 | -1 | -1 | -1 | -1 | -1 | -1 | -1 | 9 | -1 |
| -1 | -1 | -1 | -1 | -1 | -1 | -1 | -1 | -1 | -1 | 24 | -1 | 3 | -1 | -1 | -1 | -1 | -1 | -1 | -1 | -1 | -1 | -1 | -1 | 24 |
| -1 | -1 | -1 | -1 | -1 | -1 | -1 | -1 | -1 | -1 | -1 | 2 | -1 | 17 | -1 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | 27 |
| -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 |

FROM FIG. 18C

| RATE-2/3 | | | | | | | | | | | | | | | | | | | | | | | |
|---|---|---|---|---|---|---|---|---|---|---|---|---|---|---|---|---|---|---|---|---|---|---|---|
| 38 | 39 | | 40 | | 41 | | 42 | | 43 | | 44 | | 45 | | 46 | | 47 | | 48 | | | | |
| a | a | b | a | b | a | b | a | b | a | b | a | b | a | b | a | b | a | b | a | b | | | Wr |
| -1 | -1 | -1 | -1 | -1 | -1 | -1 | -1 | -1 | -1 | -1 | -1 | -1 | -1 | -1 | -1 | -1 | -1 | -1 | -1 | -1 | a | 5-1 | 9 |
| -1 | -1 | -1 | -1 | -1 | -1 | -1 | -1 | -1 | -1 | -1 | -1 | -1 | -1 | -1 | -1 | -1 | -1 | -1 | -1 | -1 | b | | 9 |
| -1 | -1 | -1 | -1 | -1 | -1 | -1 | -1 | -1 | -1 | -1 | -1 | -1 | -1 | -1 | -1 | -1 | -1 | -1 | -1 | -1 | a | 3-1 | 10 |
| -1 | -1 | -1 | -1 | -1 | -1 | -1 | -1 | -1 | -1 | -1 | -1 | -1 | -1 | -1 | -1 | -1 | -1 | -1 | -1 | -1 | b | | 10 |
| -1 | -1 | -1 | -1 | -1 | -1 | -1 | -1 | -1 | -1 | -1 | -1 | -1 | -1 | -1 | -1 | -1 | -1 | -1 | -1 | -1 | a | 2-1 | 9 |
| -1 | -1 | -1 | -1 | -1 | -1 | -1 | -1 | -1 | -1 | -1 | -1 | -1 | -1 | -1 | -1 | -1 | -1 | -1 | -1 | -1 | b | | 9 |
| -1 | -1 | -1 | -1 | -1 | -1 | -1 | -1 | -1 | -1 | -1 | -1 | -1 | -1 | -1 | -1 | -1 | -1 | -1 | -1 | -1 | a | 7-1 | 8 |
| -1 | -1 | -1 | -1 | -1 | -1 | -1 | -1 | -1 | -1 | -1 | -1 | -1 | -1 | -1 | -1 | -1 | -1 | -1 | -1 | -1 | b | | 8 |
| -1 | -1 | -1 | -1 | -1 | -1 | -1 | -1 | -1 | -1 | -1 | -1 | -1 | -1 | -1 | -1 | -1 | -1 | -1 | -1 | -1 | a | 4-1 | 9 |
| -1 | -1 | -1 | -1 | -1 | -1 | -1 | -1 | -1 | -1 | -1 | -1 | -1 | -1 | -1 | -1 | -1 | -1 | -1 | -1 | -1 | b | | 9 |
| -1 | -1 | -1 | -1 | -1 | -1 | -1 | -1 | -1 | -1 | -1 | -1 | -1 | -1 | -1 | -1 | -1 | -1 | -1 | -1 | -1 | a | 6-1 | 10 |
| 15 | -1 | -1 | -1 | -1 | -1 | -1 | -1 | -1 | -1 | -1 | -1 | -1 | -1 | -1 | -1 | -1 | -1 | -1 | -1 | -1 | b | | 10 |
| -1 | 6 | -1 | -1 | -1 | -1 | -1 | -1 | -1 | -1 | -1 | -1 | -1 | -1 | -1 | -1 | -1 | -1 | -1 | -1 | -1 | a | 1-1 | 10 |
| 26 | -1 | 12 | -1 | -1 | -1 | -1 | -1 | -1 | -1 | -1 | -1 | -1 | -1 | -1 | -1 | -1 | -1 | -1 | -1 | -1 | b | | 10 |

FROM FIG. 18A

| | | | | | | | | | | | | | | | | | | | | | | | | |
|---|---|---|---|---|---|---|---|---|---|---|---|---|---|---|---|---|---|---|---|---|---|---|---|---|
| -1 | -1 | -1 | -1 | -1 | -1 | -1 | -1 | -1 | -1 | -1 | -1 | -1 | -1 | -1 | 5 | -1 | -1 | -1 | -1 | -1 | -1 | -1 | -1 | -1 |
| -1 | -1 | -1 | -1 | -1 | -1 | 17 | -1 | -1 | -1 | -1 | -1 | -1 | -1 | 0 | -1 | -1 | -1 | -1 | -1 | -1 | -1 | -1 | -1 | -1 |
| -1 | -1 | -1 | -1 | 24 | -1 | -1 | 24 | -1 | -1 | -1 | -1 | -1 | -1 | -1 | -1 | -1 | -1 | -1 | -1 | -1 | -1 | -1 | -1 | -1 |
| -1 | -1 | -1 | -1 | -1 | 21 | 7 | -1 | -1 | -1 | -1 | -1 | -1 | -1 | -1 | -1 | -1 | -1 | -1 | -1 | -1 | -1 | -1 | -1 | -1 |
| -1 | -1 | -1 | 14 | 7 | -1 | -1 | 20 | -1 | -1 | -1 | -1 | -1 | -1 | -1 | -1 | -1 | -1 | -1 | -1 | -1 | 24 | -1 | -1 | -1 |
| -1 | -1 | 25 | -1 | -1 | 19 | 20 | -1 | -1 | -1 | -1 | -1 | -1 | -1 | -1 | -1 | -1 | -1 | -1 | -1 | 25 | -1 | -1 | -1 | -1 |
| -1 | 18 | 14 | -1 | -1 | -1 | -1 | -1 | -1 | -1 | 10 | -1 | -1 | -1 | -1 | -1 | -1 | -1 | -1 | -1 | -1 | -1 | -1 | -1 | -1 |
| 14 | -1 | -1 | 11 | -1 | -1 | -1 | -1 | -1 | -1 | -1 | 11 | -1 | -1 | -1 | -1 | -1 | -1 | -1 | -1 | -1 | -1 | -1 | -1 | -1 |
| 8 | -1 | -1 | -1 | -1 | -1 | -1 | -1 | 21 | -1 | -1 | -1 | -1 | -1 | -1 | -1 | -1 | 18 | -1 | -1 | -1 | -1 | -1 | -1 | -1 |
| -1 | 20 | -1 | -1 | -1 | -1 | -1 | -1 | -1 | 16 | -1 | -1 | -1 | -1 | -1 | -1 | 4 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 | -1 | -1 | -1 | 25 | -1 | 16 | -1 | 22 | -1 | 13 | -1 |
| -1 | -1 | -1 | -1 | -1 | -1 | -1 | -1 | -1 | -1 | -1 | -1 | -1 | -1 | -1 | -1 | 22 | -1 | 23 | -1 | 6 | -1 | 15 | -1 | -1 |
| -1 | -1 | -1 | -1 | -1 | -1 | -1 | -1 | 23 | -1 | -1 | -1 | -1 | -1 | -1 | 0 | -1 | -1 | -1 | -1 | -1 | -1 | -1 | -1 | -1 |
| -1 | -1 | -1 | -1 | -1 | -1 | -1 | -1 | -1 | 26 | -1 | -1 | -1 | -1 | 4 | -1 | -1 | -1 | -1 | -1 | -1 | -1 | -1 | -1 | -1 |
| -1 | -1 | -1 | -1 | 16 | -1 | -1 | -1 | -1 | -1 | -1 | -1 | 16 | -1 | 23 | -1 | -1 | -1 | -1 | -1 | -1 | -1 | -1 | -1 | -1 |
| -1 | -1 | -1 | -1 | -1 | 5 | -1 | -1 | -1 | -1 | -1 | -1 | -1 | 19 | -1 | 22 | -1 | -1 | -1 | -1 | -1 | -1 | -1 | -1 | -1 |
| -1 | -1 | 5 | -1 | -1 | -1 | -1 | -1 | -1 | -1 | 22 | -1 | -1 | -1 | -1 | -1 | -1 | -1 | 12 | -1 | -1 | -1 | 23 | -1 | -1 |
| -1 | -1 | -1 | 23 | -1 | -1 | -1 | -1 | -1 | -1 | -1 | 13 | -1 | -1 | -1 | -1 | -1 | -1 | -1 | -1 | -1 | -1 | -1 | 9 | -1 |

FROM FIG. 18B

FROM FIG. 18E

| | | | | | | | | | | | | | | | | | | | | | | | | |
|---|---|---|---|---|---|---|---|---|---|---|---|---|---|---|---|---|---|---|---|---|---|---|---|---|
| -1 | 13 | -1 | -1 | -1 | -1 | -1 | -1 | -1 | 17 | -1 | -1 | -1 | 26 | -1 | -1 | -1 | 0 | -1 | -1 | -1 | -1 | -1 | -1 | -1 |
| -1 | -1 | 13 | -1 | -1 | -1 | -1 | -1 | -1 | -1 | -1 | -1 | -1 | -1 | 15 | -1 | -1 | -1 | 5 | -1 | -1 | -1 | -1 | -1 | -1 |
| -1 | -1 | -1 | -1 | -1 | -1 | -1 | -1 | -1 | -1 | -1 | -1 | 4 | -1 | 17 | -1 | -1 | -1 | 13 | -1 | -1 | -1 | 21 | -1 | -1 |
| -1 | -1 | -1 | -1 | -1 | -1 | -1 | -1 | -1 | -1 | -1 | 19 | -1 | 24 | -1 | -1 | -1 | 22 | -1 | -1 | -1 | 0 | -1 | -1 | -1 |
| -1 | -1 | -1 | -1 | -1 | -1 | -1 | 10 | -1 | 25 | -1 | -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | 26 | -1 | 26 | -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | 20 | -1 | -1 | -1 | -1 | -1 | -1 | -1 | -1 | -1 | -1 | -1 | -1 | -1 | -1 | 17 | -1 |
| -1 | -1 | -1 | -1 | -1 | -1 | -1 | 14 | -1 | -1 | -1 | -1 | -1 | -1 | -1 | -1 | -1 | -1 | -1 | -1 | -1 | -1 | -1 | -1 | 16 |
| -1 | -1 | -1 | -1 | -1 | -1 | -1 | -1 | 16 | -1 | -1 | -1 | -1 | -1 | -1 | -1 | -1 | -1 | -1 | -1 | -1 | -1 | -1 | -1 | -1 |
| -1 | -1 | -1 | -1 | -1 | -1 | -1 | 21 | -1 | -1 | -1 | -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | 15 |
| -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | 16 | -1 |
| -1 | -1 | 27 | -1 | -1 | -1 | -1 | -1 | -1 | -1 | -1 | -1 | -1 | -1 | -1 | -1 | -1 | -1 | 20 | -1 | -1 | -1 | 11 | -1 | -1 |
| -1 | 25 | -1 | -1 | -1 | -1 | -1 | -1 | -1 | -1 | -1 | -1 | -1 | -1 | -1 | -1 | -1 | 5 | -1 | -1 | -1 | 4 | -1 | -1 | -1 |
| -1 | -1 | -1 | -1 | -1 | -1 | -1 | -1 | -1 | -1 | -1 | -1 | -1 | -1 | -1 | -1 | -1 | -1 | -1 | -1 | 4 | -1 | -1 | -1 | -1 |
| -1 | -1 | -1 | -1 | -1 | -1 | -1 | -1 | -1 | -1 | -1 | -1 | -1 | -1 | -1 | -1 | -1 | -1 | -1 | 19 | -1 | -1 | -1 | -1 | -1 |
| -1 | -1 | -1 | -1 | -1 | -1 | -1 | -1 | -1 | -1 | -1 | -1 | -1 | -1 | -1 | -1 | -1 | -1 | -1 | -1 | -1 | 25 | -1 | -1 | -1 |
| -1 | -1 | -1 | -1 | -1 | -1 | -1 | -1 | -1 | -1 | -1 | -1 | -1 | -1 | -1 | -1 | -1 | -1 | -1 | -1 | -1 | -1 | 8 | -1 | -1 |

FROM FIG. 18C

| | | | | | | | | | | | | | | | | | | | | | | | | |
|---|---|---|---|---|---|---|---|---|---|---|---|---|---|---|---|---|---|---|---|---|---|---|---|---|
| -1 | 26 | -1 | -1 | -1 | -1 | -1 | -1 | -1 | -1 | -1 | -1 | -1 | -1 | -1 | -1 | -1 | 27 | -1 | -1 | -1 | -1 | -1 | -1 | -1 |
| 16 | -1 | -1 | -1 | -1 | -1 | -1 | -1 | -1 | -1 | -1 | -1 | -1 | -1 | -1 | -1 | 18 | -1 | -1 | -1 | -1 | -1 | -1 | -1 | 5 |
| -1 | -1 | -1 | -1 | -1 | -1 | -1 | -1 | -1 | -1 | -1 | -1 | -1 | -1 | -1 | -1 | -1 | -1 | -1 | -1 | -1 | 2 | -1 | -1 | -1 |
| -1 | -1 | -1 | -1 | -1 | -1 | -1 | -1 | -1 | -1 | -1 | -1 | -1 | -1 | -1 | -1 | -1 | 13 | -1 | -1 | 9 | -1 | -1 | -1 | -1 |
| -1 | -1 | -1 | -1 | -1 | -1 | -1 | -1 | -1 | -1 | -1 | -1 | -1 | -1 | -1 | -1 | -1 | -1 | -1 | -1 | -1 | 3 | -1 | -1 | -1 |
| -1 | -1 | -1 | -1 | -1 | -1 | -1 | -1 | -1 | -1 | -1 | -1 | -1 | -1 | -1 | -1 | -1 | -1 | -1 | -1 | 11 | -1 | -1 | -1 | -1 |
| -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | 1 | -1 |
| -1 | -1 | -1 | -1 | -1 | -1 | -1 | -1 | -1 | -1 | -1 | -1 | -1 | -1 | -1 | -1 | -1 | -1 | -1 | -1 | -1 | -1 | 27 | -1 | -1 |
| -1 | -1 | -1 | -1 | -1 | -1 | -1 | -1 | -1 | -1 | -1 | -1 | -1 | -1 | -1 | 17 | -1 | -1 | 13 | -1 | -1 | -1 | -1 | -1 | -1 |
| -1 | -1 | -1 | -1 | -1 | -1 | -1 | -1 | -1 | -1 | -1 | -1 | -1 | -1 | 7 | -1 | -1 | -1 | -1 | 13 | -1 | -1 | -1 | -1 | -1 |
| 17 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 |
| -1 | 16 | -1 | -1 | -1 | 9 | -1 | -1 | -1 | -1 | -1 | -1 | -1 | -1 | -1 | -1 | -1 | -1 | -1 | -1 | -1 | -1 | -1 | -1 | -1 |
| -1 | -1 | -1 | -1 | -1 | -1 | -1 | 17 | -1 | -1 | -1 | -1 | -1 | -1 | -1 | -1 | -1 | -1 | -1 | -1 | -1 | -1 | -1 | 13 | -1 |
| -1 | -1 | -1 | -1 | -1 | -1 | 7 | -1 | -1 | -1 | -1 | -1 | -1 | -1 | -1 | -1 | -1 | -1 | -1 | -1 | -1 | -1 | 14 | -1 | -1 |
| -1 | -1 | 3 | -1 | -1 | -1 | -1 | -1 | -1 | -1 | -1 | -1 | -1 | -1 | -1 | -1 | -1 | -1 | -1 | -1 | -1 | -1 | -1 | -1 | -1 |
| -1 | -1 | -1 | 0 | -1 | -1 | -1 | -1 | -1 | -1 | -1 | -1 | -1 | -1 | -1 | -1 | -1 | -1 | -1 | -1 | -1 | -1 | -1 | -1 | -1 |
| -1 | -1 | -1 | -1 | -1 | 21 | -1 | -1 | -1 | -1 | -1 | -1 | -1 | 27 | -1 | -1 | -1 | -1 | -1 | -1 | -1 | -1 | -1 | -1 | -1 |
| -1 | -1 | -1 | -1 | 8 | -1 | -1 | -1 | -1 | -1 | -1 | -1 | 6 | -1 | -1 | -1 | -1 | -1 | -1 | -1 | -1 | -1 | -1 | -1 | -1 |

FROM FIG. 18F

FROM FIG. 18D

FROM FIG. 18G

| | | | | | | | | | | | | | | | | | | | | | | | |
|---|---|---|---|---|---|---|---|---|---|---|---|---|---|---|---|---|---|---|---|---|---|---|---|
| 21 | -1 | -1 | 13 | -1 | -1 | -1 | -1 | -1 | -1 | -1 | -1 | -1 | -1 | -1 | -1 | -1 | -1 | -1 | -1 | -1 | a | 8-1 | 10 |
| -1 | -1 | -1 | -1 | 3 | -1 | -1 | -1 | -1 | -1 | -1 | -1 | -1 | -1 | -1 | -1 | -1 | -1 | -1 | -1 | -1 | b | | 10 |
| -1 | -1 | -1 | 17 | -1 | 0 | -1 | -1 | -1 | -1 | -1 | -1 | -1 | -1 | -1 | -1 | -1 | -1 | -1 | -1 | -1 | a | 1-0 | 10 |
| -1 | -1 | -1 | -1 | 13 | -1 | 0 | -1 | -1 | -1 | -1 | -1 | -1 | -1 | -1 | -1 | -1 | -1 | -1 | -1 | -1 | b | | 10 |
| -1 | -1 | -1 | -1 | -1 | 0 | -1 | 0 | -1 | -1 | -1 | -1 | -1 | -1 | -1 | -1 | -1 | -1 | -1 | -1 | -1 | a | 2-0 | 9 |
| -1 | -1 | -1 | -1 | -1 | -1 | 0 | -1 | 0 | -1 | -1 | -1 | -1 | -1 | -1 | -1 | -1 | -1 | -1 | -1 | -1 | b | | 9 |
| -1 | -1 | -1 | -1 | -1 | -1 | -1 | 0 | -1 | 0 | -1 | -1 | -1 | -1 | -1 | -1 | -1 | -1 | -1 | -1 | -1 | a | 3-0 | 8 |
| -1 | -1 | -1 | -1 | -1 | -1 | -1 | -1 | 0 | -1 | 0 | -1 | -1 | -1 | -1 | -1 | -1 | -1 | -1 | -1 | -1 | b | | 8 |
| -1 | 10 | -1 | -1 | -1 | -1 | -1 | -1 | -1 | 0 | -1 | 0 | -1 | -1 | -1 | -1 | -1 | -1 | -1 | -1 | -1 | a | 4-0 | 9 |
| -1 | -1 | 15 | -1 | -1 | -1 | -1 | -1 | -1 | -1 | 0 | -1 | 0 | -1 | -1 | -1 | -1 | -1 | -1 | -1 | -1 | b | | 9 |
| -1 | -1 | -1 | -1 | -1 | -1 | -1 | -1 | -1 | -1 | -1 | 0 | -1 | 0 | -1 | -1 | -1 | -1 | -1 | -1 | -1 | a | 5-0 | 9 |
| -1 | -1 | -1 | -1 | -1 | -1 | -1 | -1 | -1 | -1 | -1 | -1 | 0 | -1 | 0 | -1 | -1 | -1 | -1 | -1 | -1 | b | | 9 |
| -1 | 25 | -1 | -1 | -1 | -1 | -1 | -1 | -1 | -1 | -1 | -1 | -1 | 0 | -1 | 0 | -1 | -1 | -1 | -1 | -1 | a | 6-0 | 10 |
| -1 | -1 | 0 | -1 | -1 | -1 | -1 | -1 | -1 | -1 | -1 | -1 | -1 | -1 | 0 | -1 | 0 | -1 | -1 | -1 | -1 | b | | 10 |
| -1 | -1 | -1 | -1 | 4 | -1 | 22 | -1 | -1 | -1 | -1 | -1 | -1 | -1 | -1 | 0 | -1 | 0 | -1 | -1 | -1 | a | 7-0 | 9 |
| -1 | -1 | -1 | 21 | -1 | 2 | -1 | -1 | -1 | -1 | -1 | -1 | -1 | -1 | -1 | -1 | 0 | -1 | 0 | -1 | -1 | b | | 9 |
| -1 | -1 | -1 | -1 | -1 | -1 | -1 | -1 | 26 | -1 | -1 | -1 | -1 | -1 | -1 | -1 | -1 | 0 | -1 | 12 | -1 | a | 8-0 | 10 |
| -1 | -1 | -1 | -1 | -1 | -1 | -1 | 4 | -1 | -1 | -1 | -1 | -1 | -1 | -1 | -1 | -1 | -1 | 0 | -1 | 3 | b | | 10 |

RATE-2/3

| 1 | | 2 | | 3 | | 4 | | 5 | | 6 | | 7 | | 8 | | 9 | | 10 | | 11 | | 12 | | 13 |
|---|---|---|---|---|---|---|---|---|---|---|---|---|---|---|---|---|---|---|---|---|---|---|---|---|
| a | b | a | b | a | b | a | b | a | b | a | b | a | b | a | b | a | b | a | b | a | b | a | b | a |
| -1 | -1 | -1 | -1 | 16 | -1 | -1 | -1 | -1 | -1 | -1 | -1 | -1 | -1 | -1 | -1 | -1 | -1 | -1 | -1 | -1 | -1 | 22 | -1 | -1 |
| -1 | -1 | -1 | -1 | -1 | 5 | -1 | -1 | -1 | -1 | -1 | -1 | -1 | -1 | -1 | -1 | -1 | -1 | -1 | -1 | -1 | -1 | -1 | 21 | 26 |
| -1 | -1 | -1 | 14 | -1 | -1 | -1 | -1 | -1 | -1 | 21 | -1 | 17 | -1 | -1 | -1 | -1 | -1 | -1 | -1 | -1 | -1 | -1 | 10 | -1 |
| -1 | -1 | 25 | -1 | -1 | -1 | -1 | -1 | -1 | -1 | -1 | 18 | -1 | 4 | -1 | -1 | -1 | -1 | -1 | -1 | -1 | -1 | 2 | -1 | -1 |
| -1 | -1 | -1 | 0 | -1 | -1 | -1 | -1 | -1 | -1 | -1 | 19 | -1 | -1 | -1 | 15 | -1 | -1 | -1 | -1 | -1 | -1 | -1 | -1 | 24 |
| -1 | -1 | 17 | -1 | -1 | -1 | -1 | -1 | -1 | -1 | 4 | -1 | -1 | -1 | 2 | -1 | -1 | -1 | -1 | -1 | -1 | -1 | -1 | -1 | -1 |
| -1 | -1 | 5 | -1 | -1 | -1 | -1 | -1 | -1 | -1 | -1 | -1 | 19 | -1 | -1 | -1 | -1 | -1 | -1 | -1 | -1 | -1 | -1 | -1 | -1 |
| -1 | -1 | -1 | 23 | -1 | -1 | -1 | -1 | -1 | -1 | -1 | -1 | -1 | 20 | -1 | -1 | -1 | -1 | -1 | -1 | -1 | -1 | -1 | -1 | -1 |
| -1 | 27 | -1 | -1 | 24 | -1 | -1 | 24 | -1 | 20 | -1 | -1 | -1 | 14 | -1 | -1 | -1 | -1 | -1 | -1 | -1 | -1 | -1 | -1 | -1 |
| 17 | -1 | -1 | -1 | -1 | 21 | 7 | -1 | 12 | -1 | -1 | -1 | 18 | -1 | -1 | -1 | -1 | -1 | -1 | -1 | -1 | -1 | -1 | -1 | -1 |

FROM FIG. 19A

RATE-2/3

| 13 | 14 | | 15 | | 16 | | 17 | | 18 | | 19 | | 20 | | 21 | | 22 | | 23 | | 24 | | 25 | |
|---|---|---|---|---|---|---|---|---|---|---|---|---|---|---|---|---|---|---|---|---|---|---|---|---|
| b | a | b | a | b | a | b | a | b | a | b | a | b | a | b | a | b | a | b | a | b | a | b | a | b |
| 21 | -1 | -1 | -1 | -1 | 15 | -1 | -1 | 20 | -1 | -1 | -1 | -1 | -1 | -1 | 9 | -1 | -1 | -1 | -1 | -1 | -1 | -1 | 17 | -1 |
| -1 | -1 | -1 | -1 | -1 | -1 | 11 | 14 | -1 | -1 | -1 | -1 | -1 | -1 | -1 | -1 | 11 | -1 | -1 | -1 | -1 | -1 | -1 | -1 | 16 |
| -1 | -1 | 27 | -1 | -1 | -1 | -1 | -1 | -1 | -1 | -1 | 25 | -1 | -1 | -1 | -1 | -1 | -1 | 20 | -1 | -1 | -1 | -1 | -1 | -1 |
| -1 | 25 | -1 | -1 | -1 | -1 | -1 | -1 | -1 | -1 | -1 | -1 | 8 | -1 | -1 | -1 | -1 | 5 | -1 | -1 | -1 | -1 | -1 | -1 | -1 |
| -1 | 24 | -1 | -1 | -1 | -1 | -1 | -1 | -1 | -1 | -1 | -1 | 4 | -1 | -1 | -1 | -1 | -1 | -1 | -1 | -1 | -1 | 21 | -1 | -1 |
| 10 | -1 | 9 | -1 | -1 | -1 | -1 | -1 | -1 | -1 | -1 | 19 | -1 | -1 | -1 | -1 | -1 | -1 | -1 | -1 | -1 | 0 | -1 | -1 | -1 |
| -1 | 13 | -1 | -1 | -1 | -1 | -1 | -1 | -1 | -1 | -1 | -1 | -1 | -1 | -1 | -1 | -1 | -1 | -1 | -1 | -1 | 25 | -1 | -1 | -1 |
| -1 | -1 | 13 | -1 | -1 | -1 | -1 | -1 | -1 | -1 | -1 | -1 | -1 | -1 | -1 | -1 | -1 | -1 | -1 | -1 | -1 | -1 | 8 | -1 | -1 |
| -1 | -1 | -1 | -1 | -1 | -1 | -1 | -1 | -1 | 22 | -1 | -1 | -1 | -1 | 17 | -1 | -1 | -1 | 13 | -1 | 15 | -1 | -1 | -1 | -1 |
| -1 | -1 | -1 | -1 | -1 | -1 | -1 | -1 | -1 | -1 | 12 | -1 | -1 | 24 | -1 | -1 | -1 | 22 | -1 | 6 | -1 | -1 | -1 | -1 | -1 |

FROM FIG. 19B

TO FIG. 19D

RATE-2/3

| 26 | | 27 | | 28 | | 29 | | 30 | | 31 | | 32 | | 33 | | 34 | | 35 | | 36 | | 37 | | 38 |
|---|---|---|---|---|---|---|---|---|---|---|---|---|---|---|---|---|---|---|---|---|---|---|---|---|
| a | b | a | b | a | b | a | b | a | b | a | b | a | b | a | b | a | b | a | b | a | b | a | b | b |
| -1 | -1 | -1 | -1 | -1 | -1 | -1 | -1 | 23 | -1 | -1 | -1 | -1 | -1 | -1 | -1 | -1 | -1 | -1 | -1 | -1 | -1 | 1 | -1 | -1 |
| -1 | -1 | -1 | -1 | -1 | -1 | -1 | -1 | -1 | 18 | -1 | -1 | -1 | -1 | -1 | -1 | -1 | -1 | -1 | -1 | -1 | -1 | -1 | 27 | -1 |
| -1 | -1 | -1 | -1 | -1 | -1 | -1 | -1 | -1 | -1 | -1 | -1 | -1 | 3 | -1 | -1 | -1 | -1 | -1 | -1 | -1 | 3 | 13 | -1 | 24 |
| -1 | -1 | -1 | -1 | -1 | -1 | -1 | -1 | -1 | -1 | -1 | -1 | 17 | -1 | -1 | -1 | -1 | -1 | -1 | -1 | 11 | -1 | -1 | 14 | -1 |
| -1 | -1 | -1 | -1 | 1 | -1 | 1 | -1 | -1 | -1 | -1 | -1 | -1 | -1 | -1 | -1 | 1 | -1 | -1 | -1 | -1 | 2 | -1 | -1 | -1 |
| -1 | -1 | -1 | -1 | -1 | 9 | -1 | 15 | -1 | -1 | -1 | -1 | -1 | -1 | -1 | -1 | -1 | 13 | -1 | -1 | 9 | -1 | -1 | -1 | -1 |
| -1 | 26 | -1 | -1 | -1 | 21 | -1 | -1 | -1 | -1 | -1 | -1 | -1 | 27 | -1 | 17 | -1 | -1 | 13 | -1 | -1 | -1 | -1 | 6 | -1 |
| 16 | -1 | -1 | -1 | 8 | -1 | -1 | -1 | -1 | -1 | -1 | -1 | 6 | -1 | 7 | -1 | -1 | -1 | -1 | 13 | -1 | -1 | 9 | -1 | -1 |
| -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | 27 |
| -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 | -1 |

FROM FIG. 19C

| RATE-2/3 | | | | | | | | | | | | | | | | | | | | | | | |
|---|---|---|---|---|---|---|---|---|---|---|---|---|---|---|---|---|---|---|---|---|---|---|---|
| 38 | 39 | | 40 | | 41 | | 42 | | 43 | | 44 | | 45 | | 46 | | 47 | | 48 | | | | |
| a | a | b | a | b | a | b | a | b | a | b | a | b | a | b | a | b | a | b | a | b | | | Wr |
| -1 | -1 | -1 | -1 | -1 | -1 | -1 | -1 | -1 | -1 | -1 | -1 | -1 | -1 | -1 | -1 | -1 | -1 | -1 | -1 | -1 | a | 3-1+7-1 | 10 |
| -1 | -1 | -1 | -1 | -1 | -1 | -1 | -1 | -1 | -1 | -1 | -1 | -1 | -1 | -1 | -1 | -1 | -1 | -1 | -1 | -1 | b | | 10 |
| -1 | -1 | -1 | -1 | -1 | -1 | -1 | -1 | -1 | -1 | -1 | -1 | -1 | -1 | -1 | -1 | -1 | -1 | -1 | -1 | -1 | a | 6-1+2-1 | 11 |
| 15 | -1 | -1 | -1 | -1 | -1 | -1 | -1 | -1 | -1 | -1 | -1 | -1 | -1 | -1 | -1 | -1 | -1 | -1 | -1 | -1 | b | | 11 |
| -1 | 6 | -1 | -1 | -1 | -1 | -1 | -1 | -1 | -1 | -1 | -1 | -1 | -1 | -1 | -1 | -1 | -1 | -1 | -1 | -1 | a | 1-1+5-1 | 12 |
| -1 | -1 | 12 | -1 | -1 | -1 | -1 | -1 | -1 | -1 | -1 | -1 | -1 | -1 | -1 | -1 | -1 | -1 | -1 | -1 | -1 | b | | 12 |
| -1 | 10 | -1 | 13 | -1 | -1 | -1 | -1 | -1 | -1 | -1 | -1 | -1 | -1 | -1 | -1 | -1 | -1 | -1 | -1 | -1 | a | 8-1+4-1 | 12 |
| -1 | -1 | 15 | -1 | 3 | -1 | -1 | -1 | -1 | -1 | -1 | -1 | -1 | -1 | -1 | -1 | -1 | -1 | -1 | -1 | -1 | b | | 12 |
| -1 | -1 | -1 | 17 | -1 | 0 | -1 | -1 | -1 | -1 | -1 | -1 | -1 | -1 | -1 | -1 | -1 | -1 | -1 | -1 | -1 | a | 1-0 | 12 |
| 25 | -1 | -1 | -1 | 13 | -1 | 0 | -1 | -1 | -1 | -1 | -1 | -1 | -1 | -1 | -1 | -1 | -1 | -1 | -1 | -1 | b | | 12 |

TO FIG. 19H

FROM FIG. 19A

| | | | | | | | | | | | | | | | | | | | | | | | | |
|---|---|---|---|---|---|---|---|---|---|---|---|---|---|---|---|---|---|---|---|---|---|---|---|---|
| 24 | -1 | -1 | -1 | 7 | -1 | -1 | 20 | -1 | -1 | -1 | -1 | -1 | -1 | -1 | -1 | 2 | -1 | 4 | -1 | -1 | 24 | -1 | -1 | -1 |
| -1 | 9 | -1 | -1 | -1 | 19 | 20 | -1 | -1 | -1 | -1 | -1 | -1 | -1 | -1 | -1 | -1 | 4 | -1 | 0 | 23 | -1 | -1 | -1 | -1 |
| -1 | 18 | 14 | -1 | -1 | -1 | -1 | -1 | 0 | -1 | 10 | -1 | -1 | -1 | -1 | -1 | 6 | -1 | -1 | 19 | -1 | -1 | -1 | -1 | -1 |
| 14 | -1 | -1 | 11 | -1 | -1 | -1 | -1 | -1 | 21 | -1 | 11 | -1 | -1 | -1 | -1 | -1 | 23 | 17 | -1 | -1 | -1 | -1 | -1 | -1 |
| 8 | -1 | -1 | -1 | -1 | 23 | -1 | -1 | 21 | -1 | -1 | -1 | -1 | -1 | -1 | -1 | -1 | 18 | -1 | -1 | 4 | -1 | -1 | -1 | -1 |
| -1 | 20 | -1 | -1 | 19 | -1 | -1 | -1 | -1 | 16 | -1 | -1 | -1 | -1 | -1 | -1 | 4 | -1 | -1 | -1 | -1 | 4 | -1 | -1 | -1 |
| -1 | -1 | -1 | -1 | -1 | -1 | -1 | -1 | -1 | -1 | -1 | -1 | -1 | -1 | -1 | -1 | -1 | 23 | -1 | 16 | -1 | 22 | -1 | 13 | -1 |
| -1 | -1 | -1 | -1 | -1 | -1 | -1 | -1 | -1 | -1 | -1 | -1 | -1 | -1 | -1 | -1 | 22 | -1 | 23 | -1 | 6 | -1 | 15 | -1 | -1 |
| -1 | -1 | -1 | -1 | -1 | -1 | -1 | -1 | 23 | -1 | -1 | -1 | -1 | -1 | -1 | 0 | -1 | -1 | -1 | -1 | -1 | -1 | -1 | -1 | 21 |
| -1 | -1 | -1 | -1 | -1 | -1 | -1 | -1 | -1 | 26 | -1 | -1 | -1 | -1 | 4 | -1 | -1 | -1 | -1 | -1 | -1 | -1 | -1 | -1 | -1 |
| -1 | -1 | -1 | -1 | -1 | -1 | -1 | 10 | -1 | -1 | -1 | -1 | 16 | -1 | 23 | -1 | -1 | -1 | -1 | -1 | -1 | 12 | -1 | -1 | -1 |
| -1 | -1 | -1 | -1 | -1 | -1 | 22 | -1 | -1 | -1 | -1 | -1 | -1 | 19 | -1 | 22 | -1 | -1 | -1 | -1 | 9 | -1 | -1 | -1 | -1 |
| -1 | -1 | -1 | -1 | -1 | -1 | -1 | 1 | -1 | -1 | 22 | -1 | -1 | -1 | -1 | 5 | -1 | -1 | 12 | -1 | -1 | -1 | 23 | -1 | -1 |
| -1 | -1 | -1 | -1 | -1 | -1 | 17 | -1 | -1 | -1 | -1 | 13 | -1 | -1 | 0 | -1 | -1 | -1 | -1 | 1 | -1 | -1 | -1 | 9 | -1 |

FROM FIG. 19B

FROM FIG. 19E

| | | | | | | | | | | | | | | | | | | | | | | | | |
|---|---|---|---|---|---|---|---|---|---|---|---|---|---|---|---|---|---|---|---|---|---|---|---|---|
| -1 | -1 | -1 | -1 | -1 | -1 | -1 | 10 | -1 | 25 | -1 | -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | 26 | -1 | 26 | -1 | -1 | -1 | -1 | -1 | -1 | -1 | -1 | -1 | -1 | -1 | -1 | -1 | -1 |
| -1 | -1 | -1 | -1 | -1 | -1 | -1 | -1 | -1 | -1 | -1 | -1 | -1 | -1 | -1 | -1 | -1 | -1 | 19 | -1 | -1 | -1 | -1 | -1 | -1 |
| -1 | -1 | -1 | -1 | -1 | -1 | -1 | -1 | -1 | -1 | -1 | -1 | -1 | -1 | -1 | -1 | -1 | 14 | -1 | -1 | -1 | -1 | -1 | -1 | -1 |
| -1 | -1 | -1 | -1 | 10 | -1 | -1 | -1 | 16 | -1 | -1 | -1 | 6 | -1 | -1 | -1 | 3 | -1 | -1 | -1 | -1 | -1 | -1 | 6 | -1 |
| -1 | -1 | -1 | 8 | -1 | -1 | -1 | 23 | -1 | -1 | -1 | 3 | -1 | -1 | -1 | 16 | -1 | -1 | -1 | -1 | -1 | -1 | -1 | -1 | 25 |
| -1 | -1 | -1 | 22 | -1 | 17 | -1 | -1 | -1 | -1 | -1 | -1 | -1 | -1 | -1 | -1 | -1 | -1 | -1 | -1 | -1 | -1 | -1 | -1 | 15 |
| -1 | -1 | -1 | -1 | 25 | -1 | 27 | -1 | -1 | -1 | -1 | -1 | -1 | -1 | -1 | -1 | -1 | -1 | -1 | -1 | -1 | -1 | -1 | 16 | -1 |
| -1 | -1 | -1 | -1 | 6 | -1 | 18 | -1 | -1 | -1 | -1 | -1 | -1 | -1 | -1 | -1 | 23 | -1 | -1 | 20 | -1 | -1 | 11 | -1 | -1 |
| 11 | -1 | -1 | 14 | -1 | 14 | -1 | -1 | -1 | -1 | -1 | -1 | -1 | -1 | -1 | 18 | -1 | -1 | -1 | -1 | 6 | 4 | -1 | -1 | -1 |
| -1 | -1 | -1 | -1 | -1 | -1 | -1 | -1 | -1 | -1 | -1 | -1 | -1 | 0 | -1 | -1 | -1 | -1 | -1 | -1 | 4 | -1 | -1 | -1 | -1 |
| -1 | -1 | -1 | -1 | -1 | -1 | -1 | -1 | -1 | -1 | -1 | -1 | -1 | -1 | 25 | -1 | -1 | -1 | -1 | 19 | -1 | -1 | -1 | -1 | -1 |
| -1 | -1 | -1 | -1 | -1 | -1 | -1 | -1 | -1 | 17 | -1 | -1 | -1 | 25 | -1 | -1 | -1 | 0 | -1 | -1 | -1 | -1 | -1 | -1 | -1 |
| -1 | -1 | -1 | -1 | -1 | -1 | -1 | -1 | -1 | -1 | 1 | -1 | -1 | -1 | 15 | -1 | -1 | -1 | 5 | -1 | -1 | -1 | -1 | -1 | -1 |

FROM FIG. 19C

| | | | | | | | | | | | | | | | | | | | | | | | | |
|---|---|---|---|---|---|---|---|---|---|---|---|---|---|---|---|---|---|---|---|---|---|---|---|---|
| -1 | -1 | 2 | -1 | 16 | -1 | -1 | -1 | -1 | -1 | -1 | -1 | -1 | -1 | 19 | -1 | -1 | -1 | 27 | -1 | -1 | -1 | -1 | -1 | -1 |
| -1 | -1 | -1 | 5 | -1 | 25 | -1 | -1 | -1 | -1 | -1 | -1 | -1 | -1 | -1 | 4 | -1 | -1 | -1 | 7 | -1 | -1 | -1 | -1 | -1 |
| 25 | -1 | -1 | -1 | -1 | -1 | -1 | -1 | -1 | -1 | -1 | -1 | -1 | -1 | 6 | -1 | 10 | -1 | -1 | -1 | -1 | -1 | -1 | -1 | -1 |
| -1 | 17 | -1 | -1 | -1 | -1 | -1 | -1 | -1 | -1 | -1 | -1 | -1 | -1 | -1 | 16 | -1 | 26 | -1 | -1 | -1 | -1 | -1 | -1 | -1 |
| -1 | -1 | -1 | -1 | -1 | -1 | 16 | -1 | -1 | -1 | -1 | -1 | -1 | -1 | -1 | -1 | -1 | -1 | -1 | -1 | -1 | -1 | -1 | -1 | -1 |
| -1 | -1 | -1 | -1 | -1 | -1 | -1 | 19 | -1 | -1 | -1 | -1 | -1 | -1 | -1 | -1 | -1 | -1 | -1 | -1 | -1 | -1 | -1 | -1 | -1 |
| 17 | -1 | -1 | 13 | -1 | -1 | -1 | -1 | -1 | 9 | 23 | -1 | -1 | 8 | -1 | -1 | -1 | -1 | -1 | -1 | -1 | -1 | -1 | -1 | -1 |
| -1 | 16 | 27 | -1 | -1 | -1 | -1 | -1 | 7 | -1 | -1 | 3 | 12 | -1 | -1 | -1 | -1 | -1 | -1 | -1 | -1 | -1 | -1 | -1 | -1 |
| -1 | -1 | -1 | -1 | -1 | -1 | -1 | 17 | -1 | -1 | 24 | -1 | -1 | -1 | -1 | -1 | -1 | -1 | -1 | -1 | -1 | -1 | -1 | -1 | -1 |
| -1 | -1 | -1 | -1 | -1 | -1 | 7 | -1 | -1 | -1 | -1 | 2 | -1 | -1 | -1 | -1 | -1 | -1 | -1 | -1 | -1 | -1 | -1 | -1 | -1 |
| -1 | -1 | 3 | -1 | -1 | -1 | -1 | -1 | -1 | -1 | 0 | -1 | -1 | -1 | -1 | -1 | -1 | -1 | -1 | -1 | 10 | -1 | -1 | -1 | -1 |
| -1 | -1 | -1 | 0 | -1 | -1 | -1 | -1 | -1 | -1 | -1 | 24 | -1 | -1 | -1 | -1 | -1 | -1 | -1 | -1 | -1 | 23 | -1 | -1 | -1 |
| -1 | -1 | -1 | -1 | -1 | -1 | -1 | -1 | -1 | -1 | -1 | -1 | -1 | -1 | -1 | -1 | -1 | 27 | -1 | -1 | -1 | -1 | -1 | -1 | -1 |
| -1 | -1 | -1 | -1 | -1 | -1 | -1 | -1 | -1 | -1 | -1 | -1 | -1 | -1 | -1 | -1 | 18 | -1 | -1 | -1 | -1 | -1 | -1 | -1 | 5 |

FROM FIG. 19F

FIG. 19G

FROM FIG. 19D

FROM FIG. 19G

| | | | | | | | | | | | | | | | | | | | | | | | |
|---|---|---|---|---|---|---|---|---|---|---|---|---|---|---|---|---|---|---|---|---|---|---|---|
| -1 | -1 | -1 | -1 | -1 | 0 | -1 | 0 | -1 | -1 | -1 | -1 | -1 | -1 | -1 | -1 | -1 | -1 | -1 | -1 | -1 | a | 2-0 | 14 |
| -1 | -1 | -1 | -1 | -1 | -1 | 0 | -1 | 0 | -1 | -1 | -1 | -1 | -1 | -1 | -1 | -1 | -1 | -1 | -1 | -1 | b | | 14 |
| -1 | -1 | -1 | -1 | -1 | -1 | -1 | 0 | -1 | 0 | -1 | -1 | -1 | -1 | -1 | -1 | -1 | -1 | -1 | -1 | -1 | a | 3-0 | 12 |
| -1 | -1 | -1 | -1 | -1 | -1 | -1 | -1 | 0 | -1 | 0 | -1 | -1 | -1 | -1 | -1 | -1 | -1 | -1 | -1 | -1 | b | | 12 |
| -1 | -1 | -1 | -1 | -1 | -1 | -1 | -1 | -1 | 0 | -1 | 0 | -1 | -1 | -1 | -1 | -1 | -1 | -1 | -1 | -1 | a | 4-0 | 13 |
| -1 | -1 | -1 | -1 | -1 | -1 | -1 | -1 | -1 | -1 | 0 | -1 | 0 | -1 | -1 | -1 | -1 | -1 | -1 | -1 | -1 | b | | 13 |
| -1 | -1 | -1 | -1 | -1 | -1 | -1 | -1 | -1 | -1 | -1 | 0 | -1 | 0 | -1 | -1 | -1 | -1 | -1 | -1 | -1 | a | 5-0 | 14 |
| -1 | -1 | -1 | -1 | -1 | -1 | -1 | -1 | -1 | -1 | -1 | -1 | 0 | -1 | 0 | -1 | -1 | -1 | -1 | -1 | -1 | b | | 14 |
| -1 | 25 | -1 | -1 | -1 | -1 | -1 | -1 | -1 | -1 | -1 | -1 | -1 | 0 | -1 | 0 | -1 | -1 | -1 | -1 | -1 | a | 6-0 | 13 |
| -1 | -1 | 0 | -1 | -1 | -1 | -1 | -1 | -1 | -1 | -1 | -1 | -1 | -1 | 0 | -1 | 0 | -1 | -1 | -1 | -1 | b | | 13 |
| -1 | -1 | -1 | -1 | 4 | -1 | 22 | -1 | -1 | -1 | -1 | -1 | -1 | -1 | -1 | 0 | -1 | 0 | -1 | -1 | -1 | a | 7-0 | 13 |
| -1 | -1 | -1 | 21 | -1 | 2 | -1 | -1 | -1 | -1 | -1 | -1 | -1 | -1 | -1 | -1 | 0 | -1 | 0 | -1 | -1 | b | | 13 |
| 21 | -1 | -1 | -1 | -1 | -1 | -1 | -1 | 26 | -1 | -1 | -1 | -1 | -1 | -1 | -1 | -1 | 0 | -1 | 12 | -1 | a | 8-0 | 13 |
| -1 | -1 | -1 | -1 | -1 | -1 | -1 | 4 | -1 | -1 | -1 | -1 | -1 | -1 | -1 | -1 | -1 | -1 | 0 | -1 | 3 | b | | 13 |

FIG. 19H

SYSTEM AND METHOD FOR STRUCTURED LDPC CODE FAMILY WITH FIXED CODE LENGTH AND NO PUNCTURING

CROSS-REFERENCE TO RELATED APPLICATION(S) AND CLAIM OF PRIORITY

The present application is related to U.S. Provisional Patent Application No. 61/274,970, filed Aug. 24, 2009, entitled "STRUCTURED LDPC CODE FAMILY WITH FIXED CODE LENGTH AND NO PUNCTURING", and U.S. Provisional Application No. 61/276,595, filed Sep. 14, 2009, entitled "STRUCTURED LDPC CODE FAMILY WITH FIXED CODE LENGTH AND NO PUNCTURING II". Provisional Patent Application Nos. 61/274,970 and 61/276,595 are assigned to the assignee of the present application and are hereby incorporated by reference into the present application as if fully set forth herein. The present application hereby claims priority under 35 U.S.C. §119(e) to U.S. Provisional Patent Application Nos. 61/274,970 and 61/276,595.

TECHNICAL FIELD OF THE INVENTION

The present application relates generally to wireless communications devices and, more specifically, to decoding data received by a wireless communication device.

BACKGROUND OF THE INVENTION

In information theory, a low-density parity-check (LDPC) code is an error correcting code for transmitting a message over a noisy transmission channel. LDPC codes are a class of linear block codes. While LDPC and other error correcting codes cannot guarantee perfect transmission, the probability of lost information can be made as small as desired. LDPC was the first code to allow data transmission rates close to the theoretical maximum known as the Shannon Limit. LDPC codes can perform with 0.0045 dB of the Shannon Limit. LDPC was impractical to implement when developed in 1963. Turbo codes, discovered in 1993, became the coding scheme of choice in the late 1990s. Turbo codes are used for applications such as deep-space satellite communications. LDPC requires complex processing but is the most efficient scheme discovered as of 2007. LDPC codes can yield a large minimum distance (hereinafter "$d_{min}$") and reduce decoding complexity.

SUMMARY OF THE INVENTION

For use in a wireless communication network, a method for constructing a low density parity check (LDPC) family of codes is provided. The method includes constructing a mother code having a highest code rate in the LDPC family of codes. The mother code is constructed by: selecting m number of rows and n number of columns; setting maximum column weights and row weights; designing a protograph matrix based on the set column weights and row weights and selected m and n; and selecting circulant blocks based on the protograph matrix.

A low density parity check (LDPC) code is provided. The low density parity check (LDPC) code includes a codeword size of at least 1344. The LDPC code also includes a plurality of information bits and a plurality of parity bits. The plurality of parity bits includes a lower triangular form. The LDPC code is based on a mother code. The mother code is constructed by: selecting m number of rows and n number of columns; setting maximum column weights and row weights; designing a protograph matrix based on the set column weights and row weights and selected m and n; and selecting circulant blocks based on the protograph matrix.

For use in a wireless communications network, a method for performing error correction is provided. The method includes using a low density parity check (LDPC) code from a LDPC family of codes. The LDPC code includes a codeword size of at least 1344. The LDPC code also includes a plurality of information bits and a plurality of parity bits. The plurality of parity bits includes a lower triangular form. The LDPC code is based on a mother code. The mother code is constructed by: selecting m number of rows and n number of columns; setting maximum column weights and row weights; designing a protograph matrix based on the set column weights and row weights and selected m and n; and selecting circulant blocks based on the protograph matrix.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts:

FIGS. 5A and 5B illustrate an example mother code according to embodiments of the present disclosure;

FIGS. 7A through 9B illustrate splitting rules according to embodiments of the present disclosure;

FIGS. 10A through 12B illustrate rate codes according to embodiments of the present disclosure;

FIGS. 13A and 13B illustrate 4-layer decodable ¾ splitting rule according to embodiments of the present disclosure;

FIGS. 14A and 14B illustrate a 4-layer decodable rate-¾ code according to embodiments of the present disclosure;

FIGS. 15A through 15D illustrate an example 2X mother code according to embodiments of the present disclosure;

FIGS. 17A-1 through 19H illustrate 2X rate codes according to embodiments of the present disclosure.

DETAILED DESCRIPTION OF THE INVENTION

FIGS. 1 through 19H discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged wireless communications device.

Figure 1:
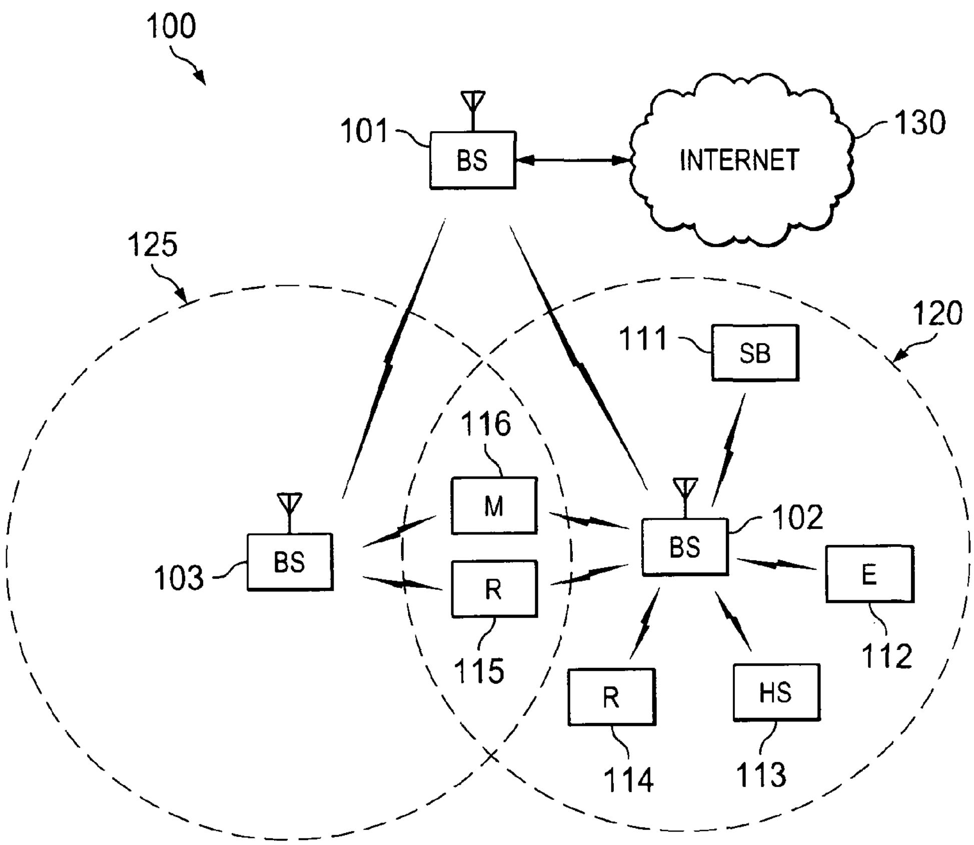
FIG. 1 illustrates an exemplary wireless network 100, which transmits ACK/NACK messages according to an exemplary embodiment of the disclosure.

FIG. 1 illustrates an exemplary wireless network 100, which transmits ACK/NACK messages according to the principles of the present disclosure. In the illustrated embodiment, wireless network 100 includes base station (BS) 101, base station (BS) 102, base station (BS) 103, and other similar base stations (not shown). Base station 101 is in communication with base station 102 and base station 103. Base station 101 is also in communication with Internet 130 or a similar IP-based network (not shown).

Base station 102 provides wireless broadband access (via base station 101) to Internet 130 to a first plurality of subscriber stations within coverage area 120 of base station 102. The first plurality of subscriber stations includes subscriber station 111, which may be located in a small business (SB), subscriber station 112, which may be located in an enterprise (E), subscriber station 113, which may be located in a wireless fidelity (WiFi) hotspot (HS), subscriber station 114, which may be located in a first residence (R), subscriber station 115, which may be located in a second residence (R), and subscriber station 116, which may be a mobile device (M), such as a cell phone, a wireless laptop, a wireless PDA, or the like.

Base station 103 provides wireless broadband access (via base station 101) to Internet 130 to a second plurality of subscriber stations within coverage area 125 of base station 103. The second plurality of subscriber stations includes subscriber station 115 and subscriber station 116. In an exemplary embodiment, base stations 101-103 may communicate with each other and with subscriber stations 111-116 using OFDM or OFDMA techniques.

Base station 101 may be in communication with either a greater number or a lesser number of base stations. Furthermore, while only six subscriber stations are depicted in FIG. 1, it is understood that wireless network 100 may provide wireless broadband access to additional subscriber stations. It is noted that subscriber station 115 and subscriber station 116 are located on the edges of both coverage area 120 and coverage area 125. Subscriber station 115 and subscriber station 116 each communicate with both base station 102 and base station 103 and may be said to be operating in handoff mode, as known to those of skill in the art.

Subscriber stations 111-116 may access voice, data, video, video conferencing, and/or other broadband services via Internet 130. In an exemplary embodiment, one or more of subscriber stations 111-116 may be associated with an access point (AP) of a WiFi WLAN. Subscriber station 116 may be any of a number of mobile devices, including a wireless-enabled laptop computer, personal data assistant, notebook, handheld device, or other wireless-enabled device. Subscriber stations 114 and 115 may be, for example, a wireless-enabled personal computer (PC), a laptop computer, a gateway, or another device.

Figure 2A:
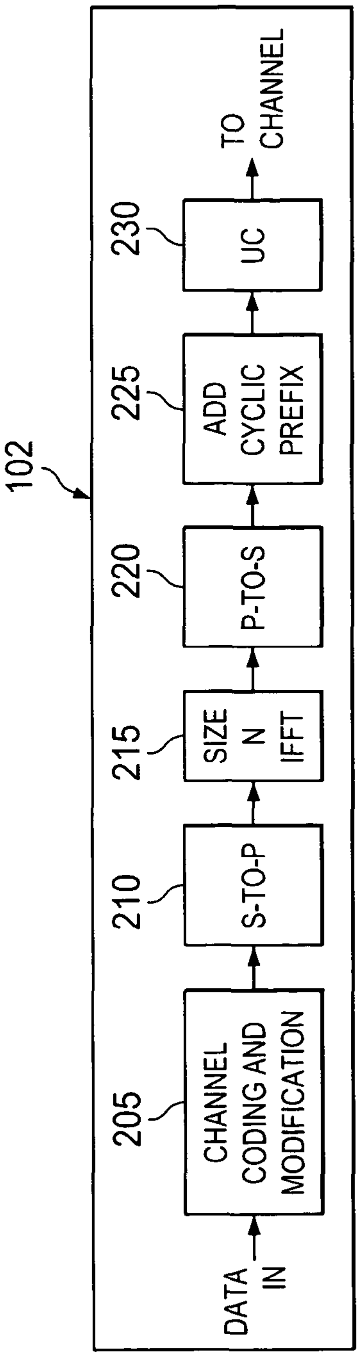
FIG. 2A illustrates a high-level diagram of an orthogonal frequency division multiple access transmit path according to an exemplary embodiment of the disclosure.
Figure 2B:
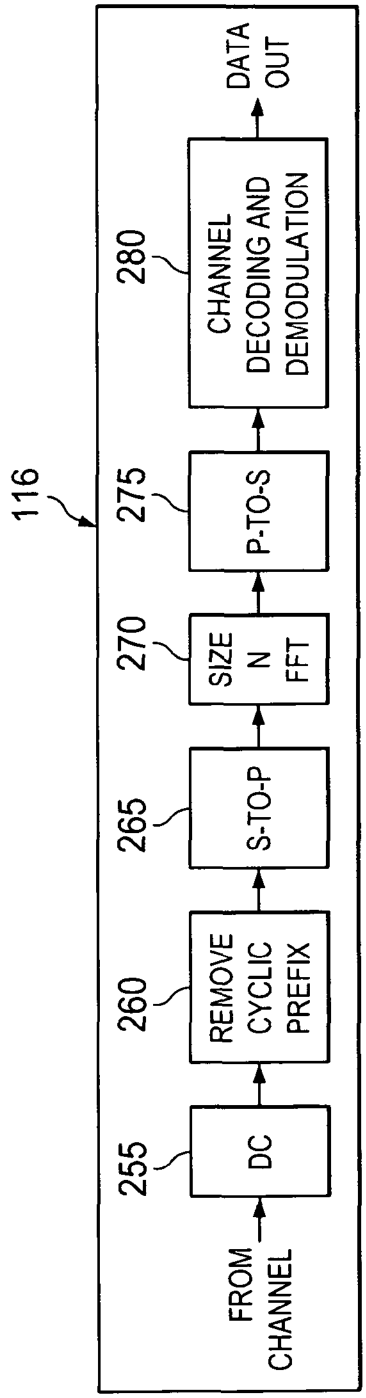
FIG. 2B illustrates a high-level diagram of an orthogonal frequency division multiple access receive path according to an exemplary embodiment of the disclosure.

Embodiments of the present disclosure provide for a decoder configured to operate in a Wireless Gigabit (WiGig) system. The system 100 can be configured to operate as or in the WiGig system. The WiGig system is a global wireless system that enables multi-gigabit-speed wireless communications among high performance devices using the unlicensed 60 GHz spectrum FIG. 2A is a high-level diagram of an orthogonal frequency division multiple access (OFDMA) transmit path. FIG. 2B is a high-level diagram of an orthogonal frequency division multiple access (OFDMA) receive path. In FIGS. 2A and 2B, the OFDMA transmit path is implemented in base station (BS) 102 and the OFDMA receive path is implemented in subscriber station (SS) 116 for the purposes of illustration and explanation only. However, it will be understood by those skilled in the art that the OFDMA receive path may also be implemented in BS 102 and the OFDMA transmit path may be implemented in SS 116.

The transmit path in BS 102 comprises channel coding and modulation block 205, serial-to-parallel (S-to-P) block 210, Size N Inverse Fast Fourier Transform (IFFT) block 215, parallel-to-serial (P-to-S) block 220, add cyclic prefix block 225, up-converter (UC) 230. The receive path in SS 116 comprises down-converter (DC) 255, remove cyclic prefix block 260, serial-to-parallel (S-to-P) block 265, Size N Fast Fourier Transform (FFT) block 270, parallel-to-serial (P-to-S) block 275, channel decoding and demodulation block 280.

At least some of the components in FIGS. 2A and 2B may be implemented in software while other components may be implemented by configurable hardware or a mixture of software and configurable hardware. In particular, it is noted that the FFT blocks and the IFFT blocks described in this disclosure document may be implemented as configurable software algorithms, where the value of Size N may be modified according to the implementation.

Furthermore, although this disclosure is directed to an embodiment that implements the Fast Fourier Transform and the Inverse Fast Fourier Transform, this is by way of illustration only and should not be construed to limit the scope of the disclosure. It will be appreciated that in an alternate embodiment of the disclosure, the Fast Fourier Transform functions and the Inverse Fast Fourier Transform functions may easily be replaced by Discrete Fourier Transform (DFT) functions and Inverse Discrete Fourier Transform (IDFT) functions, respectively. It will be appreciated that for DFT and IDFT functions, the value of the N variable may be any integer number (i.e., 1, 2, 3, 4, etc.), while for FFT and IFFT functions, the value of the N variable may be any integer number that is a power of two (i.e., 1, 2, 4, 8, 16, etc.).

In BS 102, channel coding and modulation block 205 receives a set of information bits, applies coding (e.g., LDPC coding) and modulates (e.g., QPSK, QAM) the input bits to produce a sequence of frequency-domain modulation symbols. Serial-to-parallel block 210 converts (i.e., de-multiplexes) the serial modulated symbols to parallel data to produce N parallel symbol streams where N is the IFFT/FFT size used in BS 102 and SS 116. Size N IFFT block 215 then performs an IFFT operation on the N parallel symbol streams to produce time-domain output signals. Parallel-to-serial block 220 converts (i.e., multiplexes) the parallel time-domain output symbols from Size N IFFT block 215 to produce a serial time-domain signal. Add cyclic prefix block 225 then inserts a cyclic prefix to the time-domain signal. Finally, up-converter 230 modulates (i.e., up-converts) the output of add cyclic prefix block 225 to RF frequency for transmission via a wireless channel. The signal may also be filtered at baseband before conversion to RF frequency.

The transmitted RF signal arrives at SS 116 after passing through the wireless channel and reverse operations to those at BS 102 are performed. Down-converter 255 down-converts the received signal to baseband frequency and remove cyclic prefix block 260 removes the cyclic prefix to produce the serial time-domain baseband signal. Serial-to-parallel block 265 converts the time-domain baseband signal to parallel time domain signals. Size N FFT block 270 then performs an FFT algorithm to produce N parallel frequency-domain signals. Parallel-to-serial block 275 converts the parallel frequency-domain signals to a sequence of modulated data symbols. Channel decoding and demodulation block 280 demodulates and then decodes the modulated symbols to recover the original input data stream.

Each of base stations 101-103 may implement a transmit path that is analogous to transmitting in the downlink to subscriber stations 111-116 and may implement a receive path that is analogous to receiving in the uplink from subscriber stations 111-116. Similarly, each one of subscriber stations 111-116 may implement a transmit path corresponding to the architecture for transmitting in the uplink to base stations 101-103 and may implement a receive path corresponding to the architecture for receiving in the downlink from base stations 101-103.

The channel decoding and demodulation block 280 decodes the received data. The channel decoding and demodulation block 280 includes a decoder configured to perform a low density parity check decoding operation. In some embodiments, the channel decoding and demodulation block 280 comprises one or more Context-based operation Reconfigurable Instruction Set Processors (CRISPs) such as the CRISP processor described in one or more of application Ser. No. 11/123,313 filed May 6, 2005, entitled "CONTEXT-BASED OPERATION RECONFIGURABLE INSTRUCTION SET PROCESSOR AND METHOD OF OPERATION" (now U.S. Pat. No. 7,668,992); application Ser. No. 11,142,504 filed Jun. 1, 2005 entitled "MULTISTANDARD SDR ARCHITECTURE USING CONTEXT-BASED OPERATION RECONFIGURABLE INSTRUCTION SET PROCESSORS" (now U.S. Pat. No. 7,769,912); U.S. Pat. No. 7,483,933 issued Jan. 27, 2009 entitled "CORRELATION ARCHITECTURE FOR USE IN SOFTWARE-DEFINED RADIO SYSTEMS"; application Ser. No. 11/225,479 filed Sep. 13, 2005, entitled "TURBO CODE DECODER ARCHITECTURE FOR USE IN SOFTWARE-DEFINED RADIO SYSTEMS" (now U.S. Pat. No. 7,571,369); and application Ser. No. 11/501,577 filed Aug. 9, 2006, entitled "MULTI-CODE CORRELATION ARCHITECTURE FOR USE IN SOFTWARE-DEFINED RADIO SYSTEMS", all of which are hereby incorporated by reference into the present application as if fully set forth herein.

Figure 3:
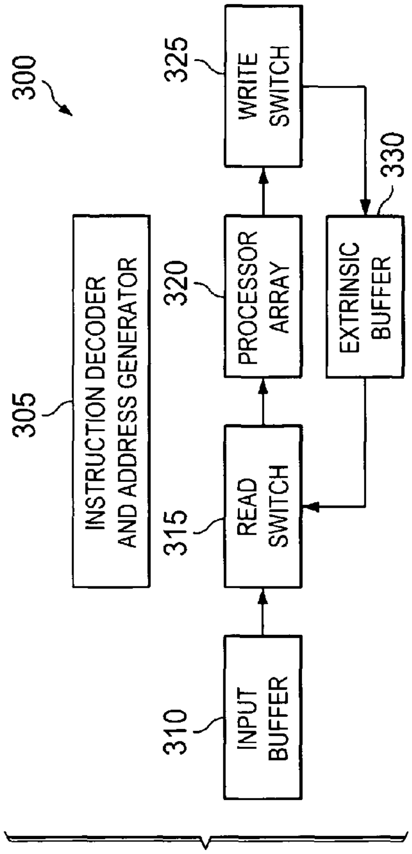
FIG. 3 illustrates a LDPC CRISP top-level architecture according to embodiments of the present disclosure.

FIG. 3 illustrates a LDPC CRISP top-level architecture according to embodiments of the present disclosure. The embodiment of the LDPC CRISP top-level architecture 300 shown in FIG. 3 is for illustration only. Other embodiments of the LDPC CRISP top-level architecture 300 could be used without departing from the scope of this disclosure.

The LDPC CRISP 300 includes an instruction decoder & address generator block 305. In some embodiments, the instruction decoder & address generator block 305 is a programmable finite state machine. In some embodiments, the instruction decoder & address generator block 305 operates as a controller for the LDPC CRISP 300 and its components. The LDPC CRISP 300 also includes an input buffer block 310, a read switch block 315, a processor array 320, a write switch block 325 and an extrinsic buffer block 330. In some embodiments (not specifically illustrated), the input buffer block 310 includes extrinsic buffer block 330 (e.g., the input buffer block 310 and extrinsic buffer 330 can be the same block).

The instruction decoder & address generator block 305 includes a plurality of instructions to control operations of the LDPC CRISP 300. In some embodiments, a portion (e.g., some or all) of the plurality of instructions is reconfigurable to vary the operation of the LDPC CRISP 300. The plurality of instructions can be reconfigured to have the LDPC CRISP 300 perform Serial-V decoding or Serial-C decoding. Additionally, the plurality of instructions can be reconfigured to have the LDPC CRISP 300 perform decoding by a flooding technique, sum products technique or min-sum technique. The plurality of instructions also can be reconfigured to vary a number of iterations performed such that the LDPC CRISP 300 only performs a number of iterations or continue to perform iterations until a specified event occurs or a specified amount of time lapses. Further, the plurality of instructions can be reconfigured to have the LDPC CRISP 300 perform decoding for any one or more of IEEE 802.16e (hereinafter "WiMax"), Digital Video Broadcasting—Satellite—Second Generation (hereinafter "DVB-S2") and International Mobile Telecommunications—Advanced (hereinafter "IMT-Advanced" or "4G"). The LDPC CRISP can be applied to any system that incorporates an LDPC decoding algorithm including, but not limited to, CDMA, OFDMA, WiMax, third generation (3G) and fourth generation (4G) systems. Additionally, the plurality of instructions can be reconfigured to have the LDPC CRISP 300 vary the number of LDPC CRISP decoder units for use in the decoding operation. The instruction decoder & address generator block 305 also is configured to store an H-matrix (discussed herein below with respect to FIGS. 5A and 5B, 10A through 12B, 15A and 17B-6 through 19H).

The input buffer block 310 is configured to receive data (e.g., codewords or symbols). The input buffer block 310 includes a number of memory blocks for storing the received data. In some embodiments, the input buffer block 310 includes twenty-four (24) memory blocks for storing the received data.

The read switch also reads the H-matrix from the instruction decoder & address generator block 305. The read switch 315 is configured to read the received data from the input buffer block 310. The read switch 315 uses the H-matrix to determine from where to read the data from the input buffer 310. The read switch 315 is configured to apply a Z-factor right shift multiplexor (MUX) operation to the received data read from the input buffer block 310. The Z-factor right shift multiplexor (MUX) operation is based on the shift data computed from the H-matrix or the shift vector (discussed herein below with respect to FIGS. 5A and 5B).

The processor array 320 includes a number of processor elements. Each of the processor elements includes a plurality of processors configured to perform a flooding technique, sum products technique or min-sum technique. For example, the processor 320 can be configured to find minimum values using a min-sum technique. Further, the processor array 320 is configured to perform decoding for any one or more of WiMax, DVB-S2 and 4G. In some embodiments, the processor array 320 includes four (4) processor elements, each processor element including twenty-four (24) processors. In such embodiments, the LDPC CRISP 300 is referenced herein as a 2/4-unit LDPC decoder CRISP 300.

The write switch block 325 is configured to receive Min/Next Min selection & sums from the processor array 320. The write switch block 325 further is configured to apply a Z-factor left shift MUX operation to the Min/Next Min selection & sums received from the processor array 320 to generate a set of output extrinsic data. Further, the write switch block 325 is configured to write the output extrinsic data of the write switch block 325 to extrinsic buffer block 330. For example, the write switch block 325 is configured to use the H-matrix to reverse of the operation performed by read switch 315.

The extrinsic buffer block 330 is configured to store the output extrinsic data in a number of memory units. In some embodiments, the extrinsic buffer block 330 includes twenty-four (24) memory units. The extrinsic buffer block 330 also is coupled to the read switch 315 such that the read switch 315 can read the output extrinsic data (hereinafter also "extrinsic output").

The LDPC CRISP 300 is, thus, able to perform a number of iterations of the received data. The LDPC CRISP 300 is operable to read the input data and apply a decoding process to the input data to output an extrinsic data. Thereafter, the LDPC CRISP 300 performs one or more iterations of the decoding process using extrinsic data from the previous decoding process as the input for the next decoding process. As such, the input data is used only once and, thereafter, the LDPC CRISP 300 generates the extrinsic data for use in the subsequent iterations.

The LDPC CRISP 300 can be configured to perform iterations until a cessation event occurs. For example, the LDPC CRISP 300 can be configured to perform a specified number of iterations. Additionally, the LDPC CRISP 300 can be configured to perform iterations until the extrinsic data reaches a specified value (e.g., a convergence point). Further, the LDPC CRISP 300 can be configured to perform iterations until a most significant bit (MSB) output is unchanged for several consecutive iterations.

LDPC codes are linear codes that can be characterized by sparse parity check matrices H. The H-matrix has a low density of one's (1's). The sparseness of H yields a large $d_{min}$ and reduces decoding complexity. An exemplary H-matrix is represented by Equation 1a:

$$H=\begin{bmatrix}1&1&1&1&0&1&0&1&0&1\\1&0&1&1&0&0&1&1&1&1\\0&1&0&1&0&0&0&1&0&0\\1&0&0&0&1&0&1&1&1&1\\0&0&1&1&1&0&1&0&1&0\end{bmatrix}. \quad \text{[Eqn. 1a]}$$

Another exemplary H-matrix is represented by Equation 1b:

$$H=\begin{bmatrix}1&1&0&1&0&0\\1&0&1&0&1&0\\0&1&1&0&0&1\end{bmatrix}. \quad \text{[Eqn. 1b]}$$

An LDPC code is regular if: every row has the same weight, row weight ($W_r$); and every column has the same weight, column weight ($W_c$). The regular LDPC code is denoted by ($W_e$, $W_r$)-regular. Otherwise, the LDPC code is irregular. Regular codes are easier to implement and analyze. Further, regular codes have lower error floors. However, irregular codes can get closer to capacity than regular codes.

FIGS. 4A through 4D illustrate Tanner graphs corresponding to a parity check matrix according to embodiments of the present disclosure. The embodiments of the Tanner graphs shown in FIGS. 4A through 4D are for illustration only. Other embodiments of the Tanner graphs could be used without departing from the scope of this disclosure.

The Tanner graph 400 is a bipartite graph. In bipartite graphs, nodes are separated into two distinctive sets and edges are only connecting nodes of two different types. The two types of nodes in the Tanner graph 400 are referred to as Variable Nodes (hereinafter "v-nodes") and Check Nodes (hereinafter "c-nodes")

V-nodes correspond to bits of the codeword or, equivalently, to columns of the parity check H-matrix. There are n v-nodes. V-nodes are also referenced as "bit nodes". C-nodes correspond to parity check equations or, equivalently, to rows of the parity check H-matrix. There are at least m=n−k c-nodes.

The Tanner graph 400 corresponds to the parity check H-matrix illustrated by Equation 1a. In addition, the Tanner graph 405 corresponds to the parity check H-matrix illustrated by Equation 1b. The Tanner graph 400 includes five (5) c-nodes (the number of parity bits) and ten (10) v-nodes (the number of bits in a codeword). C-node $f_i$ is connected to v-node $c_j$ if the element $h_{ij}$ of H-matrix is a one (1). For example, c-node $f_0$ is connected $c_0$, $c_1$, $c_2$, $c_3$, $c_5$, $c_7$ and $c_9$. The connection between $f_0$ and $c_0$ corresponds to $h_{00}$; the connection between $f_0$ and $c_2$ corresponds to $h_{01}$; and so on. Therefore, the connections to $f_0$ correspond to the first row in the H-matrix, further illustrated in Equation 2:

$$\overline{H}_0=[1\ 1\ 1\ 1\ 0\ 1\ 0\ 1] \quad \text{[Eqn. 2]}$$

A degree of a node is the number of edges (e.g., connections) connected to the node. An attractive property of protograph-based codes is that their performance can be predicted from the protograph. The code rate of the derived graph is the same as that computed from the protograph, the code length is equal to the number of VNs in the protograph times Z, and more important the minimum signal-to-noise ratio (SNR) required for successful decoding (called protograph threshold) can be computed for the protograph using protograph EXIT analysis, as described in G. Liva, and M. Chiani "Protograph LDPC Codes Design Based on EXIT Analysis," *IEEE Global Telecommunication Conference, GLOBECOM* 2007, the contents of which are hereby incorporated by reference. The protograph threshold serves as a good indicator on the performance of the derived LDPC code. The threshold SNR is achievable if the derived graph is cycle-free. A cycle is a total length, in the Tanner graph 400, of a path of distinct edges that closes upon itself. The number of edges in this closed path is called the size of the cycle. A path 402 from $c_1 \to f_2 \to c_2 \to f_0 \div c_1$ is an example of a short cycle of size 4 (illustrated by the bold line in FIG. 4A). Short cycles should be avoided since short cycles adversely affect decoding performance. Short cycles manifest themselves in the H-matrix by columns with an overlap two (2). For this reason (which also related to the iterative decoding performance), it is desirable to maximize the size of the smallest cycle in the LDPC code's graph. In general, progressive edge growth (PEG) algorithm is used to select the suitable circulant permutations to maximize the size of the smallest cycles in the LDPC code's graph.

Theoretically, there are no constraints on the locations of the ones in the code's parity check matrix. Therefore, the ones can be very random. However, for practical considerations, it may be preferable to have some structure in the locations of these ones. Consequently, a class of LDPC codes appeared in the industry called protograph-based LDPC codes, as discussed in J. Thorpe, "Low-density parity-check (LDPC) codes constructed from protographs," Tech. Rep. 42-154, IPN Progress Report, August 2003, the contents of which are hereby incorporated. Protographs are further described in D. Divsalar, S. Dolinar, and C. Jones, "Protograph LDPC codes over burst erasure channels," *IEEE Military Commun. Conf., MILCOM* 2006, the contents of which are incorporated by reference. A protograph is a relatively small Tanner graph, such as Tanner graph 410 in FIG. 4C, from which a larger graph can be obtained by the following copy-and-permute procedure. Each edge in the protograph is assigned a different "type" and then the protograph is copied Z times, after which the edges of the same type among the replicas are permuted and reconnected to obtain a single, large graph. Parallel edges are allowed in the protograph, but not in the derived graph. It should be noted that the copy-and-permute procedure described in the definition can be simply represented by replacing each node in the protograph with a vector of nodes of the same type and replacing each edge in the protograph with a bundle of (permuted) edges of the same type.

Figure 4A:
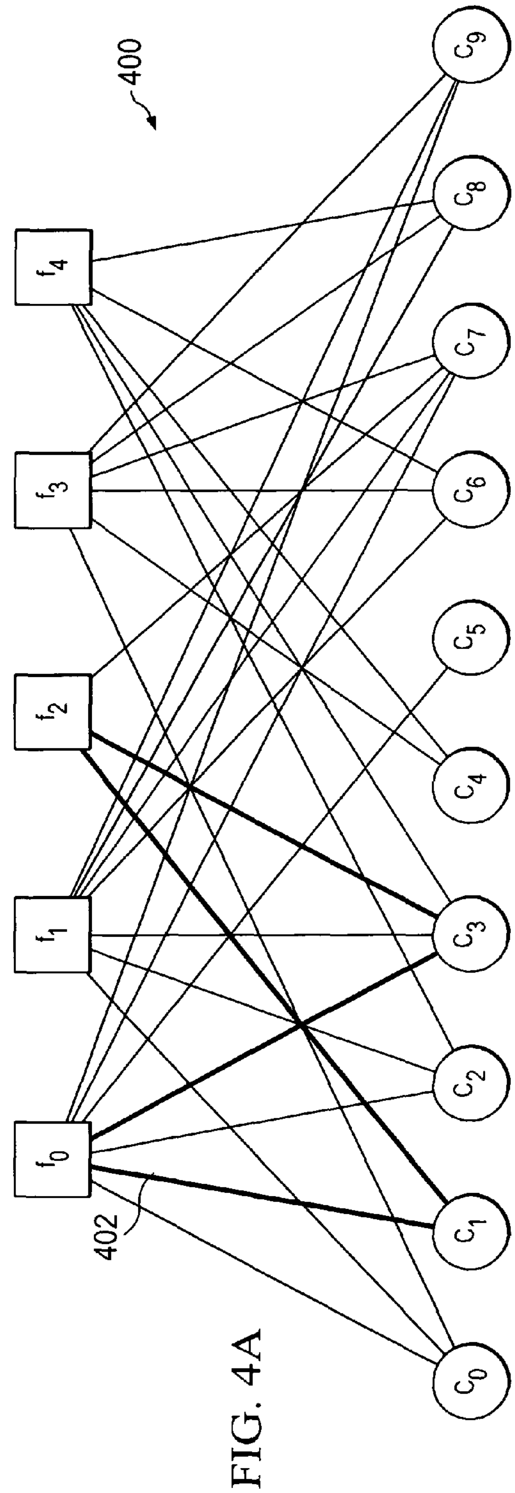
FIGS. 4A through 4D illustrate a Tanner graphs corresponding to a parity check matrix according to embodiments of the present disclosure.
Figure 4B:
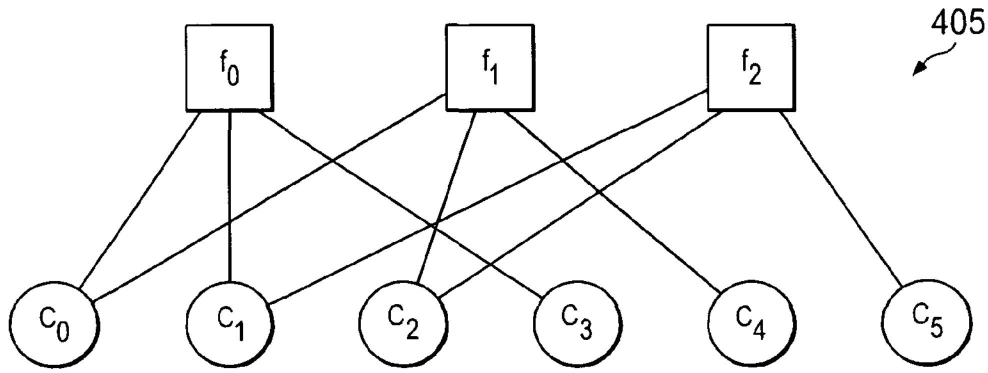
Figure 4C:
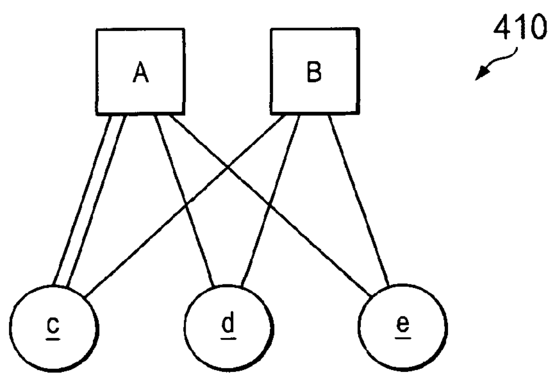
Figure 4D:
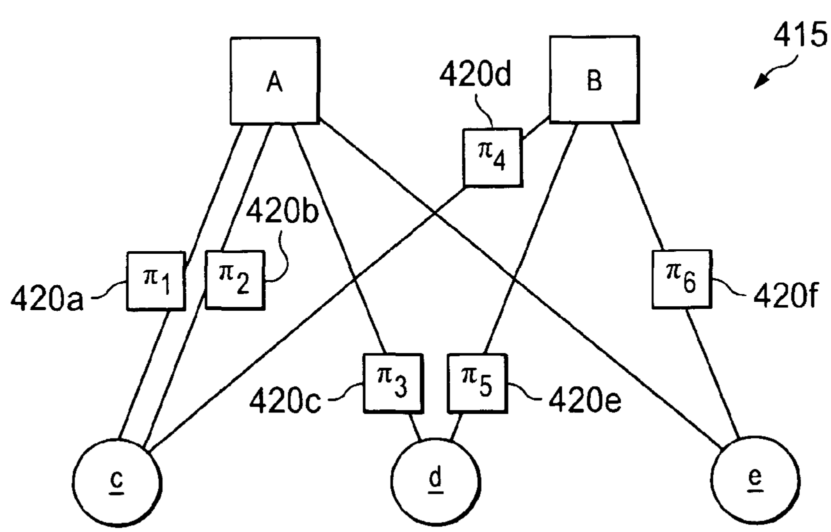

For example, the example protograph in FIG. 4C consists of two CN-types (A, and B) and three VN-types (c, d, and e). The obtained "vectorized" protograph 415, which represents the derived LDPC code, is illustrated in FIG. 4D, where A represents Z CNs of type A and B represents Z CNs of type $\overline{B}$ and similarly for the VNs. The boxes $\pi_e$ 420 along each Z-edge represents a permutation or adjacency matrix. The protograph 415 can also be described in a matrix form in the same way as writing the H matrix for a Tanner graph. For example, the protograph 415 can be characterized by parity check matrices $H_p$. The $H_p$-matrix can be represented by Equation 3:

$$H_p = \begin{array}{c} \\ A \\ B \end{array}\begin{array}{c} \begin{array}{ccc} c & d & e \end{array} \\ \begin{bmatrix} 2 & 1 & 0 \\ 1 & 1 & 1 \end{bmatrix} \end{array}. \quad \text{[Eqn. 3]}$$

But, the non-zero entries in the matrix take values equal to the number of parallel edges connecting two neighboring nodes. The sum of the elements in any column is called column weight, Wc; and the sum of the elements in any row is called row weight, Wr.

For an attractive structured LDPC code, the protograph permutations should be in a circulant block form. That is, the permutation has the form $\pi_e = I^{(s)}$, where $I^{(s)}$ is the matrix resulting after s right cyclic-shifts of the identity matrix. For example, Equations 4a through 4c illustrate shifts of the identity matrix:

$$I^{(0)} = \begin{bmatrix} 1 & 0 & 0 \\ 0 & 1 & 0 \\ 0 & 0 & 1 \end{bmatrix}. \quad \text{[Eqn. 4a]}$$

$$I^{(1)} = \begin{bmatrix} 0 & 1 & 0 \\ 0 & 0 & 1 \\ 1 & 0 & 0 \end{bmatrix}. \quad \text{[Eqn. 4b]}$$

-continued $$I^{(2)} = \begin{bmatrix} 0 & 0 & 1 \\ 1 & 0 & 0 \\ 0 & 1 & 0 \end{bmatrix}. \quad \text{[Eqn. 4c]}$$

Consequently, the derived LDPC code's H matrix can be written in term of these circulant permutations as follows: 1) Replace every '0' in the protograph matrix $H_p$ by the Z×Z all-zeroes matrix; 2) Replace every '1' in $H_p$ by one of the Z different $I^{(s)}$; and 3) Replace an element in $H_p$ with value x (>1) by the sum of x different $I^{(s)}$'s under the condition that no element in the resultant matrix is greater than one. For example, the construction of the LDPC H matrix of vectorized protograph 415 can be illustrated by Equation 5:

$$H = \begin{bmatrix} \pi_1 + \pi_2 & \pi_3 & 0 \\ \pi_4 & \pi_5 & \pi_6 \end{bmatrix}. \quad \text{[Eqn. 5]}$$

For example, using circulant blocks when Z=3, H can be represented by Equation 6:

$$H = \begin{bmatrix} I^{(0)} + I^{(1)} & I^{(0)} & 0 \\ I^{(0)} & I^{(1)} & I^{(2)} \end{bmatrix}. \quad \text{[Eqn. 6]}$$

Substituting s for $I^{(s)}$ and using −1 to indicate the Z×Z all zeros matrix, the H-matrix (now referred to as $H_{base}$) is represented in Equation 7:

$$H_{base} = \begin{bmatrix} 0+1 & 0 & -1 \\ 0 & 1 & 2 \end{bmatrix}. \quad \text{[Eqn. 7]}$$

Embodiments of the present disclosure provide a method of constructing an LDPC code family. The method includes constructing a mother code in the proposed family such that the mother code includes the highest rate. The remaining (other) codes in the family are generated by splitting the rows of the mother code. Furthermore, the rows in the mother code are not split randomly; rather, a protograph EXIT analysis is used to split the rows. In contrast, other methods for constructing an LDPC code family include constructing the mother code as the lowest rate code; then, the higher rate codes are derived by puncturing the base H matrix. However, this technique will first introduce codes with different code lengths. Second, codes with a large number of punctured nodes converge slowly, require more hardware cost, and consume more power. In addition, there are also techniques which start with the highest code rate as the mother code and then derive the higher rates code by deleting some rows in the mother code then adding circulant blocks (usually a large number of them is added). However, adding circulant blocks is not recommended for the reasons mentioned above. Additional techniques may start with the highest code rate as the mother code, but these techniques design the rows in the mother code in a way such that one can select two rows and merge them into one row. The cons of this method is that merging the rows can create cycles in the resultant code's graph, which are not desirable for reasons mentioned earlier in the document. In contrast, in some embodiments the rows are split such that no cycles of smaller size will be created in the derived code.

Figure 5A:
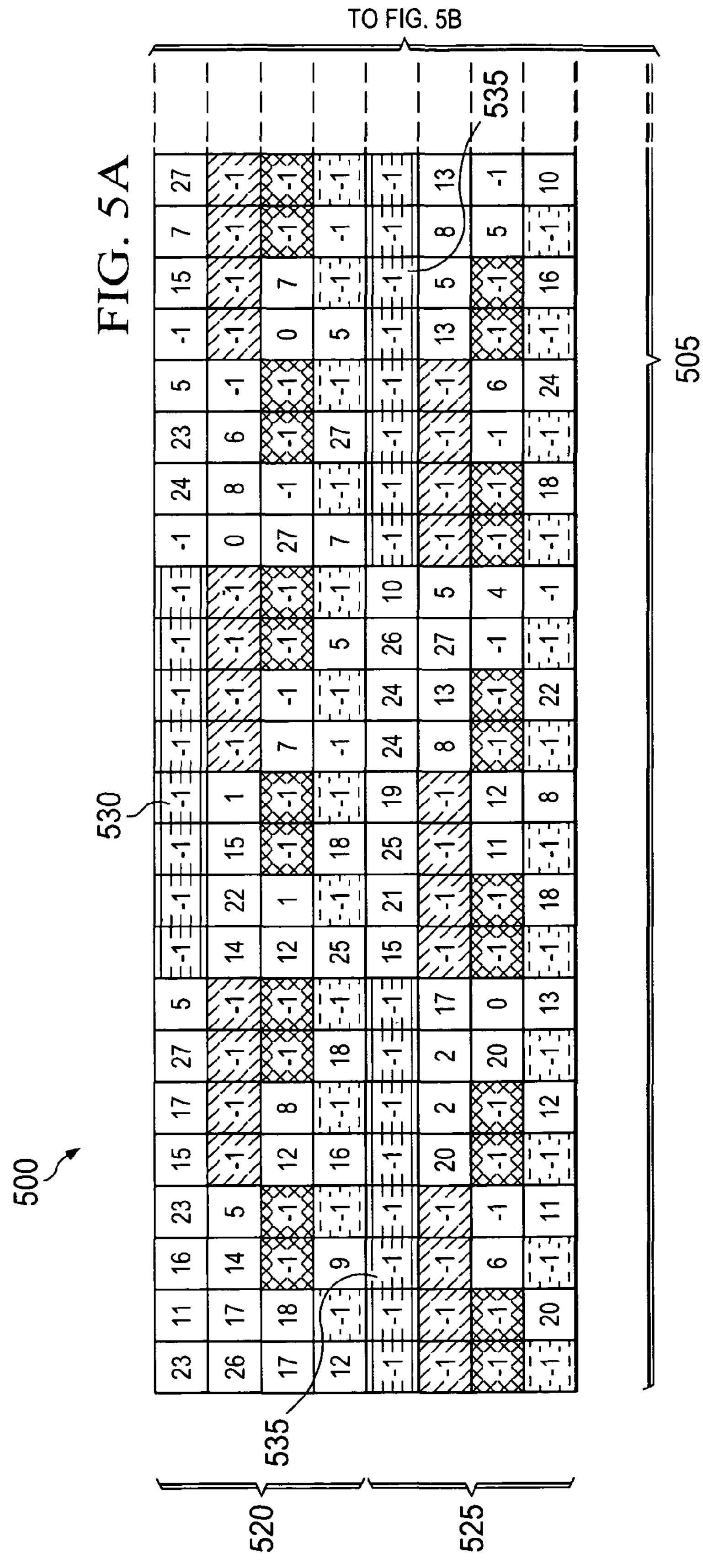

FIGS. 5A and 5B illustrate an example mother code according to embodiments of the present disclosure. The embodiment of the mother code 500 shown in FIGS. 5A and 5B is for illustration only. Other embodiments could be used without departing from the scope of this disclosure.

The mother code 500 can be a ⅚ rate code. The mother code 500 includes a number of information bits 505 and a number of parity bits 510. The mother code 500 includes a maximum $W_r$=20 515 for the rows and a maximum $W_c$=4. The mother code 500 also includes no cycles of size 4.

As shown by the parity bits 510, the mother code 500 includes a lower triangle form. Having parity bits in a lower triangular form implies easy and fast encoding.

The mother code 500 includes 8 rows, as labeled by the row numbers shown in column 517. As such, the mother code 500 also is 4-layer decodable; that is, respective blocks in rows 520 do not overlap with respective blocks in rows 525. For example, blocks 530 do not overlap with blocks 535. As such, row 1 and row 5 can be processed in parallel, same for row 2 and row 6, row 3 and row 7, and row 4 and row 8. This means, as few as 4 layers can be used to decode this code.

In addition, the mother code 500 includes alternating patterns of −1's in powers of twos; that is, in each row, the blocks of −1's alternate in sizes of the power of two. For example, the blocks of −1 can include a number of single blocks, each separated by one block that is not −1; the blocks of −1 can also include two blocks separated by two blocks that are not −1, four blocks separated by four blocks that are not −1; and eight blocks separated by eight blocks that are not −1.

In some embodiments, an LDPC code family with fixed code length n=1344=2×672 is derived from the mother code 500. The LDPC code family can include code rates of: ⅚; ¾; ⅔; and ½. The mother code 500 is constructed using a lifting factor of Z=28, which allows for more flexibility to design the LDPC code family with a good performance and structure. Therefore, codeword size is 1344, which is twice the codeword size (e.g., 672) in other systems which used a lifting factor of 42.

The mother code 500, and derived LDPC code family, enables high bit rate and high power efficiency and is adapted for use in the WiGig system. For example, the mother code 500 and derived LDPC code family can be used with a 60 GHz carrier; a 2 GHz bandwidth and for data transmissions of 4.6 GHz/second.

Figure 6:
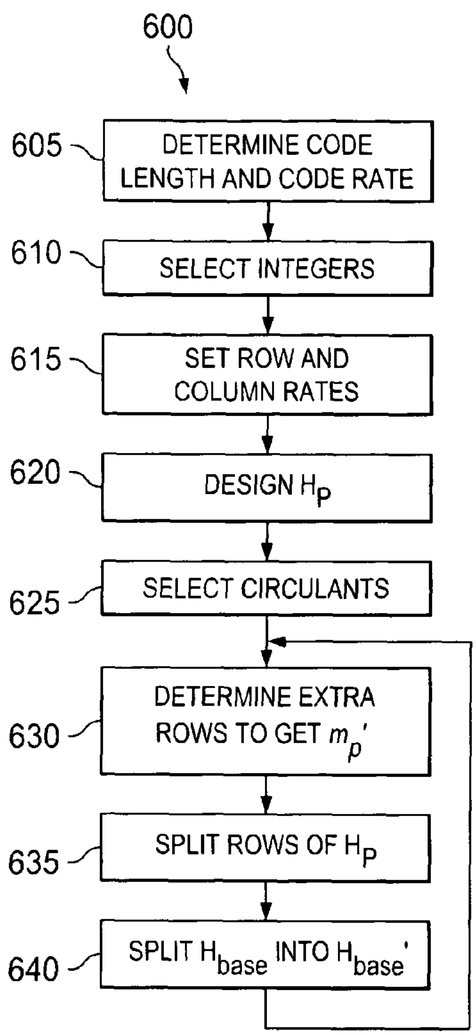
FIG. 6 illustrates a process for constructing a protograph-based LDPC code family according to embodiments of the present disclosure.

FIG. 6 illustrates a process for constructing a protograph-based LDPC code family according to embodiments of the present disclosure. The embodiment of the process shown in FIG. 6 is for illustration only. Other embodiments could be used without departing from the scope of this disclosure.

In block 605, a code length n (fixed) and the highest code rate needed $R_{max}$ are determined. The code length (n) and highest code rate $R_{max}$ may be provided or determined based on system requirements. In contrast to other construction techniques where a low code rate is initially constructed and higher code rates derived, the highest code rate $R_{max}$ is determined to construct the mother code. Constructing the mother code to include the highest code rate $R_{max}$ provides a robust and efficient high code rate code as opposed to derived high code rate codes which have been punctured, causing performance inefficiencies.

In block 610, the integers $n_p$, $m_p$, and Z are selected such that $R_{max}=1-m_p/n_p$, and $n=n_p\times Z$. The mother code $H_{base}$ (and $H_p$) consists of $m_p$ rows and $n_p$ columns, and the circulant block size is Z.

In block 615, the maximum row, $W_r$, and column weights, $W_c$ are set. Also, the maximum element value allowed in $H_p$ is set. In some embodiments, such as simple design, this may be to set this to 1. Then, the protograph-based EXIT analysis is used to design Hp which satisfies these constraints and achieves the lowest threshold possible in block 620.

In block 625, the PEG algorithm, or any other suitable algorithm as the approximate cycle extrinsic degree (ACE) algorithm, is applied to select proper circulant blocks. As such, $H_{base}$ is obtained for the mother code.

A code rate with rate $R_{new}$ ($R_{new}<R_{max}$) is designed from the mother code in blocks 630 through 640. Blocks 630 through 640 can be repeated to derive all the codes in the family.

First, in block 630, a number of extra rows needed is determined. The number of rows in the new protograph matrix, $H_p'$, is $m_p'$ to satisfy Equation 8:

$$R_{new}=1-m_p'/n_p. \quad \text{[Eqn. 8]}$$

Therefore, the number of extra rows needed to construct Hp' is mp'−mp.

Then, in block 635, the extra rows are derived by splitting the rows of Hp. One row from Hp can be split into two or more rows, where the sum of the non-zero elements in any column of the split rows should not exceed the value of the element in the corresponding column in the original row. The protograph EXIT analysis is used to select which rows to split and how to split the rows. The goal is to achieve the lowest threshold possible.

In block 640, the splitting rules obtained in block 635 are used to split $H_{base}$ into $H_{base}'$. Furthermore, $H_{base}'$ defines the new code, which can be also defined by the base matrix of the mother code and the splitting rules.

In some embodiments, the number of cycles of the smallest size in the code obtained in block 640 can be counted. Then, an iteration can be performed between block 635 and block 640 to select the splitting rules which give the best threshold and minimize the number of the smallest cycles in the derived code. Then, the rows of $H_p$ can be split into more than $m_p'$ row in a way that some of the resultant rows (from a different original row) can be merged together to produce $H_p'$. The later technique may derive codes with better threshold. However, merging rows can generate small cycles; therefore, the iteration between block 635 and block 640 selects the splitting and merging rules, which introduces no smaller cycles than those in the mother code.

FIGS. 7A through 9B illustrate splitting rules according to embodiments of the present disclosure. The embodiments of the splitting rules shown in FIGS. 7A through 9B are for illustration only. Other embodiments could be used without departing from the scope of this disclosure.

Using the construction process 600, described above with reference to FIG. 6, with the added constraint that the resultant code has a lower triangular form, the following splitting rules were obtained to generate the other codes in the LDPC family. FIGS. 7A and 7B illustrate a ½ splitting rule 700; FIGS. 8A and 8B illustrate a ⅔ splitting rule 800; and FIGS. 9A and 9B illustrate a ¾ splitting rule 900.

In the examples shown in FIGS. 7A through 9B, there are eight splitting rules for each derived code. That is, one splitting rule exists for each row in the mother code. For example, rule 1 splits row 1, rule 2 splits row 2, and so forth. The rate-¾ 900 and rate-⅔ 800 splitting rules split each row in the mother code into two rows, one row takes (or is otherwise based on) the circulant blocks (from the original row) labeled by '0' in the splitting rule, the other row takes (or is otherwise based on) the circulant block labeled by '1' in the splitting rule. The rate-½ 700 splitting rules split each row in the mother code into three rows.

FIGS. 10A through 12B illustrate rate codes according to embodiments of the present disclosure. The embodiments of the rate codes shown in FIGS. 10A through 12B are for illustration only. Other embodiments could be used without departing from the scope of this disclosure.

Using the construction process 600, described above with reference to FIG. 6 and applying the respective splitting rules 700, 800 and 900 to the mother code 500 produces the LDPC family, which includes code rate ½ 1000, code rate ⅔ 1100 and code rate ¾ 1200. FIGS. 10A through 10D illustrate a code rate ½ 1000; FIGS. 11A and 11B illustrate a code rate ⅔ 1100; and FIGS. 12A and 12B illustrate a code rate ¾ 1200.

The rate ½ 1000 derived code is generated by splitting each row into three rows using the ½ splitting rule 700. The label in column 1005 illustrates the rule and circulant used to derive the respective row. For example, the label 4-2 means that row 1010 is derived by splitting row 4 in the mother code 500 using splitting rule 4 by selecting the circulant blocks labeled 2 in the splitting rule 700. In addition, row 1015 is derived by splitting row 8 in the mother code 500 using splitting rule 8 by selecting the circulant blocks labeled 2 in the splitting rule 700; row 1020 is derived by splitting row 4 in the mother code 500 using splitting rule 4 by selecting the circulant blocks labeled 1 in the splitting rule 700; row 1025 is derived by splitting row 1 in the mother code 500 using splitting rule 1 by selecting the circulant blocks labeled 0 in the splitting rule; and so forth.

For example, splitting rule 4 705 for the ½ splitting rule 700 is "2 0 2 1 1 2 2 0 1 1 1 0 1 2 1 2 2 0 1 2 1 1 1 2 2 1 1 1 1 0 0 0 0 0 0 0 0 0 0 0 0 0 0 0 0 0 0 0 0 0." Therefore, based on splitting rule 4 705 (e.g., the fourth row) of the ½ splitting rule 700, blocks 3, 6, 7, 14, 16, 17, 20, 24 and 25 in row 4 of the mother code 500 are selected and inserted into the respective blocks of the rate ½ 1000 while the remaining blocks are filled with −1. Row 4 of the mother code 500 is "12 −1 9 −1 16 −1 18 −1 25 −1 18 −1 −1 −1 5 −1 7 −1 27 −1 5 −1 −1 −1 14 −1 −1 −1 2 −1 −1 −1 3 −1 2 −1 23 −1 12 −1 −1 −1 20 9 −1 −1 −1 −1." As such, the first row 1010 in the rate ½ 1000 is "12 −1 9 −1 −1 −1 18 −1 −1 −1 −1 −1 −1 −1 −1 −1 7 −1 −1 −1 −1 −1 −1 −1 14 −1 −1 −1 −1 −1 −1 −1 −1 −1 −1 −1 −1 −1 −1 −1 −1 −1 −1 −1 −1 −1 −1 −1 −1 −1."

The rate ⅔ 1100 derived code is generated by splitting each row into two rows using the ⅔ splitting rule 800. The label in column 1105 illustrates the rule and circulant used to derive the respective row.

The rate ¾ 1200 derived code is generated by splitting each row into two rows using the ¾ splitting rule 900. The label in column 1205 illustrates the rule and circulant used to derive the respective row. The label 4-1+5-1 means that the row 1210 is derived by merging the row derived from row 4 by circulant blocks labeled 1 in splitting rule 4 with that derived from row 5 by circulant blocks labeled 1 in splitting rule 5.

For example, splitting rule 4 905 for the ¾ splitting rule 900 is "1 0 0 1 0 1 1 0 0 0 1 0 0 1 0 0 0 1 1 0 1 1 0 1 1 0 1 1 0 1 0 1 0 1 0 1 1 0 0 0 0 0 0 0 0 0 0 0 0." Splitting rule 5 910 for the ¾ splitting rule 900 is "0 1 1 0 1 0 0 0 1 0 0 0 0 0 1 0 0 0 0 0 0 1 0 0 1 0 0 1 0 1 0 1 0 0 0 0 0 0 0 0 0 0 0 0 0 0 0 0." Therefore, based on splitting rule 4 905 (e.g., the fourth row) of the ¾ splitting rule 900, blocks 1, 4, 6, 7, 11, 14, 18, 19, 21, 22, 24, 25, 27, 28, 30, 32, 34, 36 and 37 in row 4 of the mother code 500 are selected and inserted into the respective blocks of the rate ¾ 1200. In addition, based on splitting rule 5 910 (e.g., the fifth row) of the ¾ splitting rule 900, blocks 2, 3, 5, 9, 16, 23, 26, 29, 31 and 33 in row 5 of the mother code 500 are selected and inserted into the respective blocks of the rate ¾ 1200. Row 4 of the mother code 500 is "12 −1 9 −1 16 −1 18 −1 25 −1 18 −1 −1 −1 5 −1 7 −1 27 −1 5 −1 −1 −1 14 −1 −1 −1 2 −1 −1 −1 3 −1 2 −1 23 −1 12 −1 −1 −1 20 9 −1 −1 −1 −1." Row 5 of the mother code 500 is "−1 −1 −1 −1 −1 −1 −1 −1 15 21 25 19 24 24 26 10 −1 −1 −1 −1 −1 −1 −1 −1 3 20 7 6 22 1 26 9 −1 −1 −1 −1 −1 −1 −1 −1 −1 −1 −1 11 14 −1 −1 −1." As such, the first row 1210 in the rate ¾ 1200 is "12 −1 −1 −1 −1 −1 18 −1 15 −1 18 −1 −1 −1 −1 10 −1 −1 27 −1 5 −1 −1 −1 14 20 −1 −1 22 −1 26 −1 −1 −1 −1 −1 23 −1 −1 −1 −1 −1 −1 −1 −1 −1 −1 −1 −1."

In some embodiments, a 4-layers decodable LDPC code is derived after splitting then merging the rows of the mother code 500 (as shown with respect to the code rate ¾ 1200 shown in FIGS. 12A and 12B). In addition, an LDPC code family with 2X code length also is designed, where X refers to the length of an LDPC code family designed using our proposed method above.

FIGS. 13A and 13B illustrate 4-layer decodable ¾ splitting rule according to embodiments of the present disclosure. The embodiment of the splitting rule shown in FIGS. 13A and 13B is for illustration only. Other embodiments could be used without departing from the scope of this disclosure.

The rate-¾ LDPC code 1200 may not be 4-layers decodable because the merging of rows may not necessarily produce independent rows. In the rate-¾LDPC code 1200 base matrix 1200, recall that rows 1-0 and 5-0 can be decoded in parallel without affecting the performance. Similarly, rows 2-0 and 6-0, 3-0 and 7-0, and 4-0 and 8-0 can be decoded in parallel without affecting the performance. The previous pairs define 4 layers; however row 1-1+2-1 cannot be decoded in any of these 4 layers without affecting the performance (see, the Log-Likehood Ration (LLR) messages calculated using this row depend on those calculated by rows 1-0, 2-0, 3-0, and 4-0). Consequently, more than 4 layers are needed in the decoding.

In some embodiments, to design a 4-layer decodable codes using the splitting and merging technique described herein above with respect to FIGS. 12A and 12B, only rows originated from independent rows are merged. For example, in the rate-⅚ mother code 500, row 1 and row 5 can be decoded in parallel; as such rows 1 and 5 are referred to as independent rows. To derive a rate-¾ code from the rate-⅚ mother code 500 by splitting then merging, row 1 is split into 1-0 and 1-1; row 5 is split into 5-0 and 5-1; then rows 1-1 and 5-1 are merged to form the row 1-1+5-1. This provides that 1-1+5-1 is independent from 1-0 and 5-0 since 1-1 is independent from 1-0 and 5-0, and 5-1 is independent from 1-0 and 5-0. Following the same rule, a 4-layer decodable rate-¾ code 1400 is obtained.

FIGS. 14A and 14B illustrate a 4-layer decodable rate-¾ code according to embodiments of the present disclosure. The embodiment of the 4-layer decodable rate-¾ code shown in FIGS. 14A and 14B is for illustration only. Other embodiments could be used without departing from the scope of this disclosure.

The 4-layer decodable rate-¾ code 1400 derived code is generated by splitting each row into two rows using the 4-layer decodable ¾ splitting rule 1300. The label in column 1405 illustrates the rule and circulant used to derive the respective row. The label 1-1+5-1 means that the row 1410 is derived by merging the row derived from row 1 by circulant blocks labeled 1 in splitting rule 1 with that derived from row 5 by circulant blocks labeled 1 in splitting rule 5.

The 4-layer decodable rate-¾ code 1400 is 4-layers decodable. In layer 1, row "1-0" 1412, row "5-0" 1414, and row "1-1+5-1" 1410 can be decoded in parallel. In layer 2, row "2-0" 1420, row "6-0" 1422, and row "2-1+6-1" 1424 can be decoded in parallel. In layer 3, row "3-0" 1430, row "7-0" 1432, and row "3-1+7-1" 1434 can be decoded in parallel.

Lastly in layer 4, row "4-0" 1440, row "8-0" 1442, and row "4-1+8-1" 1444 can be decoded in parallel.

FIGS. 15A through 15D illustrate an example 2X mother code according to embodiments of the present disclosure. The embodiment of the 2X mother code 1500 shown in FIGS. 15A and 15B is for illustration only. FIG. 15A illustrates a first quarter 1500*a* of the 2X mother code 1500; FIG. 15A illustrates a second quarter 1500*b* of the 2X mother code 1500; FIG. 15B illustrates a third quarter 1500*c* of the 2X mother code 1500; and FIG. 15B illustrates a fourth quarter 1500*d* of the 2X mother code 1500. Other embodiments could be used without departing from the scope of this disclosure.

In some embodiments, a LDPC code family with fixed code length n=2688=4×672 is derived from the mother code 500. The LDPC code family can include code rates of: ⅚; ¾; ⅔; and ½. The 2X mother code 1500 is constructed also based on a lifting factor of Z=28, which allows for more flexibility to design the LDPC code family with a good performance and structure. However, prior to lifting by the lifting factor of Z=28, the protograph for the mother code 500 is lifted by a lifting factor of Z=2. Therefore, codeword size is 2688, which is four times the codeword size (e.g., 672) in other systems which used a lifting factor of 42.

The mother code 500 can be a ⅚ rate code. The 2X mother code 1500 includes a number of information bits 1505 and a number of parity bits 1510. The 2X mother code 1500 includes a maximum $W_r$=20 1515 for the rows and a maximum $W_c$=4.

As shown by the parity bits 1510, the 2X mother code 1500 includes a lower triangle form. Having parity bits in a lower triangular form implies easy and fast encoding.

The 2X mother code 1500 is constructed based on a code length of 2n, starting with the LDPC code family with code length n in the mother code 500. Therefore, the 2X mother code 1500 includes 16 rows, as labeled by the row numbers shown in column 1520 and 1520.

The 2X mother code 1500, and derived LDPC code family, enables high bit rate and high power efficiency and is adapted for use in the WiGig system. For example, the mother code 500 and derived LDPC code family can be used with a 60 GHz carrier; a 2 GHz bandwidth and for data transmissions of 4.6 GHz/second.

Figure 16:
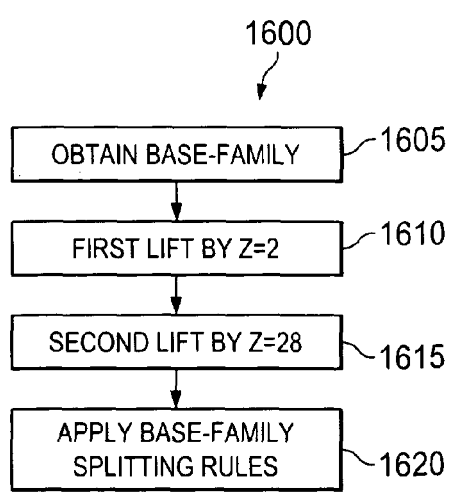
FIG. 16 illustrates a process for constructing a protograph-based 2X LDPC code family according to embodiments of the present disclosure.

FIG. 16 illustrates a process for constructing a protograph-based 2X LDPC code family according to embodiments of the present disclosure. The embodiment of the process 1600 shown in FIG. 16 is for illustration only. Other embodiments could be used without departing from the scope of this disclosure.

In block 1605, the protograph for a mother code of a given LDPC family with code length n, referred to as the base family, is obtained. For example, the protograph for the mother code 500 is obtained as well as the splitting rules used to obtain the derived codes.

In block 1610, the obtained protograph is lifted by a lifting factor of 2. The mother code 500 protograph is lifted with lifting factor equal 2 to obtain a $2m_p \times 2n_p$ protograph. Here, the circulant blocks can be chosen randomly, or the lifting that minimizes the number of the smallest cycles may be chosen.

In block 1615, the protograph obtained by lifting by a lifting factor of 2 is further lifted by lifting factor Z as described in block 625 in the constructing process 600 illustrated on FIG. 6.

The base-family splitting rules are applied in block 1620. The base-family splitting rules (as discussed with respect to FIGS. 7A through 9B and 13A and 13B) are applied on the 2×2 circulant blocks, defined in block 1610, to obtain the derived codes. Optionally, one or more new splitting rules can be constructed as described with respect to blocks 630-640 in FIG. 6.

Deriving a code family using the process 1600 preserves the properties of the base-family. That is, the new 2X LDPC code family inherits its structure, threshold, Wr, Wc, and 4-layers decodable properties from the base-family.

In some embodiments, when row merging is used in the construction of the derived code, the resultant code may have cycles smaller than those in the mother code. Consequently, a new splitting rule is designed for this particular case rather than using the base-family splitting rules, such as the splitting rule 1300 illustrated in FIGS. 13A and B.

FIGS. 17A-1 through 19H illustrate 2X rate codes according to embodiments of the present disclosure. The embodiments of the 2X rate codes shown in FIGS. 17A-1 through 19H are for illustration only. Other embodiments could be used without departing from the scope of this disclosure.

Using the construction process 1600, described above with reference to FIG. 16 and applying the respective splitting rules 700, 800 and 1300 to the mother code 1500 produces the 2X LDPC family, which includes code rate ½ 1700, code rate ⅔ 1800 and code rate ¾ 1900. FIGS. 17A-1 through 17B-6 illustrate a code rate ½ 1700 (as a first half 1700*a* and a second half 1700*b*); FIGS. 18A through 18H illustrate a code rate ⅔ 1800; and FIGS. 19A through 19H illustrate a code rate ¾ 1900. Further, the code rate ¾ 1900 is derived using the 4-layer decodable ¾ splitting rule 1300; therefore, the code rate ¾ 1900 also is 4-layers decodable.

The LDPC decoder can be an LDPC CRISP 300, or any suitable LDPC decoder, that is configured as a universal decoder for use with multiple transmission standards including, but not limited to, WiGig, WiMax, DVB-S2 and 4G. The LDPC decoder is configured to use the LDPC family rate codes derived from the mother code 500 including, but not limited to, code rate ½ 1000, code rate ⅔ 1100, code rate ¾ 1200, and code rate ⅚ 500.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. For use in a wireless communication network, a method for constructing a low density parity check (LDPC) family of codes, the method comprising:

constructing a mother code having a highest code rate in the LDPC family of codes, wherein the mother code is constructed by:

selecting m number of rows and n number of columns;

setting maximum column weights and row weights;

designing a protograph matrix based on the set column weights and row weights and selected m and n;

selecting circulant blocks based on the protograph matrix; and deriving a second code from the mother code by splitting each row of the mother code into two or more split rows and merging certain values from two or more split rows to form at least one row in the second code using splitting and merging rules that introduce no smaller cycles than those in the mother code.

2. The method as set forth in claim 1, wherein the mother code comprises a derived code rate comprising a rate-⅚ code.

3. The method as set forth in claim 1, wherein the second code comprises a second code rate that is lower than the highest code rate.

4. The method as set forth in claim 3, wherein the second code comprises a derived code rate comprising at least one of: a rate-⅔ code; a rate-½ code; and a rate-¾ code.

5. The method as set forth in claim 3, wherein the deriving comprises at least one of:

splitting each row of the mother code into three rows using a first splitting rule; and splitting each row of the mother code into two rows using a second splitting rule.

6. The method as set forth in claim 1, further comprising constructing at least one set of the splitting rules, wherein the constructing comprises:

determining a number of extra rows needed to construct a second protograph; and deriving the extra rows from the protograph matrix.

7. The method as set forth in claim 1, wherein selecting the circulant blocks comprises:

lifting the second protograph matrix by a lifting factor of 28.

8. The method as set forth in claim 1, wherein selecting the circulant blocks comprises:

lifting the protograph matrix by a lifting factor of 2 to obtain a second protograph matrix; and lifting the second protograph matrix by a lifting factor of 28.

9. For use in a wireless communications network, a low density parity check (LDPC) code implemented in a non-transitory, computer-readable medium, the LDPC code comprising:

a codeword size of at least 1344;

a plurality of information bits; and a plurality of parity bits, wherein the plurality of parity bits comprises a lower triangular form, and wherein the LDPC code is based on a mother code, wherein the mother code is constructed by:

selecting m number of rows and n number of columns;

setting maximum column weights and row weights;

designing a protograph matrix based on the set column weights and row weights and selected m and n;

selecting circulant blocks based on the protograph matrix; and deriving a second code from the mother code by splitting each row of the mother code into two or more split rows and merging certain values from two or more split rows to form at least one row in the second code using splitting and merging rules that introduce no smaller cycles than those in the mother code.

10. The LDPC code as set forth in claim 9, wherein the mother code comprises a derived code rate comprising a rate-⅚ code.

11. The LDPC code as set forth in claim 9, wherein the mother code comprises a highest code rate and the second code comprises a second code rate that is lower than the highest code rate.

12. The LDPC code as set forth in claim 11, wherein the second code comprises a derived code rate comprising at least one of: a rate-⅔ code; a rate-½ code; and a rate-¾ code.

13. The LDPC code as set forth in claim 11, wherein the second code is derived by at least one of:

splitting each row of the mother code into three rows using a first splitting rule; and splitting each row of the mother code into two rows using a second splitting rule.

14. The LDPC code as set forth in claim 9, wherein the LDPC code is derived from a 2X mother code, the 2X mother code constructed by:

lifting the protograph matrix by a lifting factor of 2 to obtain a second protograph matrix; and lifting the second protograph matrix by a lifting factor of 28.

15. The LDPC code as set forth in claim 14, wherein the LDPC code comprises a codeword size of 2688.

16. For use in a wireless communications network, a method for performing error correction comprising using a low density parity check (LDPC) code from a LDPC family of codes in a non-transitory, computer-readable medium, the LDPC code comprising:

a codeword size of at least 1344;

a plurality of information bits; and a plurality of parity bits, wherein the plurality of parity bits comprises a lower triangular form, and wherein the LDPC code is based on a mother code, wherein the mother code is constructed by:

selecting m number of rows and n number of columns;

setting maximum column weights and row weights;

designing a protograph matrix based on the set column weights and row weights and selected m and n;

selecting circulant blocks based on the protograph matrix; and deriving a second code from the mother code by splitting each row of the mother code into two or more split rows and merging certain values from two or more split rows to form at least one row in the second code using splitting and merging rules that introduce no smaller cycles than those in the mother code.

17. The method as set forth in claim 16, wherein the LDPC code is one of:

the mother code; and the derived second code, wherein the mother code comprises a rate-⅚ code and wherein the derived second code comprises a derived code rate comprising at least one of: a rate-⅔ code; a rate-½ code; and a rate-¾ code.

18. The method as set forth in claim 17, wherein the derived second code is constructed by at least one of:

splitting each row of the mother code into three rows using a first splitting rule; and splitting each row of the mother code into two rows using a second splitting rule.

19. The method as set forth in claim 16, wherein selecting the circulant blocks comprises:

lifting the second protograph matrix by a lifting factor of 28.

20. The method as set forth in claim 16, wherein selecting the circulant blocks comprises:

lifting the protograph matrix by a lifting factor of 2 to obtain a second protograph matrix; and lifting the second protograph matrix by a lifting factor of 28.

21. The method as set forth in claim 16, wherein the LDPC code comprises a codeword size of 2688.

* * * * *